US012813356B2

(12) United States Patent
Sakai et al.

(10) Patent No.: US 12,813,356 B2
(45) Date of Patent: Nov. 24, 2026

(54) SEMICONDUCTOR DEVICE

(71) Applicant: ROHM CO., LTD., Kyoto (JP)

(72) Inventors: Hiroto Sakai, Kyoto (JP); Yuta Okawauchi, Kyoto (JP); Tetsuo Tateishi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 335 days.

(21) Appl. No.: 18/742,606

(22) Filed: Jun. 13, 2024

(65) Prior Publication Data

US 2024/0332271 A1 Oct. 3, 2024

Related U.S. Application Data

(63) Continuation of application No. PCT/JP2023/002059, filed on Jan. 24, 2023.

(30) Foreign Application Priority Data

Feb. 7, 2022 (JP) ................................ 2022-016910
Jul. 26, 2022 (JP) ................................ 2022-119062

(51) Int. Cl.
*H10W 40/22* (2026.01)
*H10W 40/25* (2026.01)
(Continued)

(52) U.S. Cl.
CPC ........... *H10W 90/00* (2026.01); *H10W 40/22* (2026.01); *H10W 40/255* (2026.01);
(Continued)

(58) Field of Classification Search
None
See application file for complete search history.

(56) References Cited

U.S. PATENT DOCUMENTS 3,713,006 A * 1/1973 Litty et al. .............. H03F 3/211 257/E23.009
4,885,629 A * 12/1989 Takagi .................. H10W 90/00 257/690

(Continued)

FOREIGN PATENT DOCUMENTS

JP 2016-225493 12/2016

OTHER PUBLICATIONS

International Search Report issued in International Application No. PCT/JP2023/002059, Apr. 11, 2023, 2 pages.

(Continued)

*Primary Examiner* — Cory W Eskridge
(74) *Attorney, Agent, or Firm* — HSML P.C.

(57) ABSTRACT

A semiconductor device includes two semiconductor elements with a respective switching operation being controlled depending on a first driving signal input to a third electrode. A first conductor and a second conductor are electrically interposed between the third electrodes of the two semiconductor elements. The first conductor is electrically connected to a signal terminal. The electrical connection between the third electrodes of the two semiconductor elements includes a first conduction path through the first conductor and a second conduction path through the second conductor. An inductance value of the second conduction path is smaller than an inductance value of the first conduction path. A resistance value of the second conduction path is larger than a resistance value of the first conduction path.

20 Claims, 38 Drawing Sheets

(51) Int. Cl.
*H10W 74/10* (2026.01)
*H10W 76/136* (2026.01)
*H10W 90/00* (2026.01)

(52) U.S. Cl.
CPC ........ *H10W 74/114* (2026.01); *H10W 76/136* (2026.01); *H10W 90/754* (2026.01)

(56) References Cited

U.S. PATENT DOCUMENTS

| | | | | |
|---|---|---|---|---|
| 5,306,949 | A * | 4/1994 | Yamada ................ | H10W 44/00<br>257/784 |
| 2004/0113268 | A1* | 6/2004 | Shirakawa ............ | H02M 7/003<br>257/E23.173 |
| 2019/0237448 | A1* | 8/2019 | Nakashima ........... | H02M 7/003 |
| 2020/0373852 | A1* | 11/2020 | Xu ........................ | H02M 1/088 |

OTHER PUBLICATIONS

Written Opinion issued in International Application No. PCT/JP2023/002059, Apr. 11, 2023, 2 pages.

* cited by examiner

SEMICONDUCTOR DEVICE

TECHNICAL FIELD

The present disclosure relates to a semiconductor device.

BACKGROUND ART

Conventionally, a semiconductor device comprising a power semiconductor element such as a MOSFET (Metal Oxide Semiconductor Field Effect Transistor) or an IGBT (Insulated Gate Bipolar Transistor) has been known. In such a semiconductor device, it has been known that the power semiconductor elements are configured to be connected in parallel to ensure the allowable electric power of the semiconductor device (e.g., JP-A-2016-225493). The configuration disclosed in JP-A-2016-225493 (a power module) includes first semiconductor elements, first connection wirings, a wiring layer, and a signal terminal. The first semiconductor elements are, for example, MOSFETs. Each first semiconductor element is turned on/off depending on a drive signal input to a gate terminal. The first semiconductor elements are connected in parallel. Each first connection wiring, such as a wire, is connected to the gate terminal of each first semiconductor element and the wiring layer. The wiring layer is connected to the signal terminal. The signal terminal is connected to the gate terminal of each first semiconductor element via the wiring layer and first connection wirings. The signal terminal provides a drive signal to the gate terminal of each first semiconductor element for driving each first semiconductor element.

DETAILED DESCRIPTION OF EMBODIMENTS

Figure 1:
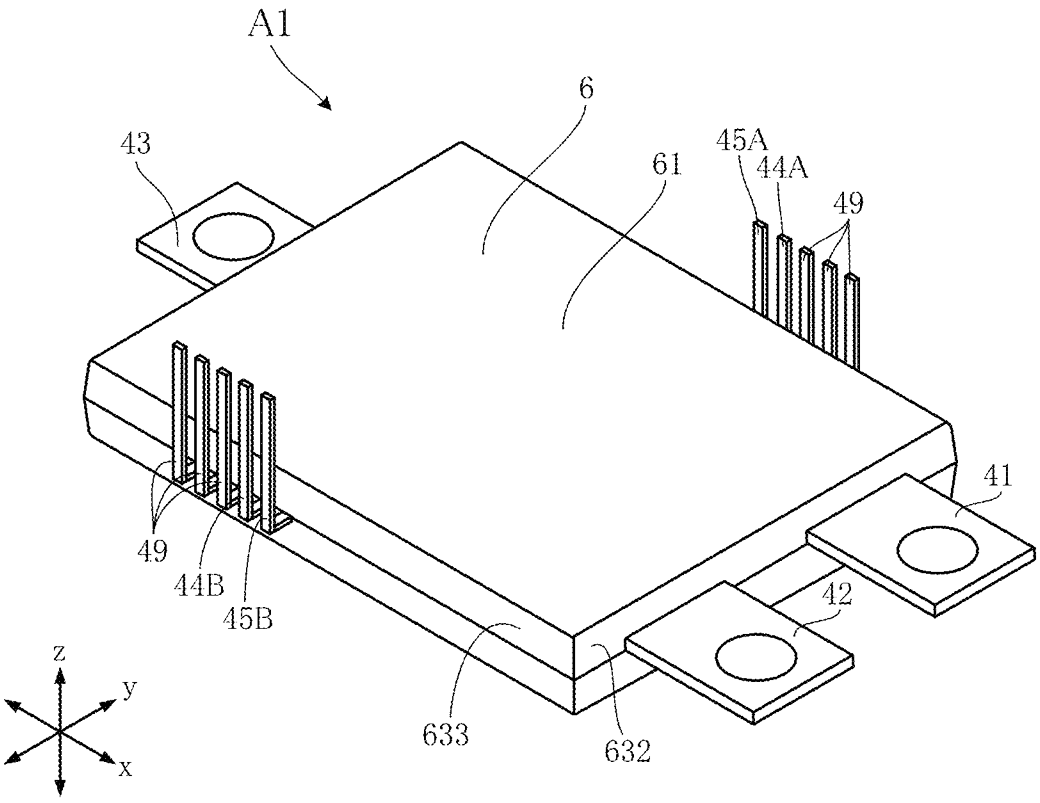
FIG. 1 is a perspective view of a semiconductor device according to a first embodiment.

The following describes preferred embodiments of semiconductor devices of the present disclosure in detail with reference to the drawings. In the following, the same reference numerals are given to the same or similar components, and redundant descriptions thereof are omitted. The configurations of various parts in the embodiments and variations to be described later can be combined in any way as long as the variation is technically compatible. In the present disclosure, the terms "first," "second," "third," etc. are used merely for the purpose of identification, and are not necessarily intended to order their objects.

In the description of the present disclosure, the expression "An object A is formed in an object B", and "An object A is formed on an object B" imply the situation where, unless otherwise specifically noted, "the object A is formed directly in or on the object B", and "the object A is formed in or on the object B, with something else interposed between the object A and the object B". Likewise, the expression "An object A is arranged in an object B", and "An object A is arranged on an object B" imply the situation where, unless otherwise specifically noted, "the object A is arranged directly in or on the object B", and "the object A is arranged in or on the object B, with something else interposed between the object A and the object B". Further, the expression "An object A is located on an object B" implies the situation where, unless otherwise specifically noted, "the object A is located on the object B, in contact with the object B", and "the object A is located on the object B, with something else interposed between the object A and the object B". Still further, the expression "An object A overlaps with an object B as viewed in a certain direction" implies the situation where, unless otherwise specifically noted, "the object A overlaps with the entirety of the object B", and "the object A overlaps with a part of the object B". Also, the phrase "an object A overlaps with an object B as viewed in a certain direction" includes, unless otherwise specified, an object A overlaps with the entirety of an object B" and "an object A overlaps with a portion of an object B". Also, the phrase "an object A (or the material thereof) contains a material C" includes "an object A (or the material thereof) is made of a material C" and "an object A (or the material thereof) is mainly composed of a material C".

FIGS. 1 to 6 show a semiconductor device A1 according to a first embodiment. The semiconductor device A1 includes a plurality of first semiconductor elements 11, a plurality of second semiconductor elements 12, a supporting substrate 2, a plurality of terminals, a plurality of connection members, two resistor elements R1, R2, and a sealing member 6. The plurality of terminals include a plurality of power terminals 41 to 43 and a plurality of signal terminals 44A, 44B, 45A, 45B, 49. The plurality of connection members include a plurality of connection members 51A, 51B, 52A, 52B, 53A, 53B, 54A, 54B.

For convenience of explanation, the thickness direction of the semiconductor device A1 is referred to as a "thickness direction z". In the description below, one side or sense in the thickness direction z may be referred to as "upward" or "upper", and the other side or sense as "downward" or "lower". Note that the terms such as "top", "bottom", "upward", "downward", "upper surface", and "lower surface" are used to indicate the relative position between parts, etc., in the thickness direction z and do not necessarily define the relationship with respect to the direction of gravity. A "plan view" refers to the view seen in the thickness direction z. A direction orthogonal to the thickness direction z is referred to as "first direction x". The first direction x is, for example, a horizontal direction of the plan view of the semiconductor device A1 (see FIG. 2). The direction orthogonal to the thickness direction z and the first direction x is referred to as "second direction y". The second direction y is, for example, a vertical direction of the plan view of the semiconductor device A1 (see FIG. 2).

Each of the first semiconductor elements 11 and each of the second semiconductor elements 12 are MOSFETs, for example. Each first semiconductor element 11 and second semiconductor element 12 may instead be provided by other kinds of switching elements, for example, a field effect transistor such as MISFET (Metal-Insulator-Semiconductor FET) or a bipolar transistor such as an IGBT. Each first semiconductor element 11 and second semiconductor element 12 is made of SiC (silicon carbide). The semiconductor material is not limited to SiC, but may be Si (silicon), GaAs (gallium arsenide), GaN (gallium nitride), or $Ga_2O_3$ (gallium oxide) etc.

Figure 2:
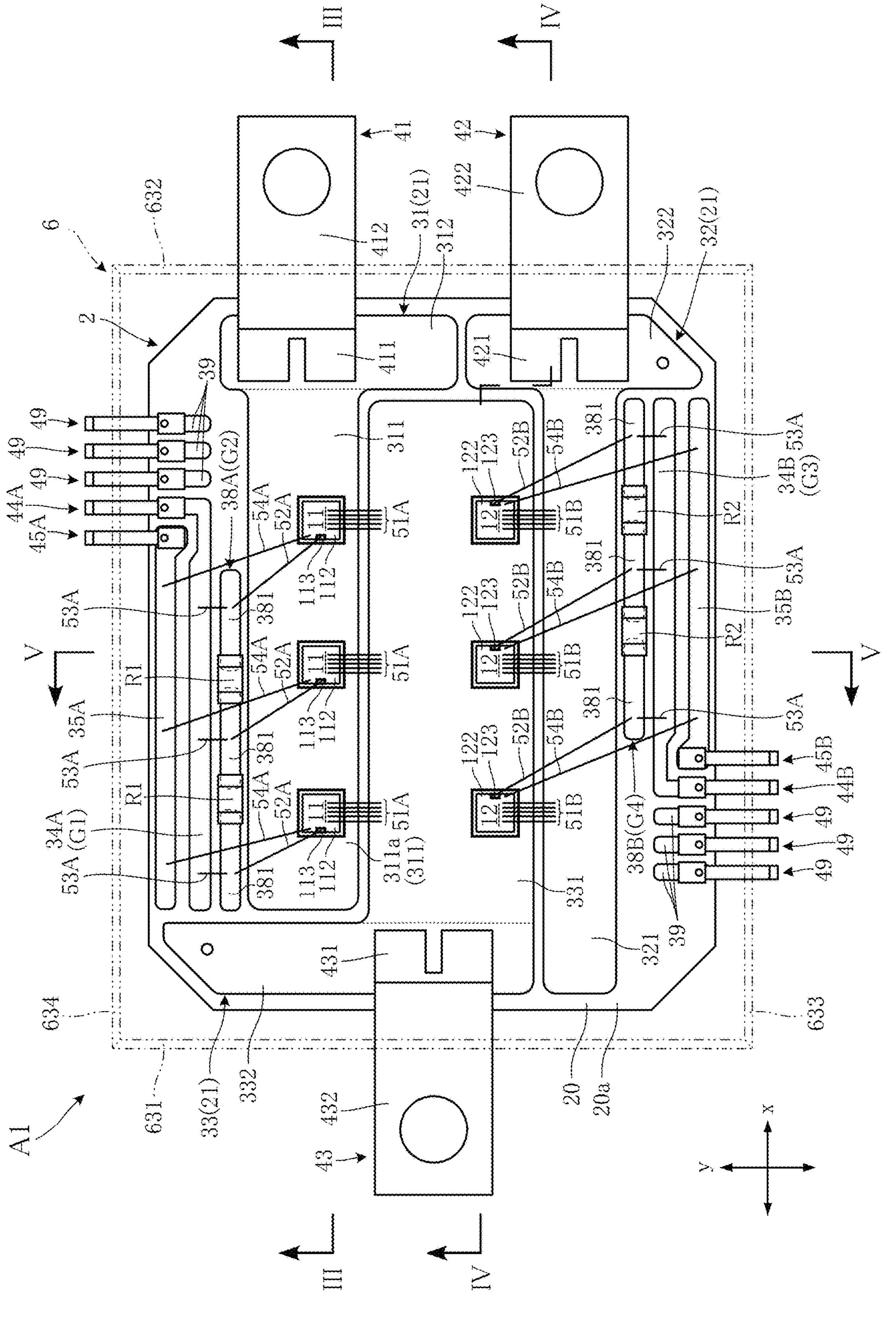
FIG. 2 is a plan view of a semiconductor device according to a first embodiment in which a sealing member is indicated by imaginary lines.
Figure 3:
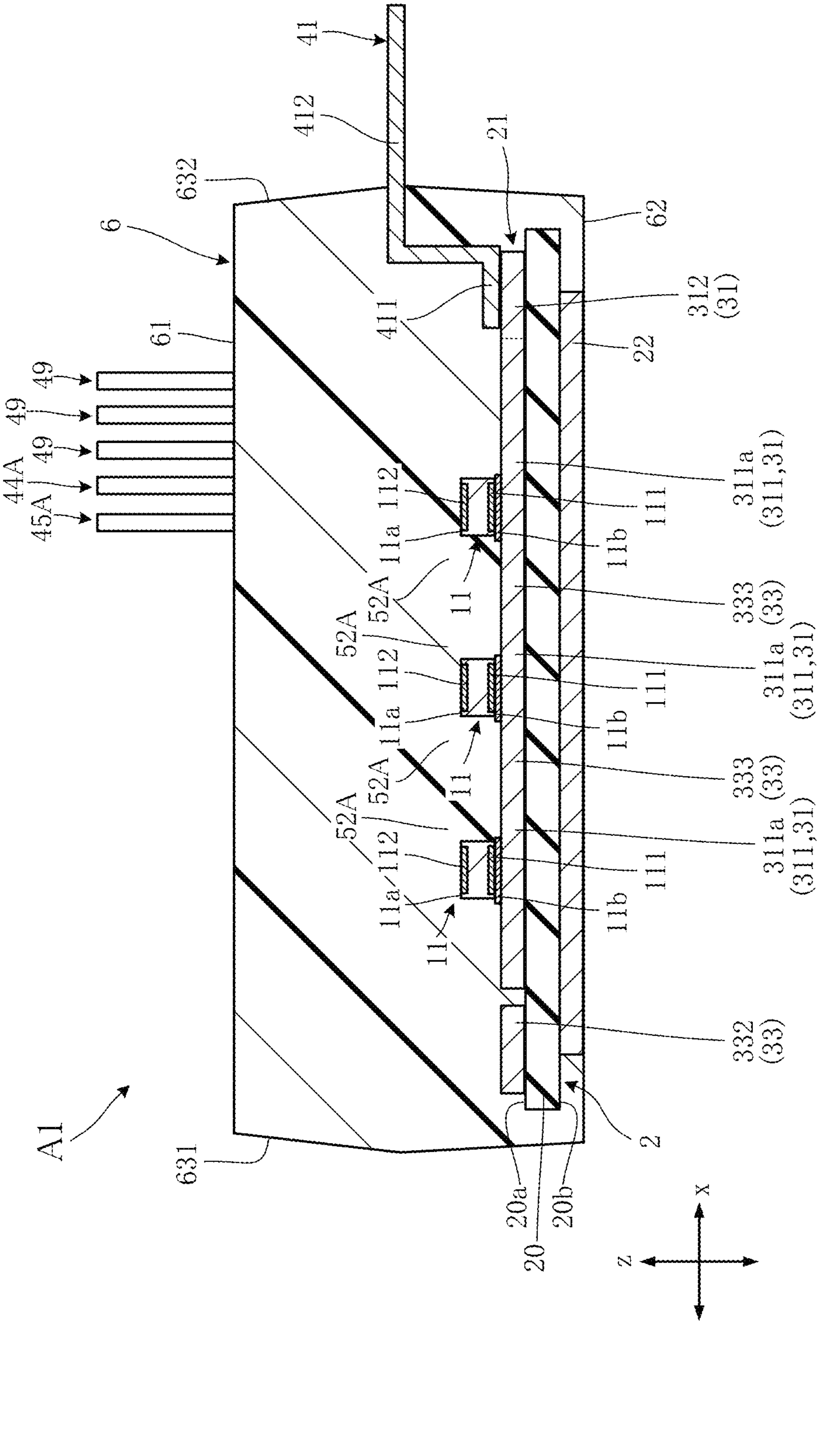
FIG. 3 is a cross-sectional view of FIG. 2 taken along a line III-III.

Each of the plurality of first semiconductor elements 11 is bonded to the supporting substrate 2 (a power wiring part 31 to be described later) via a conductive bonding material. The conductive bonding material includes solder, metal paste material, or sintering metal. The plurality of first semiconductor elements 11 are, as shown in FIGS. 2 and 3, equally spaced apart in the first direction x.

Figure 5:
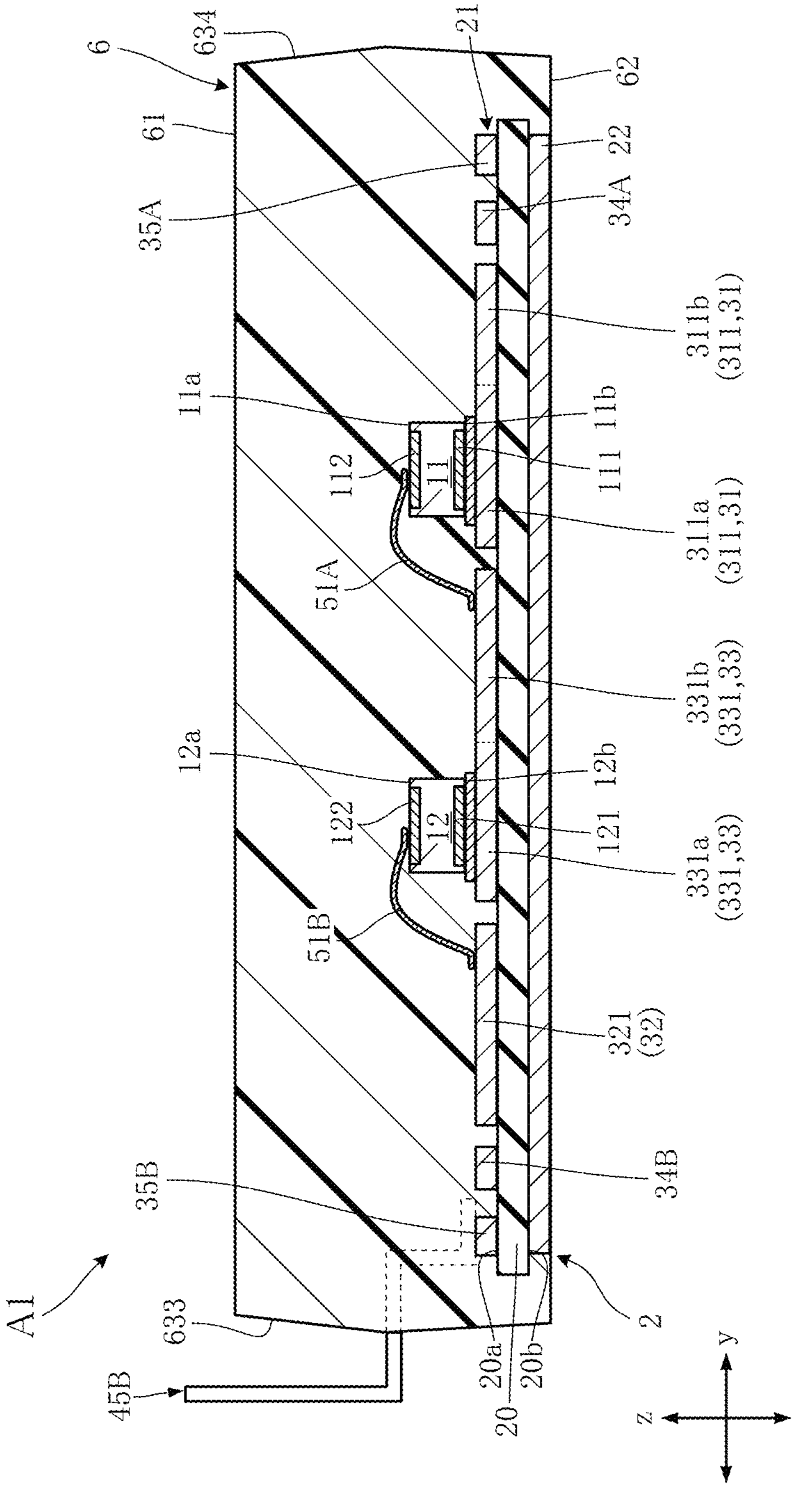
FIG. 5 is a cross-sectional view of FIG. 2 taken along a line V-V.

Each first semiconductor element 11 has a first element obverse face 11*a* and a first element reverse face 11*b*. As shown in FIGS. 3 and 5, the first element obverse face 11*a* and the first element reverse face 11*b* are spaced apart from each other in the thickness direction z. The first element obverse face 11*a* faces one side (upside) of the thickness direction z, while the first element reverse face 11*b* faces the other side (downside) of the thickness direction z. The first element reverse face 11*b* faces the supporting substrate 2 (a power wiring part 31 to be described later).

Each first semiconductor element 11 has a first electrode 111, a second electrode 112, and a third electrode 113. In an example where each first semiconductor element 11 is a MOSFET, the first electrode 111 is a drain electrode, the second electrode 112 is a source electrode, and the third electrode 113 is a gate electrode. As understood from FIGS. 2, 3 and 5, in each first semiconductor element 11, the first electrode 111 is disposed on the first element reverse face 11*b*, while the second electrode 112 and the third electrode 113 are disposed on the first element obverse face 11*a*.

A first driving signal (e.g., a gate voltage) is input to the third electrode 113 (the gate electrode) of each first semiconductor element 11. Each first semiconductor element 11 switches between a conducting state (on state) and a blocking state depending (off state) on the input first driving signal. This operation between the on state and the off state is referred to as a switching operation. A forward current flows from the first electrode 111 (the drain electrode) to the second electrode 112 (the source electrode) in the on state, while the current does not flow in the off state. The first driving signal (e.g., a gate voltage), which is input to the third electrode 113 (the gate electrode), controls on/off between the first electrode 111 (the drain electrode) and the second electrode 112 (the source electrode) in each first semiconductor element 11. A switching frequency of each first semiconductor element 11 depends on the frequency of the first driving signal. The switching frequency is not limited, but may be 10 kHz or more and 100 kHz or less, for example.

The plurality of first semiconductor elements 11 are electrically connected in parallel. Specifically, the plurality of first electrodes 111 (the drain electrodes) are electrically connected to each other, and the plurality of second electrodes 112 (the source electrodes) are electrically connected to each other. In the semiconductor device A1, a first driving signal is commonly input to the first semiconductor elements 11 that are connected in parallel with each other such that the plurality of first semiconductor elements 11 are operated in parallel.

Figure 4:
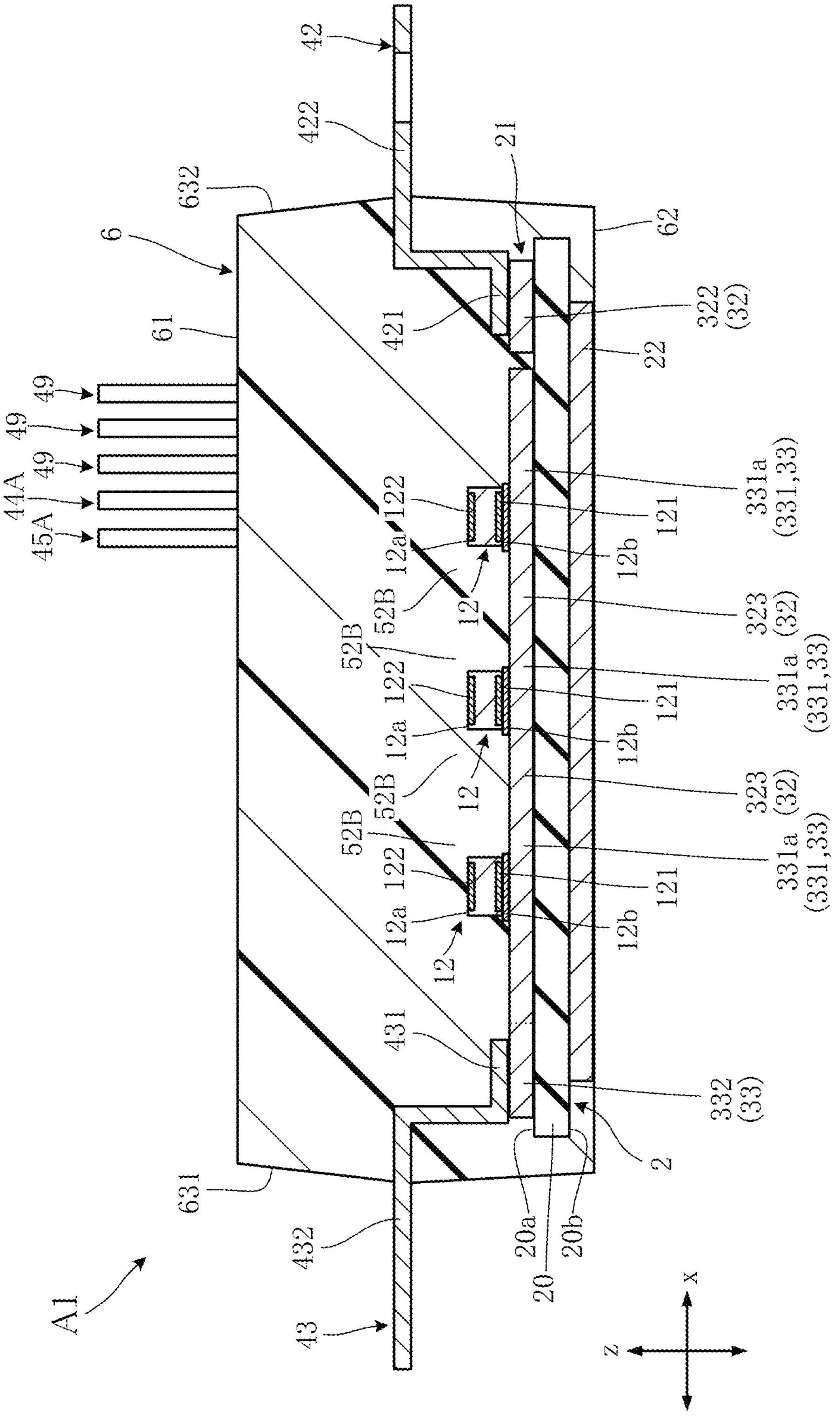
FIG. 4 is a cross-sectional view of FIG. 2 taken along a line IV-IV.

Each of the plurality of second semiconductor elements 12 is bonded to the supporting substrate 2 (a power wiring part 33 to be described later) via a conductive bonding material. The conductive bonding material includes solder, metal paste material, or sintering metal. The plurality of second semiconductor elements 12 are, as shown in FIGS. 2 and 4, equally spaced apart in the first direction x.

Figure 10:
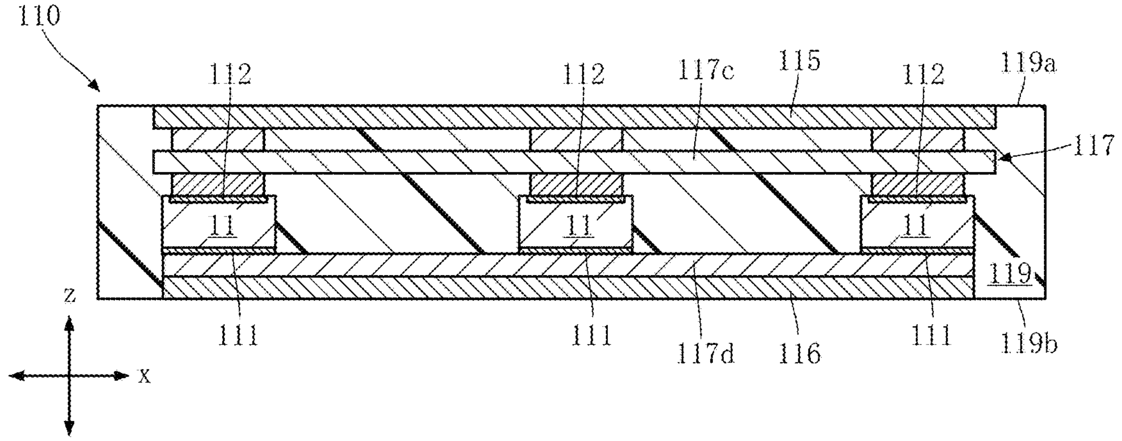
FIG. 10 is a cross-sectional view of FIG. 8 taken along a line X-X.
Figure 13:
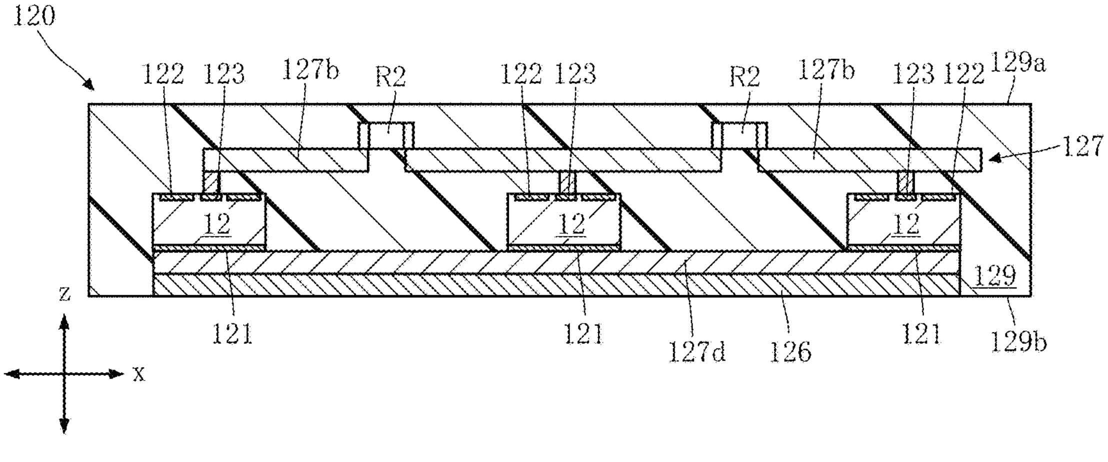
FIG. 13 is a cross-sectional view of FIG. 12 taken along a line XIII-XIII.
Figure 14:
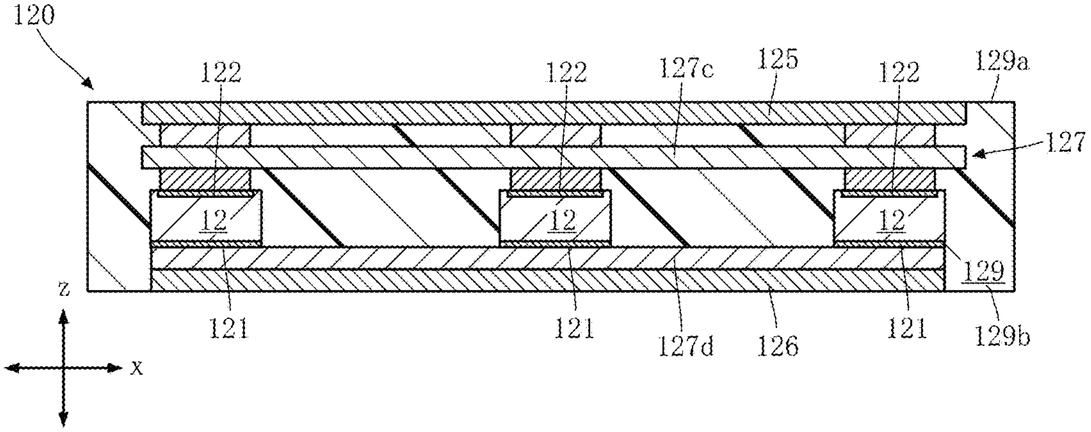
FIG. 14 is a cross-sectional view of FIG. 12 taken along a line XIV-XIV.
Figure 15:
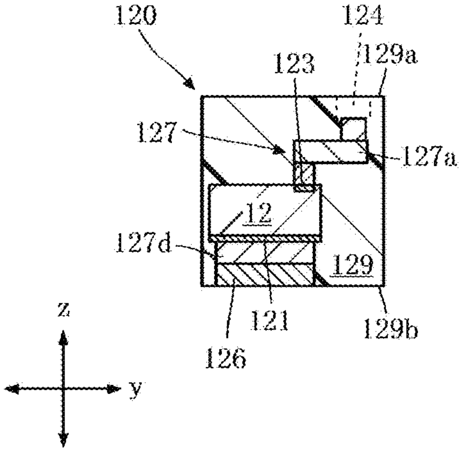
FIG. 15 is a cross-sectional view of FIG. 12 taken along a line XV-XV.

As shown in FIGS. 10 and 13, each second semiconductor element 12 has a second element obverse face 12*a* and a second element reverse face 12*b*. The second element obverse face 12*a* and the second element reverse face 12*b* are spaced apart from each other in the thickness direction z. The second element obverse face 12*a* faces one side (upside) of the thickness direction z, while the second element reverse face 12*b* faces the other side (downside) of the thickness direction z. The second element reverse face 12*b* faces the supporting substrate 2 (a power wiring part 33 to be described later).

Each second semiconductor element 12 has a fourth electrode 121, a fifth electrode 122, and a sixth electrode 123. In an example where each second semiconductor element 12 is a MOSFET, the fourth electrode 121 is a drain electrode, the fifth electrode 122 is a source electrode, and the sixth electrode 123 is a gate electrode. As understood from FIGS. 2, 4 and 5, in each second semiconductor element 12, the fourth electrode 121 is, disposed on the second element reverse face 12*b*, while the fifth electrode 122 and the sixth electrode 123 are disposed on the second element obverse face 12*a*.

A second driving signal (e.g., a gate voltage) is input to the sixth electrode 123 (the gate electrode) of each second semiconductor element 12. Each second semiconductor element 12 switches between an on state and an off state on the input second driving signal. A forward current flows from the fourth electrode 121 (the drain electrode) to the fifth electrode 122 (the source electrode) in the conducting state, while the current does not flow in blocking state. The second driving signal (e.g., a gate voltage), which is input to the sixth electrode 123 (the gate electrode), controls on/off between the fourth electrode 121 (the drain electrode) and the fifth electrode 122 (the source electrode) in each second semiconductor element 12. A switching frequency of each second semiconductor element 12 depends on the frequency of the second driving signal. The switching frequency is not limited, but may be 10 kHz or more and 100 kHz or less, for example.

The second semiconductor elements 12 are electrically connected in parallel. Specifically, the plurality of fourth electrodes 121 (the drain electrode) are electrically connected to each other, and the plurality of fifth electrodes 122 (the source electrodes) are electrically connected to each other. In the semiconductor device A1, a second driving signal is commonly input to the second semiconductor elements 12 that are connected in parallel with each other such that the plurality of second semiconductor elements 12 are operated in parallel.

The supporting substrate 2 supports the first semiconductor elements 11 and the second semiconductor elements 12, and electrically connects the first semiconductor elements 11 and the second semiconductor elements 12 to the plurality of terminals. In the semiconductor device A1, the supporting substrate 2 is, for example, a DBC (Direct Bonded Copper) substrate. Unlike this configuration, the supporting substrate 2 is, for example, a DBA (Direct Bonded Aluminum) substrate. The supporting substrate 2 includes an insulative substrate 20, an obverse metal layer 21, and a reverse metal layer 22.

The insulative substrate 20 contains ceramic with high heat conductivity, for example. Such ceramic includes AlN (aluminum nitride), SiN (silicon nitride), and $Al_2O_3$ (aluminum oxide). The insulative substrate 20 is a flat plate, for example. As shown in FIG. 2, the insulative substrate 20 is rectangular in plan view, for example.

Each of the obverse metal layer 21 and the reverse metal layer 22 contains copper or a copper alloy. Each of the obverse metal layer 21 and the reverse metal layer 22 contains aluminum or aluminum alloy instead of copper or a copper alloy. As shown in FIGS. 3 to 5, the obverse metal layer 21 is formed on the substrate obverse face 20*a*, and the reverse metal layer 22 is formed on the substrate reverse face 20*b*. The lower surface (the surface faces downward in the thickness direction z) of the reverse metal layer 22 is exposed from the sealing member 6. Unlike this configuration, the lower surface of the reverse metal layer 22 may be covered by the sealing member 6.

As shown in FIG. 2, the obverse metal layer includes a plurality of power wiring parts 31 to 33 and a plurality of signal wiring parts 34A, 34B, 35A, 35B, 38A, 38B, 39. The power wiring parts 31-33 and the signal wiring parts 34A, 34B, 35A, 35B, 38A, 38B, 39 are spaced apart from each other.

The power wiring parts 31, 32, 33 provide a conduction path for a main circuit current in the semiconductor device A1. The main circuit current includes a first main circuit current and a second main circuit current. The first main circuit current is a current flowing between the power terminal 41 and the power terminal 43. The second main circuit current is a current flowing between the power terminal 43 and the power terminal 42.

The power wiring part 31 is electrically connected to the first electrode 111 (the drain electrode) of each first semiconductor element 11. The power wiring part 31 is electrically connected to the power terminal 41. The power wiring part 31, as shown in FIG. 2, includes two pad parts 311 and 312. The two pad parts 311 and 312 are connected to each other so as to be an integral member.

The first semiconductor elements 11 are bonded to the pad part 311. The first electrode 111 (the drain electrode) of each first semiconductor element 11 is bonded to the pad part 311. In the illustrated example, in plan view, the pad part 311 has a rectangular shape whose longitudinal direction corresponds to the first direction x. The pad part 311 extends from the pad part 312 along the first direction x.

As shown in FIGS. 2 to 4, the power terminal 41 is bonded to the pad part 312. In the illustrated example, in plan view, the pad part 312 has a band-like shape whose longitudinal direction corresponds to the second direction y. In the first direction x, the pad part 312 is connected to one end of the pad part 311 (where the power terminal 41 is disposed).

The power wiring part 32 is electrically connected to the fifth electrode 122 (the source electrode) of each second semiconductor element 12. The power wiring part 32 is electrically connected to the power terminal 42. The power wiring part 32 includes two pad parts 321 and 322. The two pad parts 321 and 322 are connected with each other so as to be an integral member.

Figure 6:
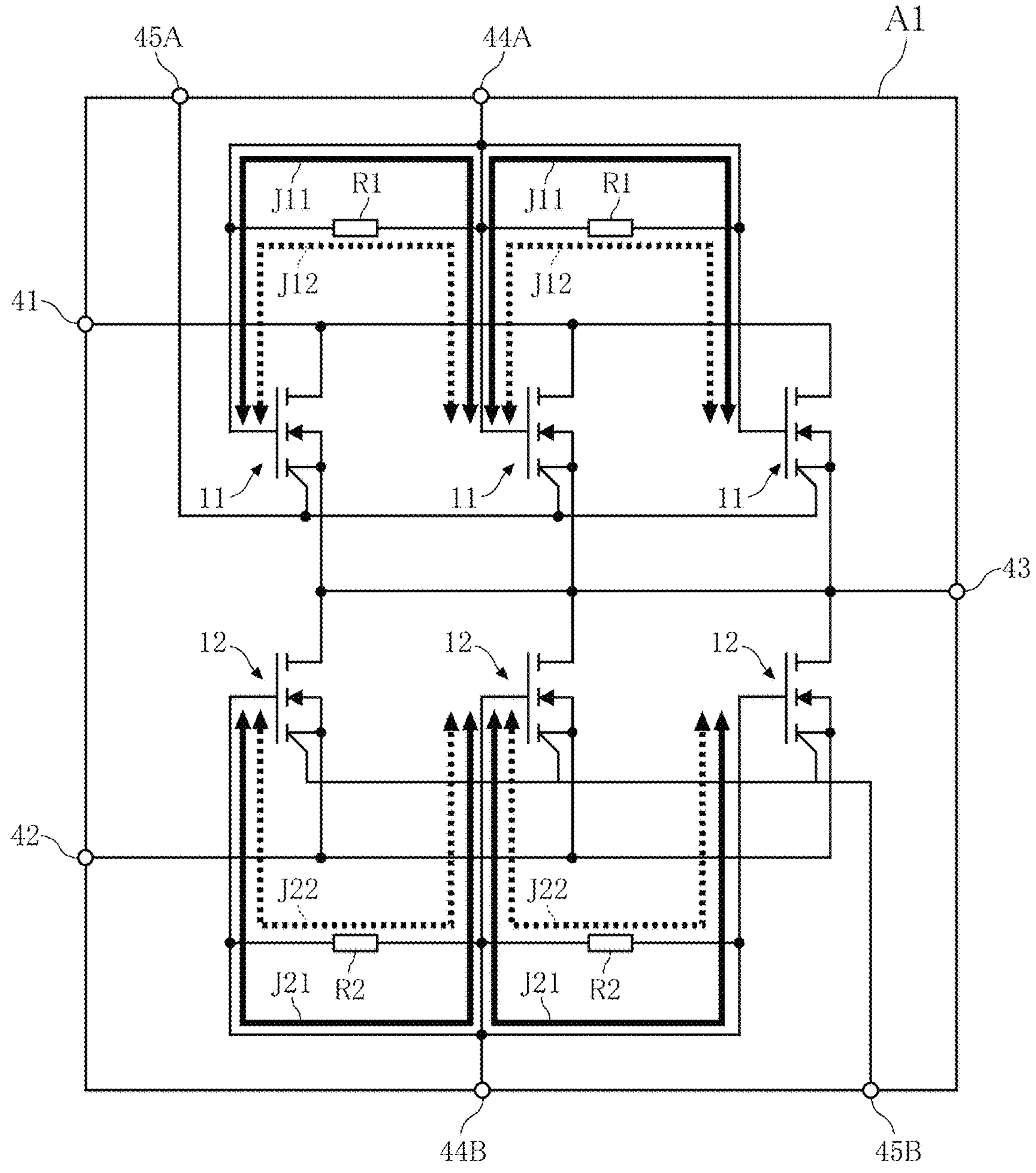
FIG. 6 is a view showing an example of circuit configuration of a semiconductor device according to a first embodiment.

As shown in FIGS. 2 and 6, the connection members 51B are bonded to the pad part 321, which is electrically connected to the fifth electrode 122 (the source electrode) of each second semiconductor element 12 via the connection members 51B. As shown in FIGS. 2 and 3, the pad part 321 extends from the pad part 322 along the first direction x. In the illustrated example, in plan view, the pad part 321 has a band-like shape whose longitudinal direction corresponds to the first direction x. The pad part 321 is positioned on one side with respect to the pad part 311 in the second direction y (the downside in FIG. 2).

As shown in FIGS. 2, 3 and 5, the power terminal 42 is bonded to the pad part 322. In plan view, the pad part 322, as shown in FIGS. 2 and 3, has a band-like shape whose longitudinal direction corresponds to the second direction y. In the first direction x, the pad part 322 is connected to one end of the pad part 321 (where the power terminal 42 is disposed). The pad part 322 is positioned on the other side relative to the pad part 312 in the second direction y (the downside in FIG. 2).

The power wiring part 33 is electrically connected to the second electrode 112 (the source electrode) of each first semiconductor element 11 and to the fourth electrode 121 (the drain electrode) of each second semiconductor element 12. The power wiring part 33 is electrically connected to the two power terminals 43. The power wiring part 33 includes two pad parts 331 and 332. The two pad parts 331 and 332 are connected with each other so as to be an integral member.

As shown in FIGS. 2 and 3, the second semiconductor elements 12 are mounted on the pad part 331. The pad part 331 is electrically connected to the fourth electrode 121 (the source electrode) of each second semiconductor element 12. In the illustrated example, in plan view, the pad part 331 has a rectangular shape whose longitudinal direction corresponds to the first direction x. The pad part 331 extends from the pad part 332 along the first direction x. The pad part 331 is positioned between the pad part 311 and the pad part 321 in the second direction y.

As shown in FIGS. 2 and 3, the power terminal 43 is bonded to the pad part 332. In plan view, the pad part 332 has a band-like shape whose longitudinal direction corresponds to the second direction y. In the first direction x, the pad part 332 is connected to the other end of the pad part 331 (where the power terminal 43 are disposed).

Each of the signal wiring parts 34A, 34B, 35A, 35B, 38A, 38B provide a conduction path for each electrical signal to control the semiconductor device A1.

The signal wiring part 34A is electrically connected to the third electrode 113 (the gate electrode) of each first semiconductor element 11. The signal wiring part 34A transmits the first driving signal. The signal terminal 44A is bonded to the signal wiring part 34A.

The signal wiring part 34B is electrically connected to the sixth electrode 123 (the gate electrode) of each second semiconductor element 12. The signal wiring part 34B transmits the second driving signal. The signal terminal 44B is bonded to the signal wiring part 34B.

As shown in FIG. 2, in the second direction y, the signal wiring part 34A and the signal wiring part 34B are oppositely positioned each other with the pad parts 311, 321 and 331 sandwiched therebetween. In the second direction y, the signal wiring part 34A is opposite to the pad part 331 with respect to the pad part 311. In the second direction y, the signal wiring part 34B is opposite to the pad part 331 with respect to the pad part 321.

The signal wiring part 35A is electrically connected to the second electrode 112 (the source electrode) of each first semiconductor element 11. The signal wiring part 35A transmits a first detecting signal. The first detecting signal indicates the conducting state of each first semiconductor element 11, which may be a voltage signal depending on the current (source current) flowing through each second electrode 112 (the source electrode). The signal terminal 45A is bonded to the signal wiring part 35A.

The signal wiring part 35B is electrically connected to the fifth electrode 122 (the source electrode) of each second semiconductor element 12. The signal wiring part 35B transmits a second detecting signal. The second detecting signal indicates the conducting state of each second semiconductor element 12, which may be a voltage signal corresponding to the current (source current) flowing through each fifth electrode 122 (the source electrode). The signal terminal 45B is bonded to the signal wiring part 35B.

As shown in FIG. 2, in the second direction y, the signal wiring part 35A and the signal wiring part 35B are oppositely positioned each other with the pad parts 311, 321, 331 sandwiched therebetween. In the second direction y, the signal wiring part 35A and the signal wiring part 34A are provided on the same side with respect to the pad part 311. In the second direction y, the signal wiring part 35B and the signal wiring part 34B are provided on the same side with respect to the pad part 321.

The signal wiring part 38A is electrically connected to the third electrode 113 (the gate electrode) of each first semiconductor element 11. In the illustrated example, the signal wiring part 38A is positioned between the signal wiring part 34A and the pad part 311 in the second direction y.

The signal wiring part 38B is electrically connected to the sixth electrode 123 (the gate electrode) of each second semiconductor element 12. In the illustrated example, the signal wiring part 38B is positioned between the signal wiring part 34B and the pad part 321 in the second direction y.

Each of the signal wiring parts 38A, 38B is divided into multiple portions including a plurality of divided parts 381. Unless otherwise stated, the divided part 381 described below is common in the signal wiring parts 38A and 38B. The plurality of divided parts 381 are spaced apart from each other. In plan view, each of the plurality of divided parts 381 has a band-like shape whose longitudinal direction corresponds to the first direction x. The divided parts 381 are disposed along the first direction x.

In the signal wiring part 38A, the two divided parts 381 adjacent in the first direction x are connected to a resistor element R1 with the resistor element R1 bridging the two parts. Hence, in the signal wiring part 38A, two divided parts 381 adjacent in the first direction x are electrically connected to each other via the resistor element R1. Similarly, in the signal wiring part 38B, two divided parts 381 adjacent in the first direction x are connected to a resistor element R2 with the resistor element R2 bridging the two parts. Hence, in the signal wiring part 38B, two divided parts 381 adjacent in the first direction x are electrically connected to each other via the resistor element R2.

None of the signal wiring parts 39 is not electrically connected to either the first semiconductor element 11 or the second semiconductor element 12. In other words, neither the main circuit current nor the electrical signal flow in any of the signal wiring parts 39.

As shown in FIGS. 1 and 2, a part of each of the power terminals 41 to 43 and a part of each of the signal terminals 44A, 44B, 45A, 45B, 49 are exposed from the sealing member 6. The constituent material of the power terminals 41-43 and the signal terminals 44A, 44B, 45A, 45B, 49 are copper or a copper alloy, but may contain other metals (including metal composites). The power terminals 41 to 43 and a part of each of the signal terminals 44A, 44B, 45A, 45B, 49 are each composed of a metal plate and are bent appropriately.

The paired power terminals 41 and the power terminal 42 are connected to a power source, so that a source voltage (e.g. a direct voltage) is applied to these terminals. In the present embodiment, the power terminal 41 is a power input terminal on the positive electrode side (a P terminal) and the power terminal 42 is a power input terminal on the negative electrode side (an N terminal). The power terminal 43 output a voltage (e.g. an alternate current) that is power-converted by the switching operation of the first semiconductor elements 11 and the second semiconductor elements 12. The power terminal 43 is a power output terminal (an OUT terminal). The main circuit current (the first main circuit current and the second main circuit current) in the semiconductor device A1 is generated from the source voltage and the power-converted voltage described above.

The power terminal 41 is electrically connected to the first electrode 111 (the drain electrode) of each first semiconductor element 11 via the power wiring part 31. The power terminal 41 includes a bonded part 411 and a terminal part 412.

As shown in FIG. 2, the bonded part 411 is covered by the sealing member 6. As shown in FIG. 2, the bonded part 411 is bonded to the pad part 312 of the power wiring part 31. Hence, the power terminal 41 is electrically connected to the power wiring part 31. The bonded part 411 and the pad part 312 may be bonded by any of the means such as bonding using conductive bonding materials (solder or sintered metal etc.), laser bonding, or ultrasonic bonding.

As shown in FIG. 2, the terminal part 412 is exposed from the sealing member 6. As shown in FIG. 2, in plan view, the terminal part 412 extends from the sealing member 6 to the one side in the first direction x. The surface of the terminal part 412 may be plated with silver, for example.

The power terminal 42 is electrically connected to the fifth electrode 122 (the source electrode) of each second semiconductor element 12 via the power wiring part 32. The power terminal 42 includes a bonded part 421 and a terminal part 422.

As shown in FIG. 2, the bonded part 421 is covered by the sealing member 6. As shown in FIG. 2, the bonded part 421 is bonded to the pad part 322 of the power wiring part 32. Hence, the power terminal 42 is electrically connected to the power wiring part 32. The bonded part 421 and the pad part 322 may be bonded by any of the means such as bonding using conductive bonding materials (solder or sintered metal etc.), laser bonding, or ultrasonic bonding.

As shown in FIG. 2, the terminal part 422 is exposed from the sealing member 6. As shown in FIG. 2, in plan view, the terminal part 422 extends from the sealing member 6 to the one side in the first direction x. The surface of the terminal part 422 may be plated with silver, for example.

The power terminal 43 is electrically connected, via the power wiring part 33, to the second electrode 112 (the source electrode) of each first semiconductor element 11, and also to the fourth electrode 121 (the drain electrode) of each second semiconductor element 12. The power terminal 43 includes a bonded part 431 and a terminal part 432.

As shown in FIG. 2, the bonded part 431 is covered by the sealing member 6. As shown in FIG. 2, the bonded part 431 is bonded to the pad part 332 of the power wiring part 33. Hence, the power terminal 43 is electrically connected to the power wiring part 33. The bonded part 431 and the pad part 332 may be bonded by any of the means such as bonding using conductive bonding materials (solder or sintered metal etc.), laser bonding, or ultrasonic bonding.

As shown in FIG. 2, the terminal part 432 is exposed from the sealing member 6. As shown in FIG. 2, in plan view, the terminal part 432 extends from the sealing member 6 to the other side in the first direction x. The surface of the terminal part 432 may be plated with silver, for example.

The power terminal 41 and the power terminal 42 are spaced apart from each other and arranged along the second direction y. In the first direction x, the power terminal 41 and the power terminal 42 are opposite to the power terminal 43 with respect to the supporting substrate 2. In a different configuration from the semiconductor device A1, the number of the power terminal 43 is not one, but may be two. In this case, the power terminals 43 may be bonded to the power wiring part 33 (the pad part 332) and disposed along the second direction y.

The signal terminals 44A, 44B, 45A, 45B are input terminals or output terminals for an electrical signal to control the semiconductor device A1. Each of the signal terminals 44A, 44B, 45A, 45B, 49 includes a portion covered by the sealing member 6 and a portion exposed from the sealing member 6. Each of the signal terminals 44A, 44B, 45A, 45B, 49 is a pin-like metal component. The metal component contains copper or a copper alloy, for example.

As shown in FIG. 2, the portion covered by the sealing member 6 in the signal terminal 44A is bonded to the signal wiring part 34A. The signal wiring part 34A is electrically connected to the third electrode 113 (the gate electrode) of each first semiconductor element 11, so that the signal terminal 44A is electrically connected to each third electrode 113. The signal terminal 44A is an input terminal of the first driving signal.

As shown in FIG. 2, the portion covered by the sealing member 6 in the signal terminal 44B is bonded to the signal wiring part 34B. The signal wiring part 34B is electrically connected to the sixth electrode 123 (the gate electrode) of each second semiconductor element 12, so that the signal terminal 44B is electrically connected to each sixth electrode 123. The signal terminal 44B is an input terminal of the second driving signal.

As shown in FIG. 2, the portion covered by the sealing member 6 in the signal terminal 45A is bonded to the signal wiring part 35A. The signal wiring part 35A is electrically connected to the second electrode 112 (the source electrode) of each first semiconductor element 11, so that the signal terminal 45A is electrically connected to each second electrode 112. The signal terminal 45A is an output terminal of the first detecting signal.

As shown in FIG. 2, the portion covered by the sealing member 6 in the signal terminal 45B is bonded to the signal wiring part 35B. The signal wiring part 35B is electrically connected to the fifth electrode 122 (the source electrode) of each second semiconductor element 12, so that the signal terminal 45B is electrically connected to each fifth electrode 122. The signal terminal 45B is an output terminal of the second detecting signal.

As shown in FIG. 2, the portion covered by the sealing member 6 in each signal terminal 49 is bonded to the respective signal wiring part 39. Each of the signal terminals 49 is electrically connected to neither the first semiconductor elements 11 nor the second semiconductor elements 12. Each of the signal terminals 49 is a non-connect terminal. The semiconductor device A1 may not include the signal terminals 49.

Each of the plurality of connection members 51A, 51B, 52A, 52B, 53A, 53B, 54A, 54B electrically connects two parts that are spaced apart from each other. In the semiconductor device A1, each of the connection members 51A, 51B, 52A, 52B, 53A, 53B, 54A, 54B is a bonding wire(s). The constituent material of each of the connection members 51A, 51B, 52A, 52B, 53A, 53B, 54A, 54B may be gold, copper, or aluminum.

As shown in FIGS. 2 and 5, each of the connection members 51A is bonded to the second electrode 112 (the source electrode) of the relevant first semiconductor element 11 and the pad part 331, thereby electrically connecting the second electrodes 112 and the power wiring part 33 to each other. In the semiconductor device A1, as shown in FIG. 2, a plurality of connection members 51A are bonded to any one of the second electrodes 112. The main circuit current (the first main circuit current) of the semiconductor device A1 flows through the connection members 51A. The connection members 51A bonded to each second electrode 112 are not limited to bonding wires, but may be one metal (e.g., copper) plate component.

As shown in FIGS. 2 and 5, each of the connection members 51B is bonded to the fifth electrode 122 (the source electrode) of the relevant second semiconductor element 12 and the pad part 321, thereby electrically connecting the fifth electrode 122 and the power wiring part 32 to each other. In the semiconductor device A1, as shown in FIG. 2, a plurality of connection members 51B are bonded to any one of the fifth electrodes 122. The main circuit current (the second main circuit current) of the semiconductor device A1 flows through the connection members 51B. The plurality of connection members 51B bonded to each fifth electrode 122 are not limited to bonding wires, but may be one metal (e.g., copper) plate component.

As shown in FIG. 2, each of the connection members 52A is bonded to the third electrode 113 (the gate electrode) of each first semiconductor element 11 and each divided part 381 of the signal wiring part 38A, thereby electrically connecting the third electrode 113 and the divided part 381 of the signal wiring part 38A. Hence, each divided part 381 of the signal wiring part 38A is electrically connected to the third electrode 113 (the gate electrode) of the relevant first semiconductor element 11 via the connection members 52A.

As shown in FIG. 2, each of the connection members 52B is bonded to the sixth electrode 123 (the gate electrode) of each second semiconductor element 12 and each divided part 381 of the signal wiring part 38B, thereby electrically connecting the sixth electrode 123 and the divided part 381 of the signal wiring part 38B. Hence, each divided part 381 of the signal wiring part 38B is electrically connected to the sixth electrode 123 (the gate electrode) of the relevant second semiconductor element 12 via the connection members 52B.

As shown in FIG. 2, each of the connection members 53A is bonded to each divided part 381 of the signal wiring part 38A and the signal wiring part 34A, thereby electrically connecting each divided part 381 of the signal wiring part 38A and the signal wiring part 34A. Hence, the signal wiring part 34A is electrically connected to each divided part 381 of the signal wiring part 38A via the connection members 53A. Thus, the signal wiring part 34A is electrically connected to the third electrodes 113 via the connection members 52A and 53A.

As shown in FIG. 2, each of the connection members 53B is bonded to each divided part 381 of the signal wiring part 38B and the signal wiring part 34B, thereby electrically connecting each divided part 381 of the signal wiring part 38B and the signal wiring part 34B. Hence, the signal wiring part 34B is electrically connected to each divided part 381 of the signal wiring part 38A via the connection members 53B. Thus, the signal wiring part 34B is electrically connected to the sixth electrodes 123 via the connection members 52B and 53B.

As shown in FIG. 2, each of the connection members 54A is bonded to the second electrode 112 (the source electrode) of each first semiconductor element 11 and the signal wiring part 35A, thereby electrically connecting the second electrode 112 and the signal wiring part 35A. Hence, the signal wiring part 35A is electrically connected to the second electrodes 112 via the connection members 54A, so that the signal terminal 45A is electrically connected to the second electrodes 112 via the signal wiring part 35A and the connection members 54A.

As shown in FIG. 2, each of the connection members 54B is bonded to the fifth electrode 122 (the source electrode) of each second semiconductor element 12 and the signal wiring part 35B, thereby electrically connecting the fifth electrode 122 and the signal wiring part 35B. Hence, the signal wiring part 35B is electrically connected to the fifth electrodes 122 via the connection members 54B, so that the signal terminal 45B is electrically connected to the fifth electrodes 122 via the signal wiring part 35B and the connection members 54B.

The sealing member 6 is a sealing component to protect the first semiconductor elements 11, and the second semiconductor elements 12 etc. The sealing member 6 covers the first semiconductor elements 11, the second semiconductor elements 12, a part of the supporting substrate 2, a part of each of the power terminals 41 to 43, a part of each of the signal terminals 44A, 44B, 45A, 45B, 49, and the connection members 51A, 51B, 52A, 52B, 53A, 53B, 54A, 54B. The sealing member 6, for example, contains an insulative resin material. The insulative material contains epoxy resin, for example. The sealing member 6 is black, for example. In plan view, the sealing member 6 is rectangular. The sealing member 6 includes a resin obverse face 61, a resin reverse face 62, and a plurality of resin side faces 631-634.

As shown in FIGS. 4 to 6, the resin obverse face 61 and the resin reverse face 62 are spaced apart from each other in the thickness direction z. The resin obverse face 61 faces the upside of the thickness direction z, while the resin reverse face 62 faces the downside of the thickness direction z. Each of the resin side faces 631 to 634 is sandwiched between the resin obverse face 61 and the resin reverse face 62 and connected to them. As shown in FIGS. 4 and 5, the resin side face 631 and the resin side face 632 faces away from each other in the first direction x. Each of the power terminals 41, 42 protrudes from the resin side face 632, and the power terminal 43 protrudes from the resin side face 631. As shown in FIG. 6, the resin side face 633 and the resin side face 634 faces away from each other in the second direction y. The signal terminals 44A and 45A protrude from the resin side face 634, and the signal terminals 44B and 45B protrudes from the resin side face 633.

In the semiconductor device A1, the third electrodes 113 of any two first semiconductor elements 11 adjacent in the first direction x are electrically connected to each other via a first conduction path J11 through a first conductor G1 and a second conduction path J12 through a second conductor G2.

The first conductor G1 is electrically interposed between the third electrodes 113 of the first semiconductor elements 11. The first conductor G1 is provided on the transmission path of the first driving signal from the signal terminal 44A to each third electrode 113. In the present embodiment, the first conductor G1 includes the signal wiring part 34A (precisely, the portion of the signal wiring part 34A from the position where one of two connection members 53A is bonded to the position where the other of the two connection members 53A is bonded). Hence, the first conduction path J11 extends through the signal wiring part 34A in the electrical connection between the third electrodes 113. In the illustrated example, the first conduction path J11 extends from the third electrode 113 of one first semiconductor element 11, through the connection member 52A bonded to the third electrode 113, the divided part 381 (the signal wiring part 38A) bonded to the connection member 52A, the connection member 53A bonded to the divided part 381, the signal wiring part 34A bonded to the connection member 53A, the other connection member 53A bonded to the signal wiring part 34A, the other divided part 381 (the signal wiring part 38A) bonded to the connection member 53A, and the connection member 52A bonded to the divided part 381, and finally to the third electrode 113 of another first semiconductor element 11.

The second conductor G2 is electrically interposed between the third electrodes 113 of the first semiconductor elements 11. The second conductor G2 is not provided on the transmission path of the first driving signal from the signal terminal 44A to each third electrode 113. In the present embodiment, the second conductor G2 includes the signal wiring part 38A (specifically, the portion of the signal wiring part 38A from the position where one of the two connection members 52A is bonded to the position where the other of the two connection members 52A is bonded). Hence, the second conduction path J12 extends through the signal wiring part 38A in the electrical connection between the third electrodes 113. In the illustrated example, the second conduction path J12 extends from the third electrode 113 of one first semiconductor element 11, through the connection member 52A bonded to the third electrode 113, the divided part 381 (the signal wiring part 38A) bonded to the connection member 52A, the resistor element R1 bonded to the divided part 381, the other divided part 381 (the signal wiring part 38A) bonded to the resistor element R1, and the connection member 52A bonded to the divided part 381, and finally to the third electrode 113 of another first semiconductor element 11.

In the semiconductor device A1, the first conduction path J11 and the second conduction path J12 are designed to have the following relationship so that the impedance of the second conduction path J12 is smaller than the impedance of the first conduction path J11 at the oscillation frequency (e.g. 100 MHz or more and 400 MHZ or less) of the oscillation caused by the parallel operation of the first semiconductor elements 11. First, the inductance value of the second conduction path J12 is smaller than the inductance value of the first conduction path J11. Second, the resistance value of the second conduction path J12 is larger than the resistance value of the first conduction path J11. In the present embodiment, the resistive component in the first conduction path J11 includes the wiring resistance of the first conduction path J11, and the resistive component in the second conduction path J12 includes the wiring resistance and the resistor element R1 of the second conduction path J12. Preferably, the inductance value relationship and the resistance value relationship are designed so that the impedance of the second conduction path J12 is 50% less (0% larger) than the impedance of the first conduction path J11. For example, in the semiconductor device A1, the length of the second conduction path J12 is shorter than the length of the first conduction path J11 so as to achieve the above inductance value relationship. Also, in the semiconductor device A1, the resistor element R1 is interposed on the second conduction path J12 so as to achieve the above resistance relationship.

In the semiconductor device A1, the sixth electrodes 123 of any two second semiconductor elements 12 adjacent in the first direction x are electrically connected to each other via a third conduction path J21 through a third conductor G3 and a fourth conduction path J22 through a fourth conductor G4.

The third conductor G3 is electrically interposed between the sixth electrodes 123 of the second semiconductor elements 12. The third conductor G3 is provided on the transmission path of the second driving signal from the signal terminal 44B to each sixth electrode 123. In the present embodiment, the third conductor G3 includes the signal wiring part 34B (specifically, the portion of the signal wiring part 34B from the position where one of the two connection members 53B is bonded to the position where the other of the two connection members 53B is bonded). Hence, the third conduction path J21 extends through the signal wiring part 34B in the electrical connection between the sixth electrodes 123. In the illustrated example, the third conduction path J21 extends from the sixth electrode 123 of one second semiconductor element 12, through the connection member 52B bonded to the sixth electrode 123, the divided part 381 (the signal wiring part 38B) bonded to the connection member 52B, the connection member 53B bonded to the divided part 381, the signal wiring part 34B bonded to the connection member 53B, the other connection member 53B bonded to the signal wiring part 34B, the other divided part 381 (the signal wiring part 38B) bonded to the connection member 53B, and the connection member 52B bonded to the divided part 381, and finally to the sixth electrode 123 of another second semiconductor element 12.

The fourth conductor G4 is electrically interpose between the sixth electrodes 123 of the second semiconductor elements 12. The fourth conductor G4 is not provided on the transmission path of the first driving signal from the signal terminal 44B to each sixth electrode 123. In the present embodiment, the fourth conductor G4 includes the signal wiring part 38B (specifically, the portion of the signal wiring part 38B from the position where one of the two connection members 52B is bonded to the position where the other of the two connection members 52B is bonded). Hence, the fourth conduction path J22 extends through the signal wiring part 38B in the electrical connection between the sixth electrodes 123. In the illustrated example, the fourth conduction path J22 extends from the sixth electrode 123 of one of the second semiconductor elements 12, through the connection member 52B bonded to the sixth electrode 123, the divided part 381 (the signal wiring part 38B) bonded to the connection member 52B, the resistor element R2 bonded to the divided part 381, the other divided part 381 (the signal wiring part 38B) bonded to the resistor element R2, and the connection member 52B bonded to the divided part 381, and finally to the sixth electrode 123 of another of the second semiconductor elements 12.

In the semiconductor device A1, at the oscillation frequency (e.g. 100 MHz or more and 400 MHZ or less) of the oscillation caused by the parallel operation of the second semiconductor elements 12, the third conduction path J21 and the fourth conduction path J22 are designed to have the following relationship so that the impedance of the fourth conduction path J22 is smaller than the impedance of the third conduction path J21. First, the inductance value of the fourth conduction path J22 is smaller than the inductance value of the third conduction path J21. Second, the resistance value of the fourth conduction path J22 is larger than the resistance value of the third conduction path J21. In the present embodiment, the resistive component in the third conduction path J21 includes the wiring resistance of the third conduction path J21, and the resistive component in the fourth conduction path J22 includes the wiring resistance and the resistor element R2 of the fourth conduction path J22. Preferably, the inductance value relationship and the resistance value relationship are designed so that the impedance of the fourth conduction path J22 is 50% less (0% larger) than the impedance of the third conduction path J21. For example, in the semiconductor device A1, the length of the fourth conduction path J22 is shorter than the length of the third conduction path J21 so as to achieve the above inductance value relationship. Also, in the semiconductor device A1, the resistor element R2 is interposed on the fourth conduction path J22 so as to achieve the above resistance relationship.

Advantages of the semiconductor device A1 may be as follows.

In the semiconductor device A1, the electrical connection between the third electrodes 113 of any two first semiconductor elements 11 includes the first conduction path J11 through the first conductor G1 and the second conduction path J12 through the second conductor G2. In the present embodiment, the semiconductor device A1 includes the signal wiring part 34A as the first conductor G1 and the signal wiring part 38A as the second conductor G2. The inductance value of the second conduction path J12 is smaller than the inductance value of the first conduction path J11, and the resistance value of the second conduction path J12 is larger than the resistance value of the first conduction path J11. The oscillation frequency that may be occurred by the parallel operation of the first semiconductor elements 11 is larger than the switching frequency of each first semiconductor element 11. Hence, when the inductance value of the second conduction path J12 is set to be larger than the inductance value of the first conduction path J11, the signal of the oscillation frequency is likely to flow through the second conduction path J12 rather than the first conduction path J11. The signal of the oscillation frequency through the second conduction path J12 is damped by the resistive component in the second conduction path J12. In this case, since the resistance value of the second conduction path J12 is larger than the resistance value of the first conduction path J11, the second conduction path J12 functions as the damping resistor to damp the signal of the oscillation frequency. Therefore, the semiconductor device A1 is advantageous in suppressing an oscillation phenomenon when the first semiconductor elements 11 are operated in parallel. This oscillation phenomenon is hereinafter referred to as a "first oscillation phenomenon".

In the semiconductor device A1, at the oscillation frequency of the first oscillation phenomenon without the second conduction path J12, the impedance of the second conduction path J12 is smaller than the impedance of the first conduction path J11. Hence, the resistive component of the second conduction path J12 allows the signal of the oscillation frequency to be more damped. Therefore, the semiconductor device A1 has a preferable structure for suppressing the first oscillation phenomenon.

In the semiconductor device A1, no resistor is interposed in the conduction path from the signal terminal 44A to the third electrode 113 of each first semiconductor element 11. That is, a gate resistor is not connected to each third electrode 113. A gate resistor decreases the switching speed of each first semiconductor element 11. Therefore, the semiconductor device A1 is advantageous in suppressing the first oscillation phenomenon without decreasing the switching speed of each first semiconductor element 11.

In the semiconductor device A1, the signal wiring part 38A is divided into the plurality of divided parts 381. Further, each of the two divided parts 381 adjacent in the first direction x is connected to the resistor element R1 with the resistor element R1 bridging the two divided parts 381. Such a configuration may easily make the second conduction path J12 shorter than the first conduction path J11 and the resistance value of the second conduction path J12 larger than the resistance value of the first conduction path J11. In other words, the semiconductor device A1 has a preferable structure for increasing the inductance value of the first conduction path J11 more than the inductance value of the second conduction path J12 and for reducing the resistance value of the first conduction path J11 less than the resistance value of the second conduction path J12.

In the semiconductor device A1, the electrical connection between the sixth electrodes 123 of any two second semiconductor elements 12 includes the third conduction path J21 through the third conductor G3 and the fourth conduction path J22 through the fourth conductor G4. In the present embodiment, the semiconductor device A1 includes the signal wiring part 34B as the third conductor G3 and the signal wiring part 38B as the fourth conductor G4. The inductance value of the fourth conduction path J22 is smaller than the inductance value of the third conduction path J21, and the resistance value of the fourth conduction path J22 is larger than the resistance value of the third conduction path J21. The oscillation frequency that may be occurred by the parallel operation of the second semiconductor elements 12 is larger than the switching frequency of each second semiconductor element 12. Hence, when the inductance value of the fourth conduction path J22 is set to be larger than the inductance value of the third conduction path J21, the signal of the oscillation frequency is likely to flow through the fourth conduction path J22 rather than the third conduction path J21. The signal of the oscillation frequency through the fourth conduction path J22 is damped by the resistive component in the fourth conduction path J22. In this case, since the resistance value of the fourth conduction path J22 is larger than the resistance value of the third conduction path J21, the fourth conduction path J22 functions as the damping resistor to damp the signal of the oscillation frequency. Therefore, the semiconductor device A1 is advantageous in suppressing an oscillation phenomenon when the second semiconductor elements 12 are operated in parallel. This oscillation phenomenon is hereinafter referred to as a "second oscillation phenomenon".

In the semiconductor device A1, at the oscillation frequency of the second oscillation phenomenon without the fourth conduction path J22, the impedance of the fourth conduction path J22 is smaller than the impedance of the third conduction path J21. Hence, the resistive component of the fourth conduction path J22 allows the signal of the oscillation frequency to be more damped. Therefore, the semiconductor device A1 has a preferable structure for suppressing the second oscillation phenomenon.

In the semiconductor device A1, no resistor is interposed in the conduction path from the signal terminal 44B to the sixth electrode 123 of each second semiconductor element 12. That is, a gate resistor is not connected to each sixth electrode 123. A gate resistor decreases the switching speed of each second semiconductor element 12. Therefore, the semiconductor device A1 is advantageous in suppressing the second oscillation phenomenon without decreasing the switching speed of each second semiconductor element 12.

In the semiconductor device A1, the signal wiring part 38B is divided into the plurality of divided parts 381. Further, each of the two divided parts 381 adjacent in the first direction x is connected to the resistor element R2 with the resistor element R2 bridging the two divided parts 381. Such a configuration may easily make the fourth conduction path J22 shorter than the third conduction path J21 and the resistance value of the fourth conduction path J22 larger than the resistance value of the third conduction path J21. In other words, the semiconductor device A1 has a preferable structure for increasing the inductance value of the third conduction path J21 more than the inductance value of the fourth conduction path J22 and for reducing the resistance value of the third conduction path J21 less than the resistance value of the fourth conduction path J22.

In the above first embodiment, the resistor element R1 allows the resistance value of the second conduction path J12 to be larger than the resistance value of the first conduction path J11, but unlike this configuration, the following configuration may be applied. The two divided parts 381 of signal wiring part 38A may be connected by a bonding wire instead of the resistor element R1 to increase the resistance value. In the case where the signal wiring part 38A is not divided into the divided parts 381, the signal wiring part 38A may be made locally narrow or thin to increase the resistance value. Further, a part of or all the signal wiring part 38A may be made of a material with higher resistance than the signal wiring part 34A (e.g., a metal material with higher resistance than copper or a copper alloy). Such a configuration also may easily make the second conduction path J12 shorter than the first conduction path J11 and the resistance value of the second conduction path J12 larger than the resistance value of the first conduction path J11. Similarly, in the above first embodiment, the resistor element R2 allows the resistance value of the fourth conduction path J22 to be larger than the resistance value of the third conduction path J21, but unlike this configuration, the following configuration may be applied. The two divided parts 381 of signal wiring part 38B may be connected by a bonding wire instead of the resistor element R2 to increase the resistance value. In the case where the signal wiring part 38B is not divided into the divided parts 381, the signal wiring part 38B may be made locally narrow or thin to increase the resistance value. Further, a part of or all the signal wiring part 38B may be made of a material with higher resistance than the signal wiring part 34B (e.g., a metal material with higher resistance than copper or a copper alloy) Such a configuration also may easily make the fourth conduction path J22 shorter than the third conduction path J21 and the resistance value of the fourth conduction path J22 larger than the resistance value of the third conduction path J21.

FIGS. 7 to 15 show a semiconductor device A2 according to a variation of the first embodiment. As shown in the figures, the semiconductor device A2 includes a first switching part 110 including the first semiconductor elements 11 and a second switching part 120 including the second semiconductor elements 12. The circuit configuration of the semiconductor device A2 is same as the circuit configuration of the semiconductor device A1.

As shown in FIGS. 7 to 11, the first switching part 110 includes a plurality of first semiconductor elements 11, a plurality of resistor elements R1, a plurality of first rewiring electrodes 114, a second rewiring electrode 115, a third rewiring electrode 116, an internal wiring 117, and a resin member 119.

The resin member 119 covers the first semiconductor elements 11 and the internal wiring 117. The resin member 119 includes an obverse face 119*a* and a reverse face 119*b*. The obverse face 119*a* and the reverse face 119*b* are spaced apart from each other in the thickness direction z. The resin member 119 contains an insulative resin material. The insulative resin material includes epoxy resin, for example.

Figure 7:
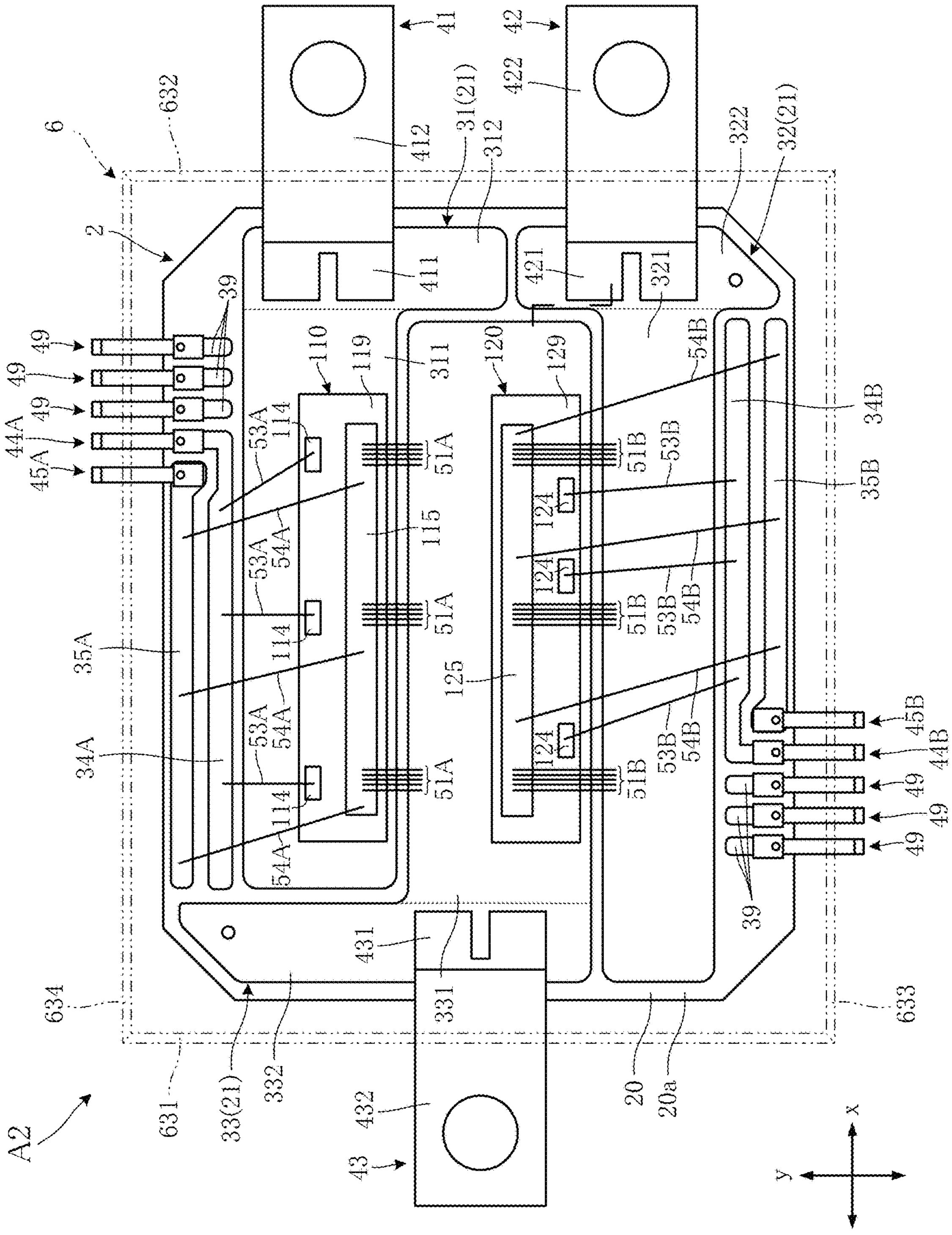
FIG. 7 is a plan view of a semiconductor device according to a variation of a first embodiment in which a sealing member is indicated by imaginary lines.

The first rewiring electrodes 114 are electrically connected to the third electrodes 113 (the gate electrodes) of the first semiconductor elements 11 via the internal wiring 117. The first rewiring electrodes 114 are exposed from the resin member 119 at the obverse face 119*a*. As shown in FIG. 7, the first rewiring electrodes 114 are bonded to the connection members 53A, respectively, and are electrically connected to the signal wiring part 34A via the connection members 53A.

The second rewiring electrode 115 is electrically connected to the second electrodes 112 (the source electrodes) of the first semiconductor elements 11 via the internal wiring 117. The second rewiring electrode 115 is exposed from the resin member 119 at the obverse face 119*a*. As shown in FIG. 7, the second rewiring electrode 115 is bonded to the connection members 51A, respectively, and is electrically connected to the pad part 331 (the power wiring part 33) via the connection members 51A.

The third rewiring electrode 116 is electrically connected to the first electrodes 111 (the drain electrodes) of the first semiconductor elements 11 via the internal wiring 117. The third rewiring electrode 116 is exposed from the resin member 119 at the reverse face 119*b*. The third rewiring electrode 116 is bonded to the pad part 311.

The internal wiring 117 electrically connects the first semiconductor elements 11, the resistor elements R1, the first rewiring electrodes 114, the second rewiring electrode 115, and the third rewiring electrode 116 to each other. The constituent material of the internal wiring 117 is not limited, but includes copper or a copper alloy, for example. As shown in FIGS. 8 to 11, the internal wiring 117 includes a plurality of first wiring parts 117*a*, a plurality of second wiring parts 117*b*, a third wiring part 117*c*, and a fourth wiring part 117*d*.

The first wiring parts 117*a* are electrically connected to the third electrodes 113 of the first semiconductor elements 11 and the first rewiring electrodes 114, respectively. In plan view, the shape of each first wiring part 117*a* may be appropriately changed according to the relative position and the size of each third electrode 113 and each first rewiring electrode 114.

Figure 9:
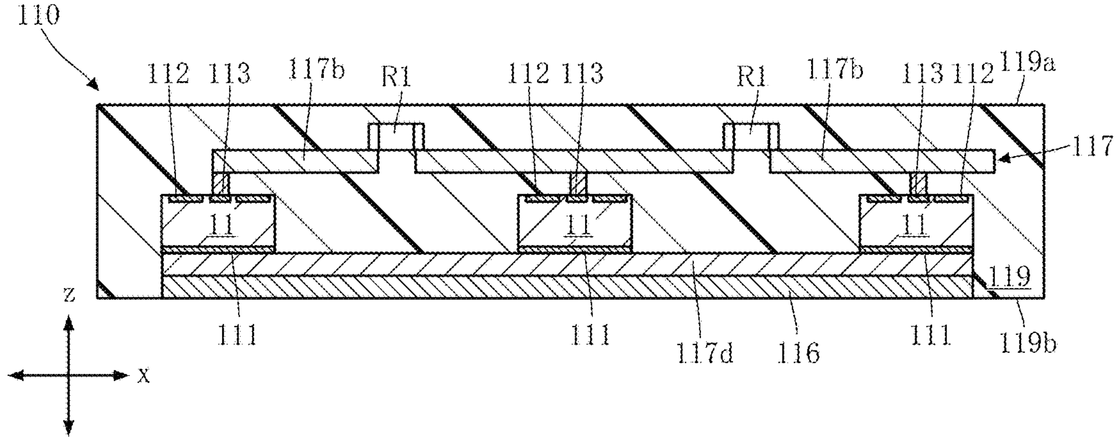
FIG. 9 is a cross-sectional view of FIG. 8 taken along a line IX-IX.

The second wiring parts 117*b* are electrically connected to the third electrodes 113 of the first semiconductor elements 11 and the resistor elements R1, respectively. As shown in FIG. 9, each resistor element R1 is bonded to each of the two second wiring parts 117*b* and bridges the two second wiring parts 117*b*. Each second wiring part 117*b* is aligned with each first wiring part 117*a* in the thickness direction z. In plan view, the shape of each second wiring part 117*b* may be appropriately changed according to the relative position and the size of each third electrode 113.

The third wiring part 117*c* is electrically connected to the second electrodes 112 of the first semiconductor elements 11 and the second rewiring electrode 115. The third wiring part 117*c* is aligned with each first wiring part 117*a* and each second wiring part 117*b* in the thickness direction z. In plan view, the shape of the third wiring part 117*c* may be appropriately changed according to the relative position and the size of each second electrode 112 and the second rewiring electrode 115.

The fourth wiring part 117*d* is electrically connected to the first electrodes 111 of the first semiconductor elements 11 and the third rewiring electrode 116. In plan view, the shape of the fourth wiring part 117*d* may be appropriately changed according to the relative position and the size of each first electrode 111 and the third rewiring electrode 116.

Figure 11:
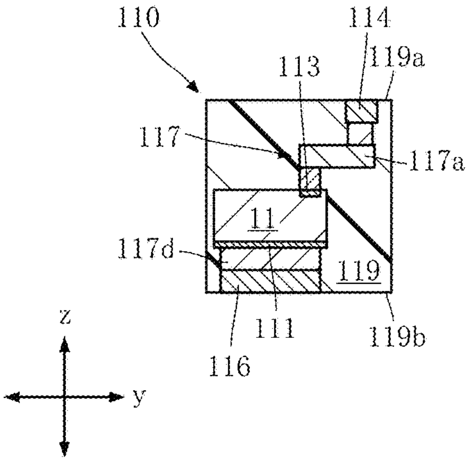
FIG. 11 is a cross-sectional view of FIG. 8 taken along a line XI-XI.
Figure 12:
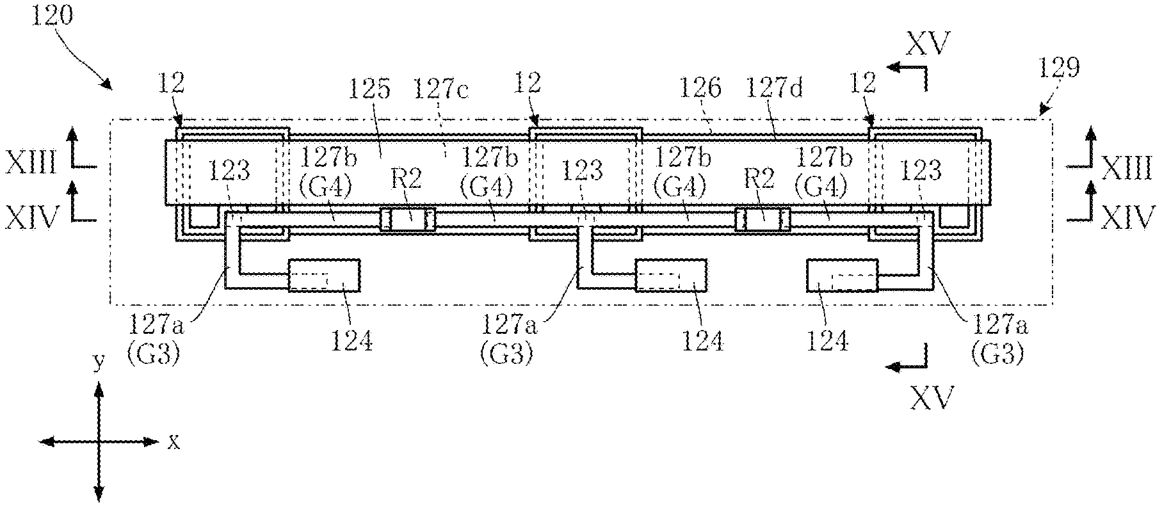
FIG. 12 is a plan view showing a second switching part in the semiconductor device shown in FIG. 7.

As understood from FIGS. 9 to 11, the internal wiring 117 includes a portion electrically connecting the third electrode 113 to the first wiring part 117*a* or the second wiring part 117*b*, a portion electrically connecting the first wiring part 117*a* to the first rewiring electrode 114, a portion electrically connecting the second electrode 112 to the third wiring part 117*c*, a portion electrically connecting the third wiring part 117*c* to the second rewiring electrode 115, and a portion electrically connecting the first electrode 111 to the third rewiring electrode 116 in addition to the first wiring parts 117*a*, the second wiring parts 117*b*, the third wiring part 117*c*, and the fourth wiring part 117*d*.

As shown in FIGS. 7 and 12 to 15, the second switching part 120 includes a plurality of second semiconductor elements 12, a plurality of resistor elements R2, a plurality of fourth rewiring electrodes 124, a fifth rewiring electrode 125, a sixth rewiring electrode 126, an internal wiring 127, and a resin member 129.

The resin member 129 covers the second semiconductor elements 12 and the internal wiring 127. The resin member 129 includes an obverse face 129*a* and a reverse face 129*b*. The obverse face 129*a* and the reverse face 129*b* are spaced apart from each other in the thickness direction z. The resin member 129 contains an insulative resin material. The insulative resin material includes epoxy resin, for example.

The fourth rewiring electrodes 124 are electrically connected to the sixth electrodes 123 (the gate electrodes) of the second semiconductor elements 12 via the internal wiring 127. The fourth rewiring electrodes 124 are exposed from the resin member 129 at the obverse face 129*a*. As shown in FIG. 7, the fourth rewiring electrodes 124 are bonded to the connection members 53B, respectively, and are electrically connected to the signal wiring part 34B via the connection members 53B.

The fifth rewiring electrode 125 is electrically connected to the fifth electrodes 122 (the source electrodes) of the second semiconductor elements 12 via the internal wiring 127. The fifth rewiring electrode 125 is exposed from the resin member 129 at the obverse face 129*a*. As shown in FIG. 7, the fifth rewiring electrode 125 is bonded to the connection members 51B, respectively, and is electrically connected to the pad part 321 (the power wiring part 32) via the connection members 51B.

The sixth rewiring electrode 126 is electrically connected to the fourth electrodes 121 (the drain electrodes) of the second semiconductor elements 12 via the internal wiring 127. The sixth rewiring electrode 126 is exposed from the resin member 129 at the reverse face 129*b*. The sixth rewiring electrode 126 is bonded to the pad part 331 (the power wiring part 33).

The internal wiring 127 electrically connects the second semiconductor elements 12, the resistor elements R2, the fourth rewiring electrodes 124, the fifth rewiring electrode 125, and the sixth rewiring electrode 126 to each other. The constituent material of the internal wiring 127 is not limited, but includes copper or a copper alloy, for example. As shown in FIGS. 12 to 15, the internal wiring 127 includes a plurality of fifth wiring parts 127*a*, a plurality of sixth wiring parts 127*b*, a seventh wiring part 127*c*, and an eighth wiring part 127*d*.

The fifth wiring parts 127*a* are electrically connected to the sixth electrodes 123 of the second semiconductor elements 12 and the fourth rewiring electrodes 124, respectively. In plan view, the shape of each fifth wiring part 127*a* may be appropriately changed according to the relative position and the size of each sixth electrode 123 and each fourth rewiring electrode 124.

The sixth wiring parts 127*b* are electrically connected to the sixth electrodes 123 of the second semiconductor elements 12 and the resistor elements R2, respectively. As shown in FIG. 13, each resistor element R2 is bonded to each of the two sixth wiring parts 127*b* so as to bridge the two sixth wiring parts 127*b*. Each sixth wiring part 127*b* is aligned with each fifth wiring part 127*a* in the thickness direction z. In plan view, the shape of each sixth wiring part 127*b* may be appropriately changed according to the relative position and the size of each sixth electrode 123.

The seventh wiring part 127*c* is electrically connected to the fifth electrodes 122 of the second semiconductor elements 12 and the fifth rewiring electrode 125. The seventh wiring part 127*c* is aligned with each fifth wiring part 127*a* and each sixth wiring part 127*b* in the thickness direction z. In plan view, the shape of the seventh wiring part 127*c* may be appropriately changed according to the relative position and the size of each fifth electrode 122 and the fifth rewiring electrode 125.

The eighth wiring part 127*d* is electrically connected to the fourth electrodes 121 of the second semiconductor elements 12 and the sixth rewiring electrode 126. In plan view, the shape of the eighth wiring part 127*d* may be appropriately changed according to the relative position and the size of each fourth electrode 121 and the sixth rewiring electrode 126.

As understood from FIGS. 12 to 15, the internal wiring 127 includes a portion electrically connecting the sixth electrode 123 to the fifth wiring part 127*a* or the sixth wiring part 127*b*, a portion electrically connecting the fifth wiring part 127*a* to the fourth rewiring electrode 124, a portion electrically connecting the fifth electrode 122 to the seventh wiring part 127*c*, a portion electrically connecting the seventh wiring part 127*c* to the fifth rewiring electrode 125, and a portion electrically connecting the fourth electrode 121 to the sixth rewiring electrode 126 in addition to the fifth wiring parts 127*a*, the sixth wiring parts 127*b*, the seventh wiring part 127*c*, and the eighth wiring part 127*d*.

The obverse metal layer 21 of the semiconductor device A2 does not include the signal wiring parts 38A, 38B compared to the obverse metal layer 21 of the semiconductor device A1.

In the semiconductor device A2, as with the semiconductor device A1, the third electrodes 113 of any two first semiconductor elements 11 adjacent in the first direction x are electrically connected to each other via the first conduction path J11 through the first conductor G1 and the second conduction path J12 through the second conductor G2. Each of the impedance relationship, the inductance value relationship, and the resistance value relationship between the first conduction path J11 and the second conduction path J12 is same as the above semiconductor device A1. However, the first conductor G1 and the second conductor G2 in the semiconductor device A2 differs from the first conductor G1 and the second conductor G2 in the semiconductor device A1.

The first conductor G1 of the semiconductor device A2 includes the first wiring parts 117*a*. In other words, the first conduction path J11 of the semiconductor device A2 extends through the first wiring part 117*a* in the electrical connection between the third electrodes 113. The first wiring part 117*a* is an example of a "coated wiring part". In the illustrated example, the first conduction path J11 extends from the third electrode 113 of one of the first semiconductor elements 11, through one of the first wiring parts 117*a* connected to the third electrode 113, one of the first rewiring electrodes 114 connected to the first wiring part 117*a*, one of the connection members 53A bonded to the first rewiring electrode 114, the signal wiring part 34A bonded to the connection member 53A, another of the connection members 53A bonded to the signal wiring part 34A, another the first rewiring electrodes 114 bonded to the connection member 53A, and another of the first wiring parts 117*a* connected to the first rewiring electrode 114, and finally to the third electrode 113 of another of the first semiconductor elements 11.

The second conductor G2 of the semiconductor device A2 includes the second wiring parts 117*b*. In other words, the second conduction path J12 of the semiconductor device A2 extends through the second wiring part 117*b* in the electrical connection between the third electrodes 113. In the illustrated example, each second conduction path J12 extends from the third electrode 113 of one of the first semiconductor elements 11, through one of the second wiring parts 117*b* connected to the third electrode 113, the resistor element R1 bonded to the second wiring part 117*b*, and another of the second wiring parts 117*b* bonded to the resistor element R1, and finally to the third electrode 113 of another of the first semiconductor elements 11.

In the semiconductor device A2, as with the semiconductor device A1, the sixth electrodes 123 of any two second semiconductor elements 12 adjacent in the first direction x are electrically connected to each other via the third conduction path J21 through the third conductor G3 and the fourth conduction path J22 through the fourth conductor G4. Each of the impedance relationship, the inductance value relationship, and the resistance value relationship between the third conduction path J21 and the fourth conduction path J22 is same as the above semiconductor device A1. However, the third conductor G3 and the fourth conductor G4 in the semiconductor device A2 differs from the third conductor G3 and fourth conductor G4 in the semiconductor device A1, respectively.

The third conductor G3 of the semiconductor device A2 includes the fifth wiring parts 127*a*. In other words, the third conduction path J21 of the semiconductor device A2 extends through the fifth wiring part 127*a* in the electrical connection between the sixth electrodes 123. In the illustrated example, the third conduction path J21 extends from the sixth electrode 123 of one of the second semiconductor elements 12, through one of the fifth wiring parts 127*a* connected to the sixth electrode 123, one of the fourth rewiring electrodes 124 connected to the fifth wiring part 127*a*, one of the connection members 53B bonded to the fourth rewiring electrode 124, the signal wiring part 34B bonded to the connection member 53B, another of the connection members 53B bonded to the signal wiring part 34B, another of the fourth rewiring electrodes 124 bonded to the connection member 53B, and another of the fifth wiring parts 127*a* connected to the fourth rewiring electrode 124, and finally to the third electrode 113 of another of the second semiconductor elements 12.

The fourth conductor G4 of the semiconductor device A2 includes the sixth wiring parts 127*b*. In other words, the fourth conduction path J22 of the semiconductor device A2 extends through the sixth wiring part 127*b* in the electrical connection between the sixth electrodes 123. In the illustrated example, each fourth conduction path J22 extends from the sixth electrode 123 of one of the second semiconductor elements 12, through one of the sixth wiring parts 127*b* connected to the sixth electrode 123, one of the resistor elements R2 bonded to the sixth wiring part 127*b*, and another of the sixth wiring parts 127*b* bonded to the resistor element R2, and finally to the sixth electrode 123 of another of the second semiconductor elements 12.

In the semiconductor device A2 according to the variation, as with the semiconductor device A1, the electrical connection between the third electrodes 113 includes the first conduction path J11 through the first conductor G1 and the second conduction path J12 through the second conductor G2. In the present variation, the semiconductor device A2 includes the first wiring part 117*a* as the first conductor G1 and the second wiring part 117*b* as the second conductor G2. The inductance value of the second conduction path J12 is smaller than the inductance value of the first conduction path J11, and the resistance value of the second conduction path J12 is larger than the resistance value of the first conduction path J11. Therefore, the semiconductor device A2 is, as with the semiconductor device A1, advantageous in suppressing the first oscillation phenomenon.

The semiconductor device A2 includes the first switching part 110. In the first switching part 110, the first semiconductor elements 11, the first conductor G1 (the first wiring part 117*a*) and the second conductor G2 (the second wiring part 117*b*) are covered by the resin member 119. Hence, the first semiconductor elements 11, the first conductor G1 for transmitting the first driving signal, and the second conductor G2 for suppressing the first oscillation phenomenon are built in a single package. Since the obverse metal layer 21 need not include the signal wiring part 38A, this configuration allows the size of the semiconductor device A2 in plan view to be reduced and the area of each power wiring part 31 to 33 to be increased.

In the semiconductor device A2 according to the variation, as with the semiconductor device A1, the electrical connection between the sixth electrodes 123 includes the third conduction path J21 through the third conductor G3 and the fourth conduction path J22 through the fourth conductor G4. In the present variation, the semiconductor device A2 includes the fifth wiring part 127*a* as the third conductor G3 and the sixth wiring part 127*b* as the fourth conductor G4. The inductance value of the fourth conduction path J22 is smaller than the inductance value of the third conduction path J21, and the resistance value of the fourth conduction path J22 is larger than the resistance value of the third conduction path J21. Therefore, the semiconductor device A2 is, as with the semiconductor device A1, advantageous in suppressing the second oscillation phenomenon.

The semiconductor device A2 includes the second switching part 120. In the second switching part 120, the second semiconductor elements 12, the third conductor G3 (the fifth wiring part 127*a*) and the fourth conductor G4 (the sixth wiring part 127*b*) are covered by the resin member 129. Hence, the second semiconductor elements 12, the third conductor G3 for transmitting the second driving signal, and the fourth conductor G4 for suppressing the second oscillation phenomenon are built in a single package. Since the obverse metal layer 21 need not include the signal wiring part 38B, this configuration allows the size of the semiconductor device A2 in plan view to be reduced and the area of each power wiring part 31 to 33 to be increased.

The semiconductor device A2 is in part similar to the semiconductor device A1 in configuration and provides the same advantages by such a part.

Figure 16:
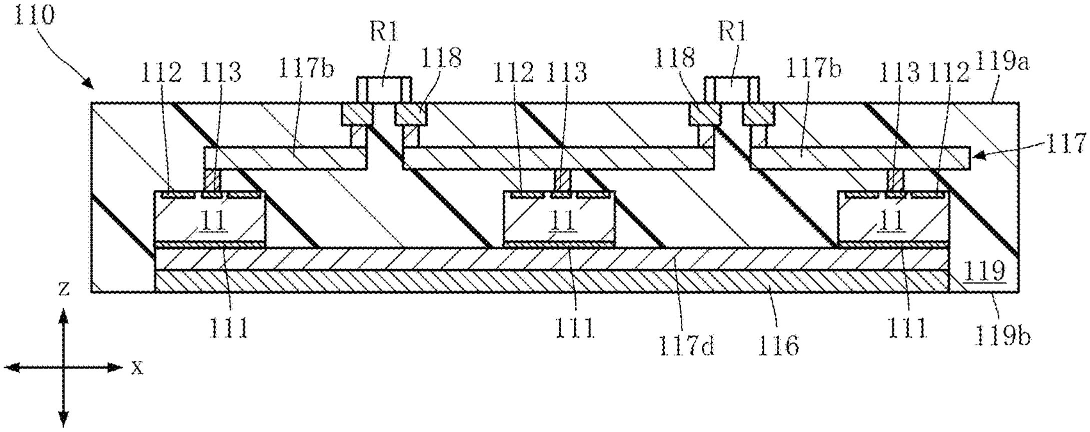
FIG. 16 is a cross-sectional view showing a first switching part according to a variation.

As the variation of the first embodiment, FIG. 9 shows an example that each resistor element R1 is covered by the resin member 119, but each resistor element R1 may be exposed from the resin member 119. FIG. 16 shows a first switching part 110 of the semiconductor device according to such a variation. The first switching part 110 shown in FIG. 16 further includes rewiring electrodes 118 that are exposed from the obverse face 119*a*. The rewiring electrodes 118 are electrically connected to the second wiring part 117*b*. The resistor element R1 is bonded to the two rewiring electrodes 118 so as to bridge the two rewiring electrodes 118, and the resistor element R1 is disposed on the obverse face 119*a*. As understood from the present variation, in the first switching part 110, each resistor element R1 may be covered by the resin member 119 or be exposed from the resin member 119. The same is applied to the second switching part 120, where each resistor element R2 may be covered by the resin member 129 or be exposed from the resin member 129.

Figure 17:
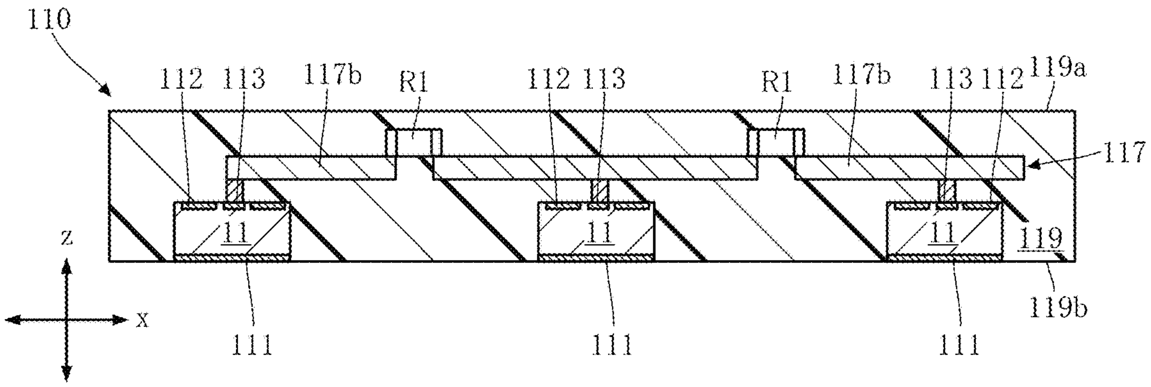
FIG. 17 is a cross-sectional view showing a first switching part according to a variation.

As the variation of the first embodiment, FIGS. 9 to 11 show an example that the first switching part 110 includes the fourth wiring part 117*d* and the third rewiring electrode 116. Unlike this example, the first switching part 110 may not include the fourth wiring part 117*d* and the third rewiring electrode 116, as shown in FIG. 17, and the first electrode 111 of each first semiconductor element 11 may be exposed from the reverse face 119*b* of the resin member 119. The same is applied to the second switching part 120, where the second switching part 120 may not include the eighth wiring part 127*d* and the sixth rewiring electrode 126 and the fourth electrode 121 of each second semiconductor element 12 may be exposed from the reverse face 129*b* of the resin member 129.

Figure 8:
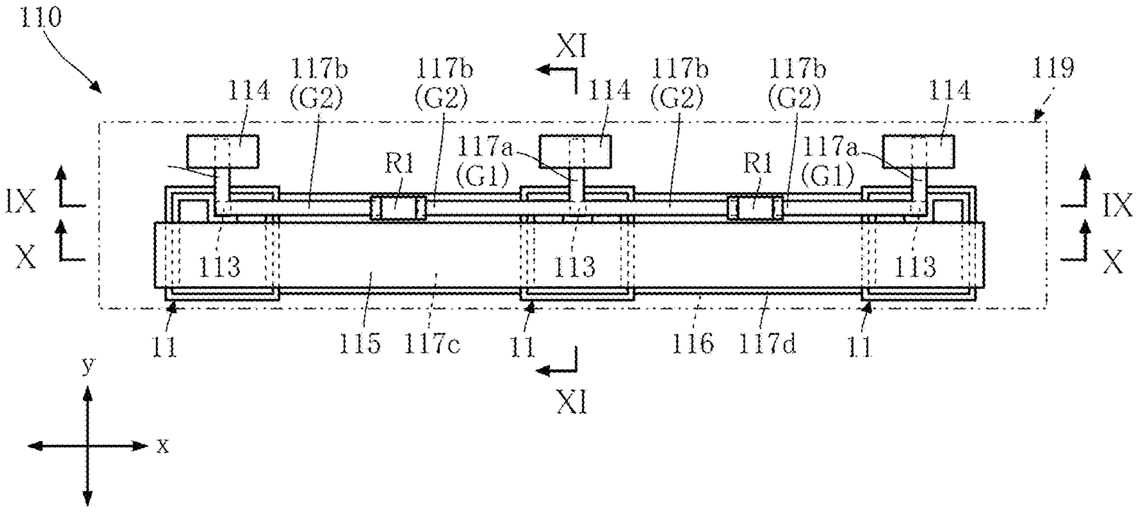
FIG. 8 is a plan view showing a first switching part in the semiconductor device shown in FIG. 7.
Figure 18:
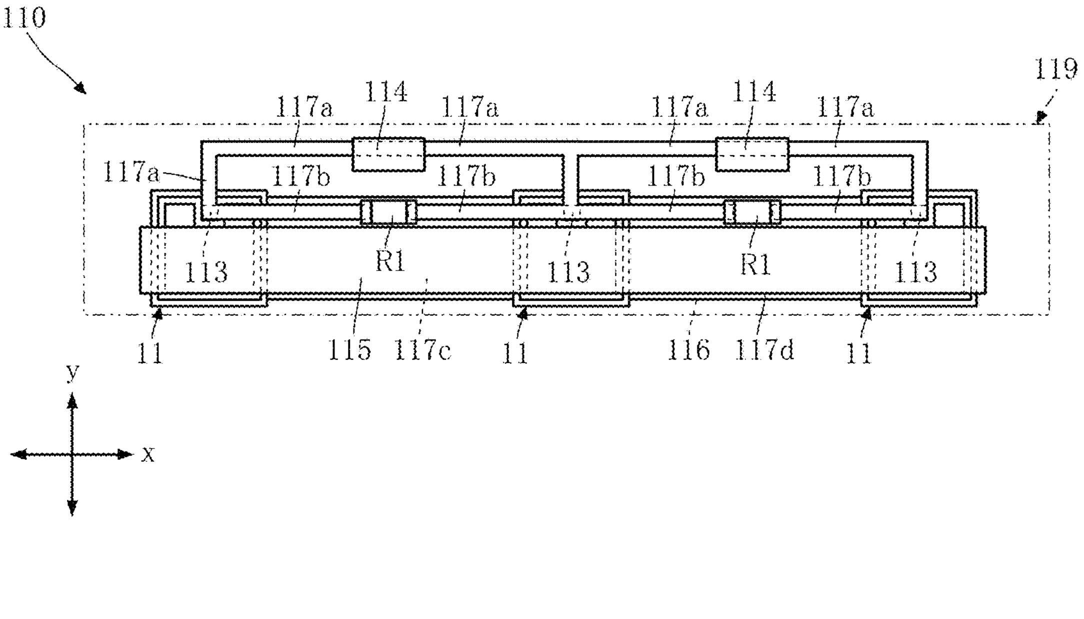
FIG. 18 is a cross-sectional view showing a first switching part according to a variation.

As the variation of the first embodiment, FIG. 8 shows an example that the first switching part 110 includes the first rewiring electrodes 114 disposed relative to the first semiconductor elements 11. Unlike this configuration, the first switching part 110 may include a first rewiring electrode 114 in common relative to the first semiconductor elements 11 as shown in FIG. 18. Note that because the connection members 53A are not interposed in the first conduction path J11 in the example of FIG. 18, the inductance value of the first conduction path J11 in the example of FIG. 18 tends to be smaller than that in the example of FIG. 8. Hence, when the configuration shown in FIG. 18 does not secure a sufficient inductance value in the first conduction path J11, the inductance value may be improved by the shape of the first wiring part 117*a* such as bending the first wiring part 117*a* into a wavy shape. Although the example shown in FIG. 18 includes one first rewiring electrode 114 for the two first semiconductor elements 11 adjacent in the first direction x, one first rewiring electrode 114 may be provided for all first semiconductor electrodes 11. The same is applied to the second switching part 120, and the second switching part 120 may include a fourth rewiring electrode 124 in common relative to the second semiconductor elements 12.

FIGS. 19 to 24 show a semiconductor device B1 according to the second embodiment. As shown in the figures, the semiconductor device B1 includes a plurality of first semiconductor elements 11, a plurality of second semiconductor elements 12, a supporting substrate 2, a plurality of terminals, a plurality of connection members, and a sealing member 6. The plurality of terminals include power terminals 41 to 43 and signal terminals 44A, 44B, 45A, 45B, 46, 49. The plurality of connection members include connection members 52A, 52B, 53A, 53B, 54A, 54B, 56, and connection members 58A, 58B.

In the semiconductor device B1, the supporting substrate 2 includes an insulative substrate 20, an obverse metal layer 21, a reverse metal layer 22, paired conductive substrates 23A, 23B, and paired signal substrates 24A, 24B. The supporting substrate 2 is configured such that the paired conductive substrates 23A, 23B and the paired signal substrates 24A, 24B are disposed on a DBC substrate (or a DBA substrate). The DBC substrate (or the DBA substrate) may be formed by the insulative substrate 20, obverse metal layers 21A, 21B, and a reverse metal layer 22 like the semiconductor device A1.

Figure 24:
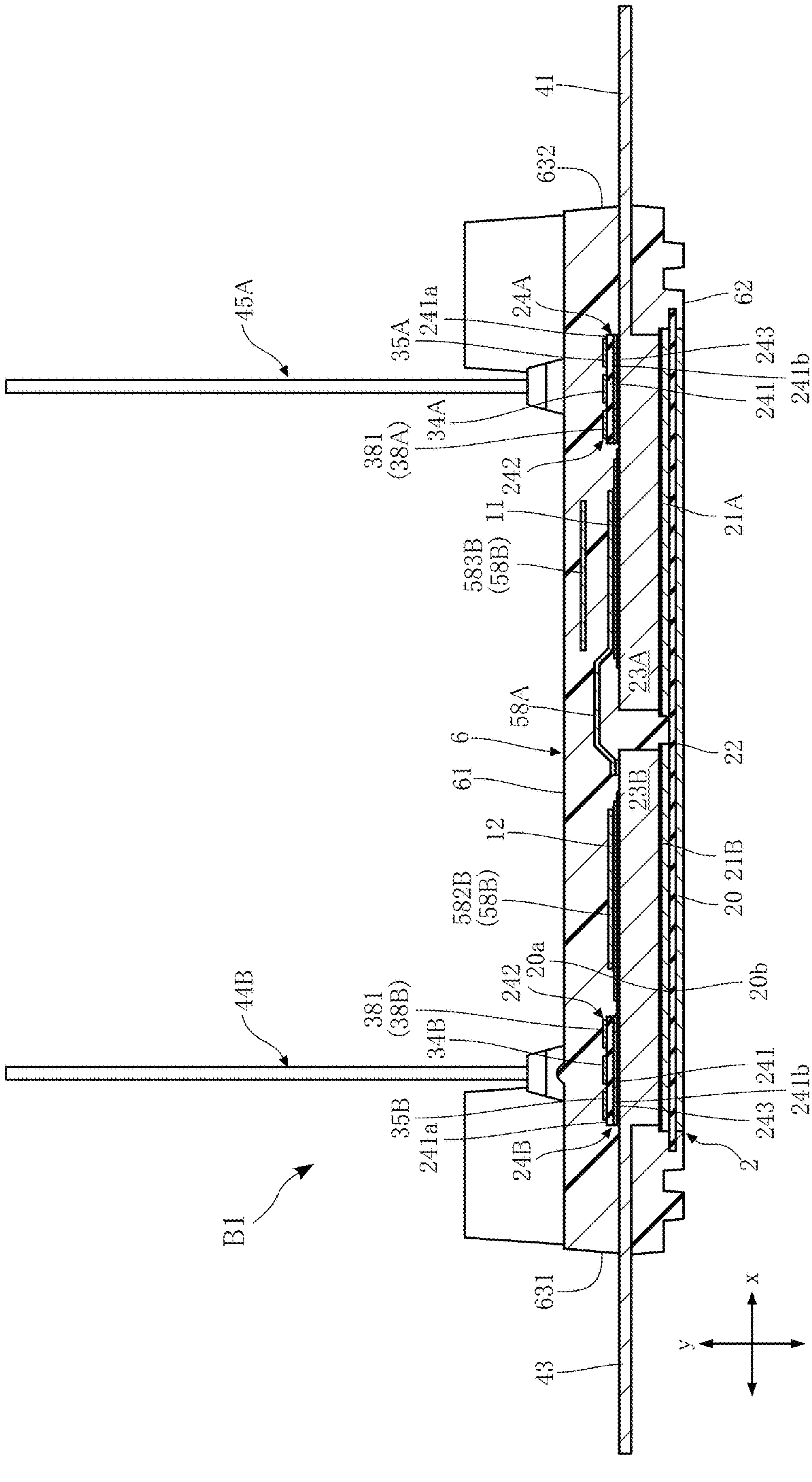
FIG. 24 is a cross-sectional view of FIG. 20 taken along a line XXIV-XXIV.

As shown in FIG. 24, the paired obverse metal layers 21A, 21B are formed on the substrate obverse face 20*a* of the insulative substrate 20. The paired obverse metal layers 21A, 21B are spaced apart from each other in the first direction x. The conductive substrate 23A is bonded to the obverse metal layer 21A, and the conductive substrate 23B is bonded to the obverse metal layer 21B. Each obverse metal layer 21A, 21B is rectangular in plan view, for example.

Each conductive substrate 23A, 23B is composed of metal. The metal includes copper, a copper alloy, aluminum, or an aluminum alloy.

Figure 21:
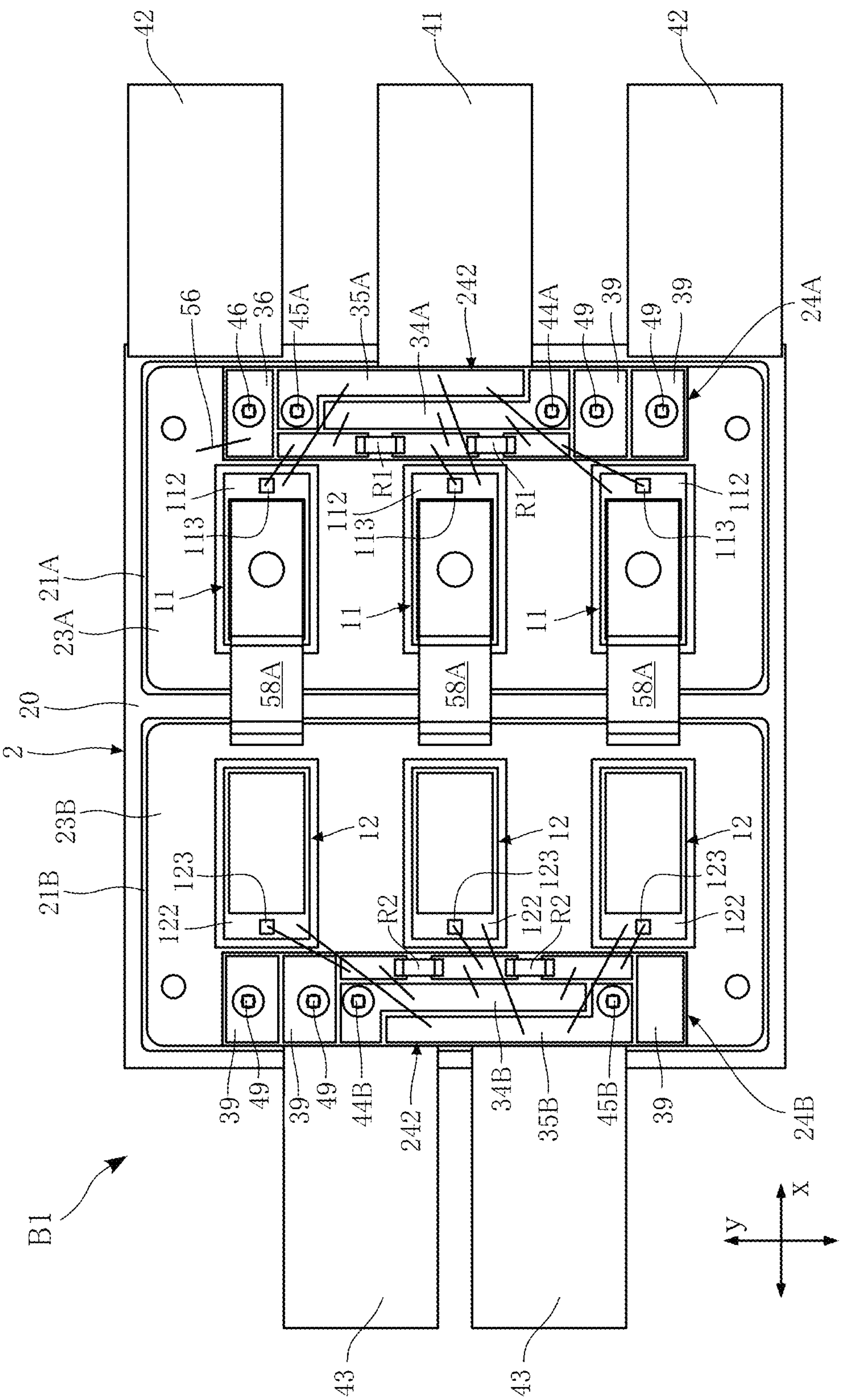
FIG. 21 is a plan view shown in FIG. 20 from which a sealing member and a part of connection members are omitted.

As shown in FIG. 24, the conductive substrate 23A is disposed on the obverse metal layer 21A. As shown in FIG. 24, the first semiconductor elements 11 are mounted on the conductive substrate 23A. As shown in FIG. 21, the first semiconductor elements 11 of the semiconductor device B1 are arranged on the conductive substrate 23A along the second direction y. The conductive substrate 23A faces the first element reverse face 11*b* of each first semiconductor element 11. The first electrode 111 (the drain electrode) of each first semiconductor element 11 is electrically bonded to the conductive substrate 23A. The first electrodes 111 of the first semiconductor elements 11 are electrically connected to each other via the conductive substrate 23A.

As shown in FIG. 24, the conductive substrate 23B is disposed on the obverse metal layer 21B. As shown in FIG. 24, the second semiconductor elements 12 are mounted on the conductive substrate 23B. As shown in FIG. 21, the second semiconductor elements 12 of the semiconductor device B1 are arranged on the conductive substrate 23B along the second direction y. The conductive substrate 23B faces the second element reverse face 12*b* of each second semiconductor element 12. The fourth electrode 121 (the drain electrode) of each second semiconductor element 12 is electrically bonded to the conductive substrate 23B. The fourth electrodes 121 of the second semiconductor elements 12 are electrically connected to each other via the conductive substrate 23B.

The paired signal substrates 24A, 24B support the signal terminals 44A, 44B, 45A, 45B, 46, 49. As shown in FIG. 24, the paired signal substrates 24A, 24B are interposed between the paired conductive substrates 23A, 23B and the signal terminals 44A, 44B, 45A, 45B, 46, 49 in the thickness direction z. Each of the signal substrates 24A, 24B is provided as a DBC substrate, for example. Unlike this configuration, each of the signal substrates 24A, 24B may be provided as a DBA substrate, for example. Each of the signal substrates 24A, 24B may be provided as a printed substrate instead of a DBC substrate or a DBA substrate.

As shown in FIG. 24, the signal substrate 24A is disposed on the conductive substrate 23A. The signal substrate 24A supports the signal terminals 44A, 45A, 46, 49. The signal substrate 24A is bonded to the conductive substrate 23A via a bonding material. The bonding material may be conductive or insulative, e.g., a solder. As shown in FIG. 24, the signal substrate 24B is disposed on the conductive substrate 23B. The signal substrate 24B supports the signal terminals 44B, 45B, 49. The signal substrate 24B is bonded to the conductive substrate 23B via a bonding material. The bonding material may be conductive or insulative, e.g., a solder.

As shown in FIG. 24, each of the signal substrates 24A, 24B includes an insulative substrate 241, an obverse metal layer 242, and a reverse metal layer 243. Unless otherwise stated, the insulative substrate 241, the obverse metal layer 242, and the reverse metal layer 243 is in common between the paired signal substrates 24A and 24B.

The insulative substrate 241 contains ceramic, for example. Such ceramic includes AlN, SiN, and $Al_2O_3$. The insulative substrate 241 is rectangular in plan view, for example. The insulative substrate 241, as shown in FIG. 24, includes an obverse face 241*a* and a reverse face 241*b*. The obverse face 241*a* and the reverse face 241*b* are spaced apart from each other in the thickness direction z. The obverse face 241*a* faces upside of the thickness direction z, and the reverse face 241*b* faces downside of the thickness direction z. The obverse face 241*a* and the reverse face 241*b* are flat (or generally flat).

As shown in FIG. 24, the reverse metal layer 243 is formed on the reverse face 241*b* of the insulative substrate 241. The reverse metal layer 243 of the signal substrate 24A is bonded to the conductive substrate 23A via a bonding material. The reverse metal layer 243 of the signal substrate 24B is bonded to the conductive substrate 23B via a bonding material. The constituent material of the reverse metal layer 243 includes copper or a copper alloy. The constituent material includes aluminum or an aluminum ally instead of copper and a copper alloy.

As shown in FIG. 24, the obverse metal layer 242 is formed on the obverse face 241*a* of the insulative substrate 241. Each of the signal terminals 44A, 44B, 45A, 45B, 46, 49 is erected on obverse metal layer 242 of the signal substrates 24A or 24B. The constituent material of the obverse metal layer 242 includes copper or a copper alloy. The constituent material includes aluminum or an aluminum ally instead of copper and a copper alloy.

Figure 22:
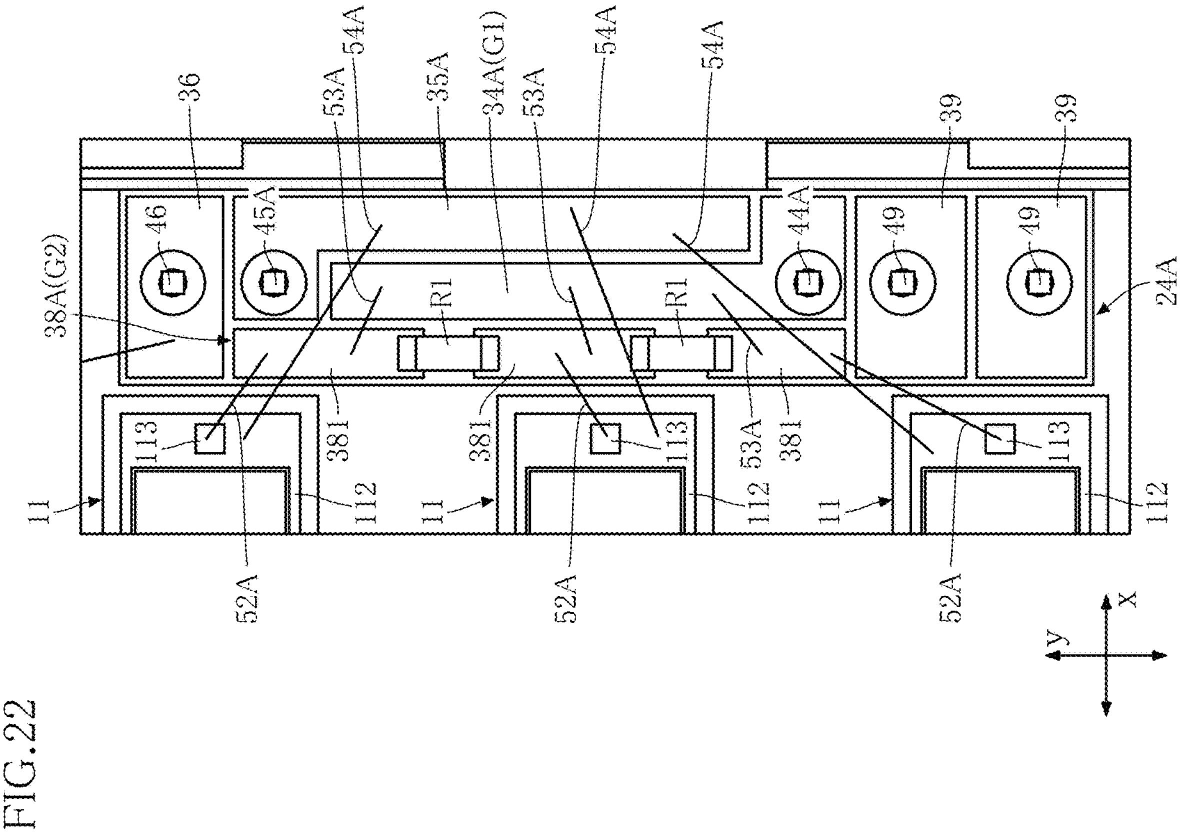
FIG. 22 is a plan view shown in FIG. 21 in which a relevant part is enlarged.

As shown in FIGS. 21 and 22, the obverse metal layer 242 of the signal substrate 24A includes a plurality of signal wiring parts 34A, 35A, 36, 38A, 39. As shown in FIGS. 21 and 22, the obverse metal layer 242 of the signal substrate 24B includes a plurality of signal wiring parts 34B, 35B, 38B, 39.

The signal wiring part 36 is bonded by the connection member 56 and is electrically connected to the conductive substrate 23A via the connection member 56. The conductive substrate 23A is electrically connected to the first electrodes 111 (the drain electrodes) of the first semiconductor elements 11, and hence, the signal wiring part 36 is electrically connected to the first electrodes 111 (the drain electrodes) of the first semiconductor elements 11.

The power terminal 41 is integral with the conductive substrate 23A. Unlike this configuration, the power terminal 41 may be bonded to the conductive substrate 23A. In the thickness direction z, the dimension of the power terminal 41 is smaller than that of the conductive substrate 23A. The power terminal 41 extends from the conductive substrate 23A to one side in the first direction x. The one side in the first direction x corresponds to the side opposite to the conductive substrate 23B with respect to the conductive substrate 23A. The power terminal 41 protrudes from the resin side face 632. The power terminal 41 is electrically connected to the first electrodes 111 (the drain electrodes) of the first semiconductor elements 11 via the conductive substrate 23A.

Each of the two power terminals 42 is spaced apart from the conductive substrate 23A. The two power terminals 42 are located at the opposite side in the second direction y, respectively, with the power terminal 41 sandwiched therebetween. The two power terminals 42 are disposed at one side in the first direction x with respect to the conductive substrate 23A. The one side in the first direction x corresponds to the side where the power terminal 41 is located with respect to the conductive substrate 23A. The two power terminals 42 protrude from the resin side face 632. The connection member 58B is bonded to the two power terminals 42. Each of the two power terminals 42 is electrically connected to the fifth electrodes 122 (the source electrodes) of the second semiconductor elements 12 via the connection member 58B.

Each of the two power terminals 43 is integral with the conductive substrate 23B. Unlike this configuration, each of the two power terminals 43 may be bonded to the conductive substrate 23B. In the thickness direction z, the dimension of each power terminal 43 is smaller than that of the conductive substrate 23B. Each of the two power terminals 43 extends from the conductive substrate 23B to the other side in the first direction x. The other side in the first direction x is a side opposite to the conductive substrate 23A with respect to the conductive substrate 23B. The two power terminals 43 protrude from the resin side face 631. Each of the two power terminals 43 is electrically connected to the second electrodes 112 (the source electrodes) of the first semiconductor elements 11 and the fourth electrodes 121 (the drain electrodes) of the second semiconductor elements 12 via the conductive substrate 23B.

Figure 19:
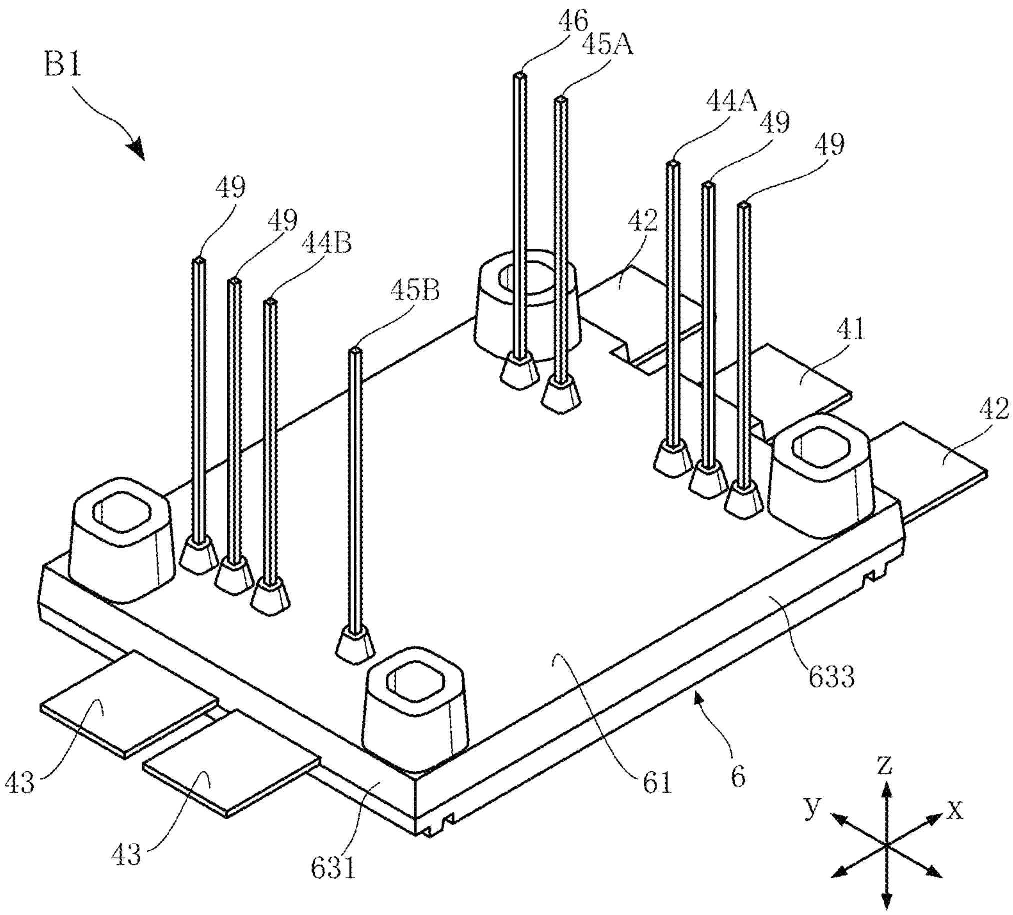
FIG. 19 is a perspective view of a semiconductor device according to a second embodiment.

As shown in FIG. 19, each of the signal terminals 44A, 44B, 45A, 45B, 46, 49 protrudes from the resin obverse face 61. Each of the signal terminals 44A, 44B, 45A, 45B, 46, 49 is a press-fit terminal, for example. Each of the signal terminals 44A, 44B, 45A, 45B, 46, 49 includes a holder and a metal pin. The holder is a cylindrical component made of conductive material. The holder is bonded to the obverse metal layer 242 of the signal substrate 24A or the signal substrate 24B. The metal pin is press-fitted into the holder and extends in the thickness direction z.

The signal terminal 46 is erected on the signal wiring part 36. The signal terminal 46 is electrically connected to the signal wiring part 36. The signal wiring part 36 is electrically connected to the first electrodes 111 of the first semiconductor elements 11, and hence the signal terminal 46 is electrically connected to the first electrodes 111 of the first semiconductor elements 11.

The signal terminals 49 are erected on the signal wiring parts 39, respectively. The signal terminals 49 are not electrically connected to either of the first semiconductor elements 11 and the second semiconductor elements 12. Each of the signal terminals 49 is a non-connect terminal.

The connection member 56 is, for example, a bonding wire. The constituent material of the bonding wire may be gold, copper, or aluminum. As shown in FIG. 21, the connection member 56 is bonded to the signal wiring part 36 and the conductive substrate 23A to electrically connect them.

The connection members 58A, 58B together with the supporting substrate 2 provide a path for a main circuit current that is switched by the first semiconductor elements 11 and the second semiconductor elements 12. Each of the connection members 58A, 58B is composed of a metal plate component. The metal includes copper or a copper alloy. Each of the connection members 58A, 58B is partially bent.

Each of the connection members 58A is bonded to the second electrode 112 (the source electrode) of each first semiconductor element 11 and the conductive substrate 23B, thereby electrically connecting the second electrode 112 of each first semiconductor element 11 and the conductive substrate 23B. Each connection member 58A and the second electrode 112 of each first semiconductor element 11 are bonded by a conductive bonding material, and each connection member 58A and the conductive substrate 23B are bonded by a conductive bonding material (e.g., a solder, a metal paste, or sintered metal etc.). As shown in FIG. 21, in plan view, each connection member 58A has a band-like shape extending in the first direction x.

In the illustrated example, the number of connection members 58A is three, which corresponds to the number of first semiconductor elements 11. Unlike this configuration, regardless the number of first semiconductor elements 11, one connecting member 58A may, for example, be used for the first semiconductor elements 11.

Figure 20:
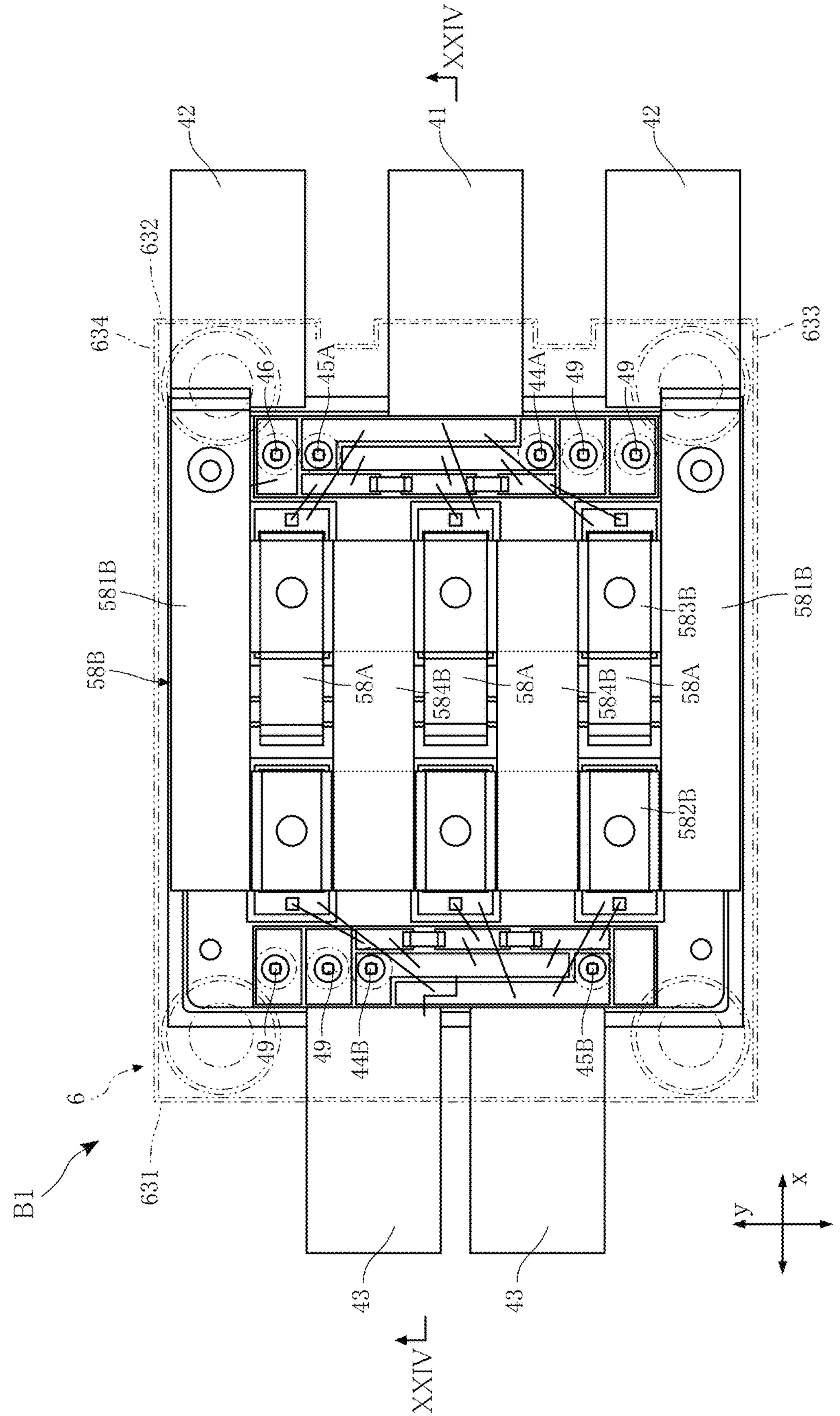
FIG. 20 is a plan view of a semiconductor device according to a second embodiment in which a sealing member is indicated by imaginary lines.

The connection member 58B electrically connects the fifth electrode 122 (the source electrode) of each second semiconductor element 12 and each power terminal 42. As shown in FIG. 20, the connection member 58B includes paired first wiring parts 581B, second wiring parts 582B, third wiring parts 583B, and fourth wiring parts 584B.

One of the paired first wiring parts 581B is connected to the one of the paired power terminals 42, while the other of the paired first wiring parts 581B is connected to the other of the paired power terminals 42. The first wiring parts 581B and the power terminals 42 are bonded by a conductive bonding material, respectively (e.g., a solder, a metal paste, or sintered metal etc.). As shown in FIG. 20, in plan view, each first wiring part 581B has a band-like shape extending in the first direction x. The paired first wiring parts 581B are spaced apart from each other in the first direction y and parallel (generally parallel).

As shown in FIG. 20, the second wiring part 582B is connected to both paired first wiring parts 581B. In plan view, the second wiring part 582B has a band-like shape extending in the second direction y. As understood from FIGS. 20 to 24, the second wiring part 582B overlaps with the second semiconductor elements 12 in plan view. As shown in FIG. 24, the second wiring part 582B is connected to the second semiconductor elements 12 (the fifth electrode 122). The second wiring part 582B has portions that each overlap with each second semiconductor element 12 in plan view and each protrude downward in the thickness direction z than the other portions. In the second wiring part 582B, each portion protruding downward in the thickness direction z is bonded to the fifth electrode 122 of each second semiconductor element 12. The second wiring part 582B and each fifth electrode 122 are bonded by a conductive bonding material (e.g., a solder, a metal paste, or sintered metal etc.).

As shown in FIG. 20, the third wiring part 583B is connected to both paired first wiring parts 581B. In plan view, the third wiring part 583B has a band-like shape extending in the second direction y. The third wiring part 583B is spaced apart from the second wiring part 582B in the first direction x. The third wiring part 583B is arranged parallel (generally parallel) to the second wiring part 582B. As understood from FIGS. 20 to 24, the third wiring part 583B overlaps with the first semiconductor elements 11 in plan view. the third wiring part 583B has portions that each overlap with each first semiconductor element 11 in plan view and each protrude upward in the thickness direction z than the other portions. Each portion protruding upward in the thickness direction z provides an area to bond each connection member 58A onto each first semiconductor element 11, which may prevent the third wiring part 583B from contacting with the connection member 58A.

As shown in FIG. 20, each fourth wiring parts 584B are connected to the second wiring part 582B and the third wiring part 583B. In plan view, each fourth wiring part 584B has a band-like shape extending in the first direction x. The fourth wiring parts 584B are spaced apart from each other in the second direction y and are arranged parallel (generally parallel) in plan view. Each fourth wiring part 584B has an end in the first direction x that connects to the portion of the third wiring part 583B between two first semiconductor elements 11 adjacent in the second direction y in plan view, while also having another end in the first direction x that connects to the portion of the second wiring part 582B between two second semiconductor elements 12 adjacent in the second direction y in plan view.

Figure 23:
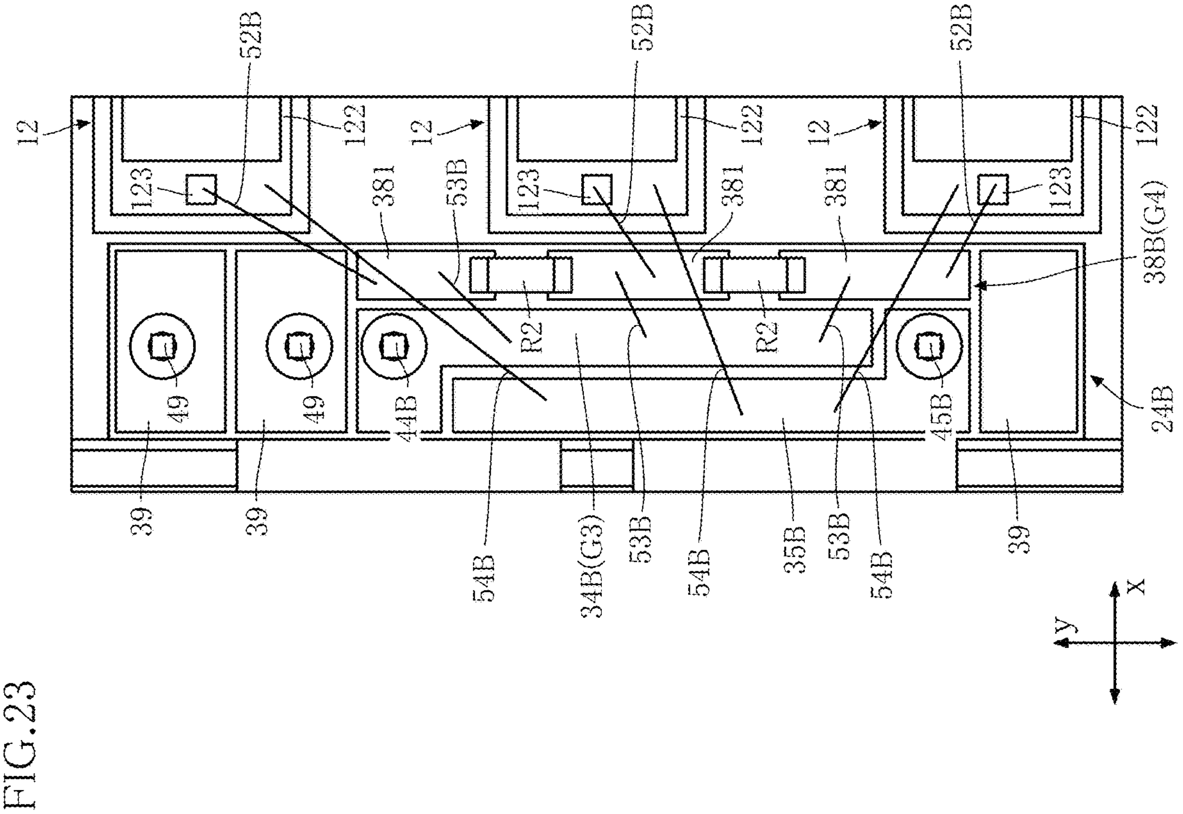
FIG. 23 is a plan view shown in FIG. 21 in which a relevant part is enlarged.

As shown in FIG. 22, the semiconductor device B1 includes the first conduction path J11 and the second conduction path J12, as with the semiconductor device A1. Therefore, the semiconductor device B1 is advantageous in suppressing the first oscillation phenomenon, as with the semiconductor device A1. Further, as shown in FIG. 23, the semiconductor device B1 includes the third conduction path J21 and the fourth conduction path J22, as with the semiconductor device A1. Therefore, the semiconductor device B1 is advantageous in suppressing the second oscillation phenomenon, as with the semiconductor device A1. The semiconductor device B1 is in part similar to the semiconductor device A1 in configuration and provides the same advantages by such a part.

Figure 25:
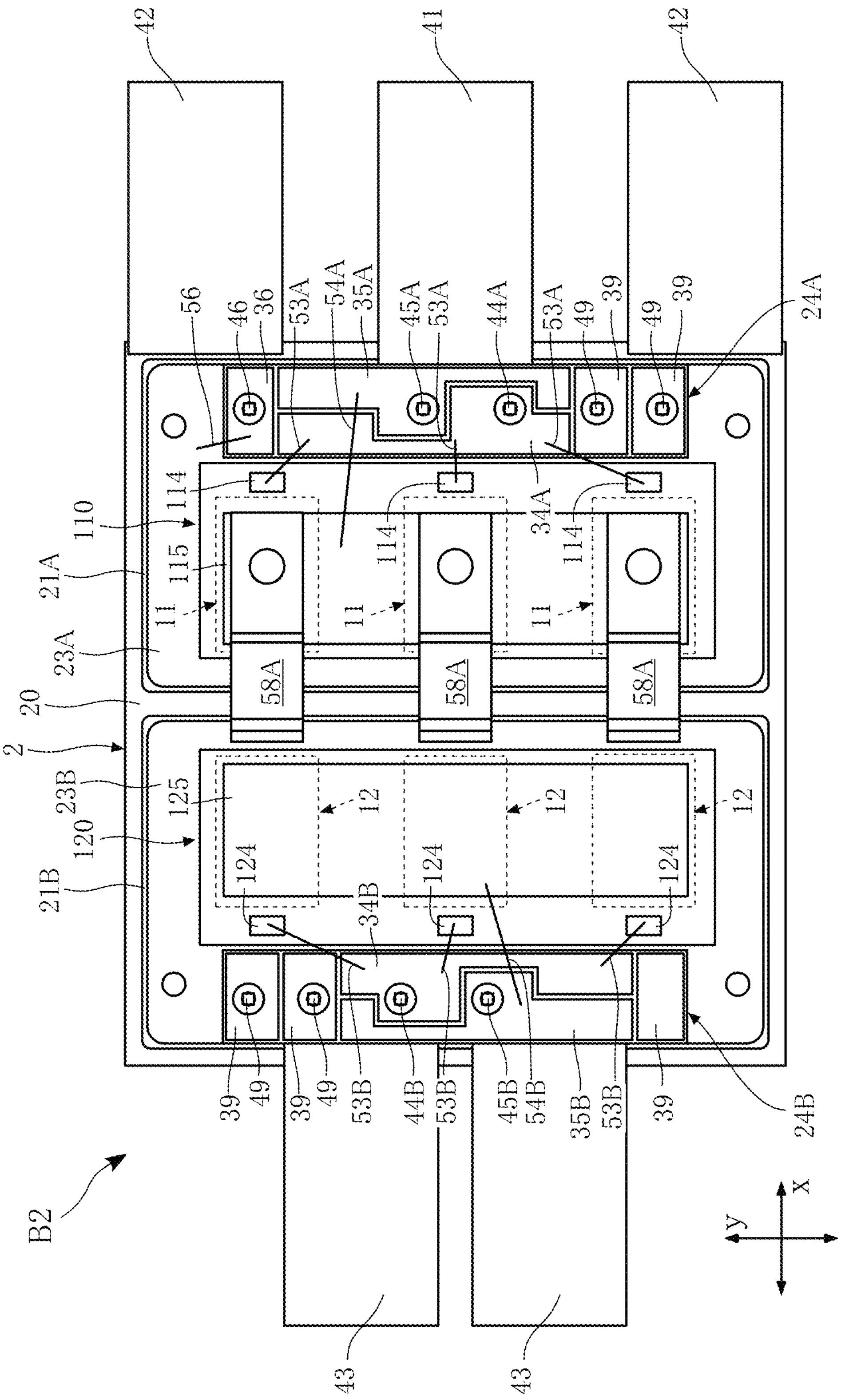
FIG. 25 is a plan view of a semiconductor device according to a variation of a second embodiment, which corresponds to the plan view of FIG. 21.
Figure 26:
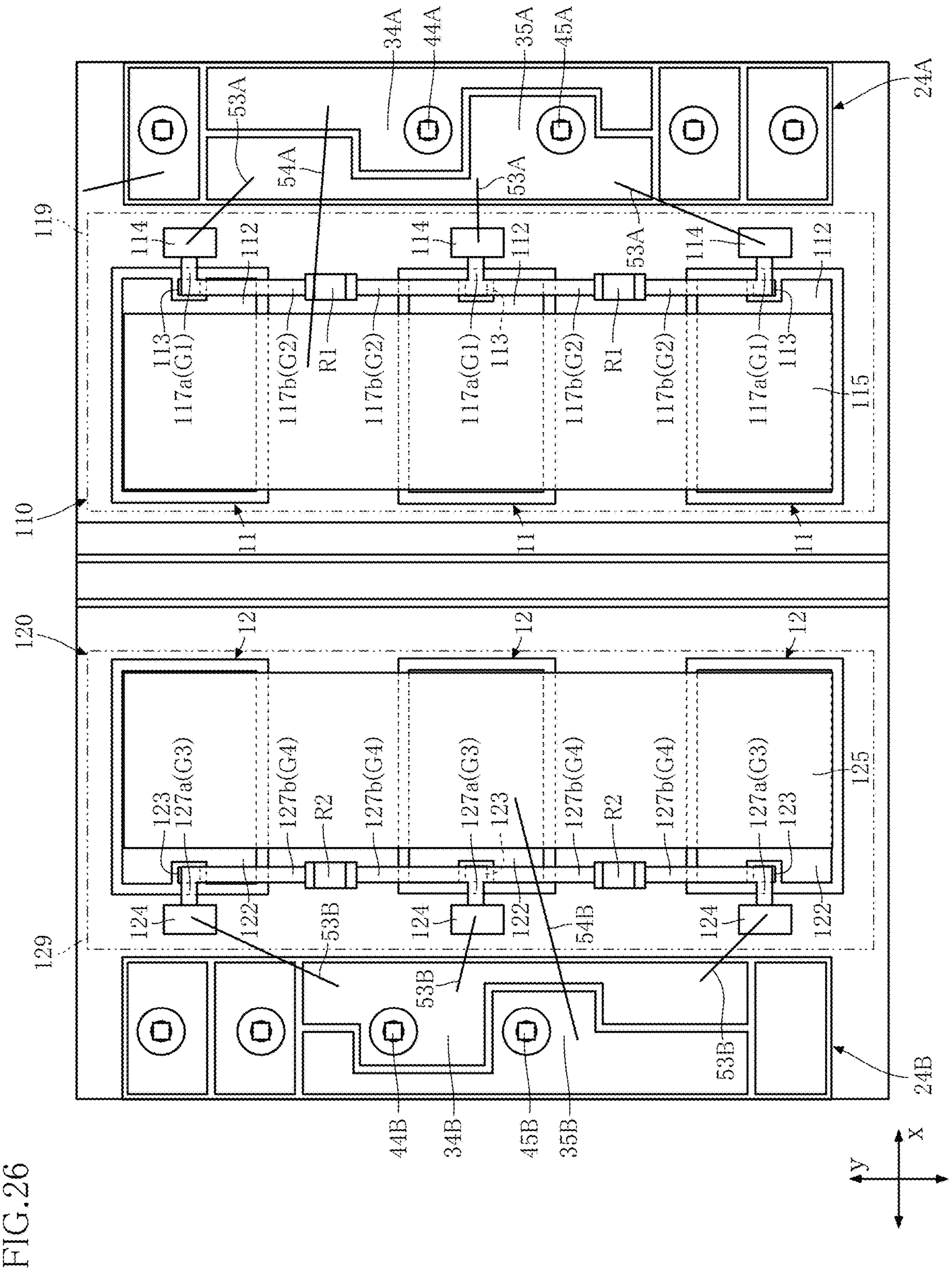
FIG. 26 is a plan view shown in FIG. 25 in which a relevant part is enlarged and a part of connection members is omitted.

FIGS. 25 and 26 show a semiconductor device B2 according to a variation of the second embodiment. As shown in the figures, the semiconductor device B2 includes a first switching part 110 and a second switching part 120, as with the semiconductor device A2. The other configurations are same as those of the semiconductor device B1. Note that the signal substrate 24A does not include the signal wiring part 38A, and the signal substrate 24B does not include the signal wiring part 38B.

As shown in FIG. 26, the semiconductor device B2 includes the first conduction path J11 and the second conduction path J12, as with the semiconductor device A2. Therefore, the semiconductor device B2 is advantageous in suppressing the first oscillation phenomenon, as with the semiconductor device A2. Further, as shown in FIG. 26, the semiconductor device B2 includes the third conduction path J21 and the fourth conduction path J22, as with the semiconductor device A1. Therefore, the semiconductor device B2 is advantageous in suppressing the second oscillation phenomenon, as with the semiconductor device A2. The semiconductor device B2 is in part similar to the semiconductor devices A2 and B1 in configuration and provides the same advantages by such a part.

FIGS. 27 to 33 show a semiconductor device C1 according to a third embodiment. As shown in the figures, the semiconductor device C1 includes a plurality of first semiconductor elements 11, a plurality of second semiconductor elements 12, a supporting substrate 2, a plurality of terminals, a plurality of connection members, a heat dissipation plate 70, a case 71, and a resin member 75. The plurality of terminals include power terminals 41 to 43 and signal terminals 44A, 44B, 45A, 45B, 46, 47. The plurality of connection members include connection members 51A, 51B, 52A, 52B, 53A, 53B, 54A, 54B, 551A, 551B, 552A, 552B, 56, 57.

Each of the first embodiment and the second embodiment is an example of a mold-type module in which the first semiconductor elements 11 and the second semiconductor elements 12*a* are covered by the sealing member 6. On the other hand, the semiconductor device C1 is a case-type module in which the first semiconductor elements 11 and the second semiconductor elements 12 are accommodated in the case 71.

As understood from FIGS. 27 to 33, the case 71 has a cuboid-like external shape, for example. The case 71 is made of synthetic resin with electrical insulation and high heat resistance such as PPS (polyphenylene sulfide). In plan view, the case 71 is rectangular and has approximately the same size as the heat dissipation plate 70. The case 71 includes a frame part 72, a top plate 73, and a plurality of terminal pedestals 741-744.

Figure 29:
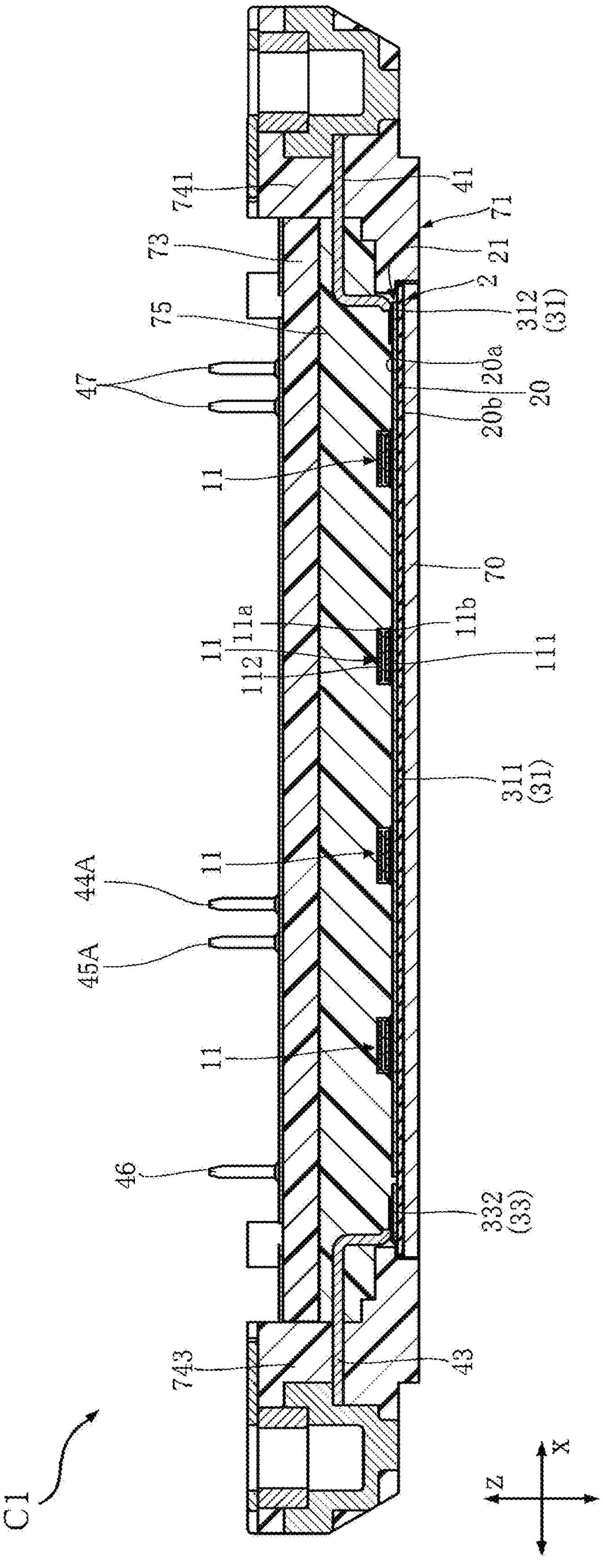
FIG. 29 is a cross-sectional view of FIG. 28 taken along a line XXIX-XXIX.
Figure 30:
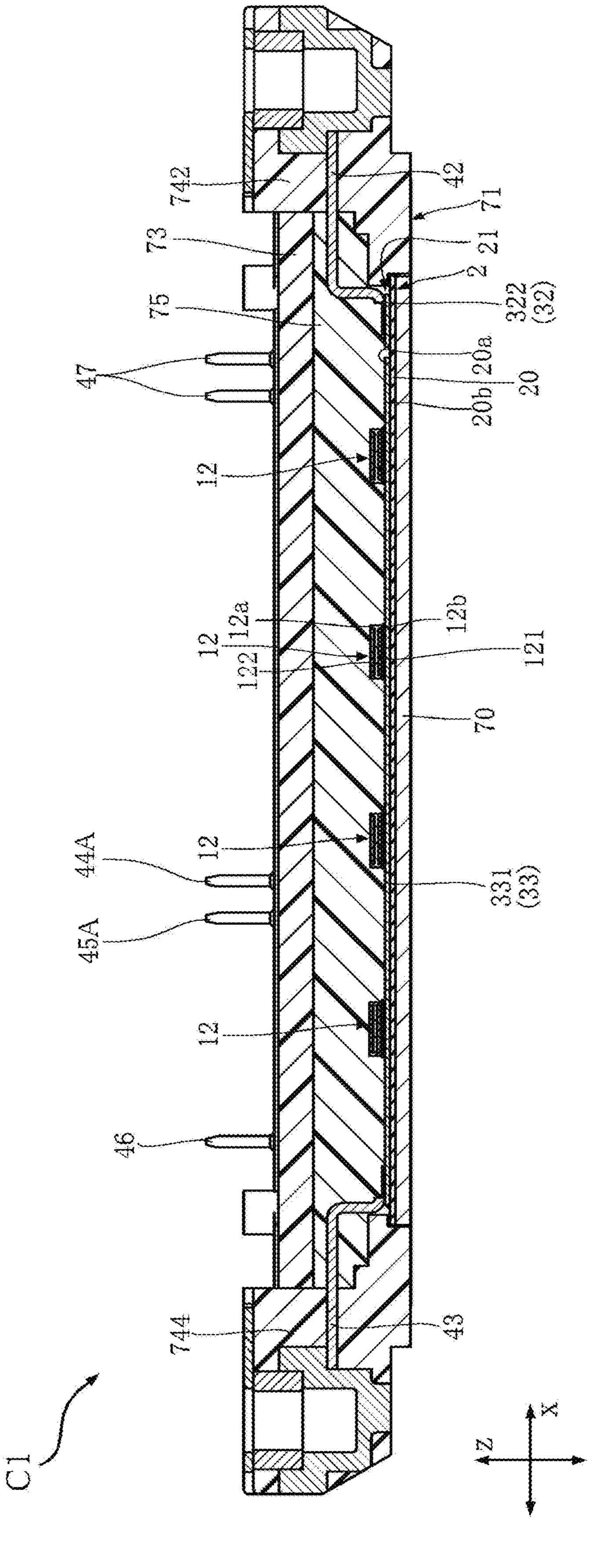
FIG. 30 is a cross-sectional view of FIG. 28 taken along a line XXX-XXX.
Figure 31:
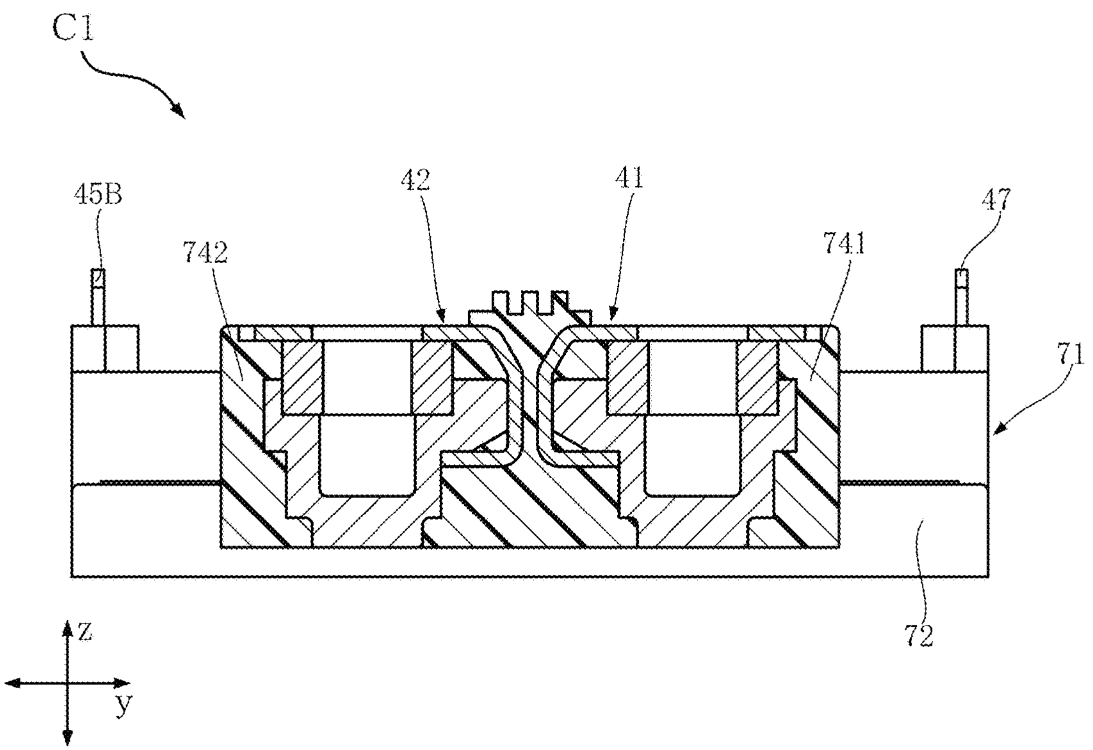
FIG. 31 is a cross-sectional view of FIG. 28 taken along a line XXXI-XXXI.
Figure 32:
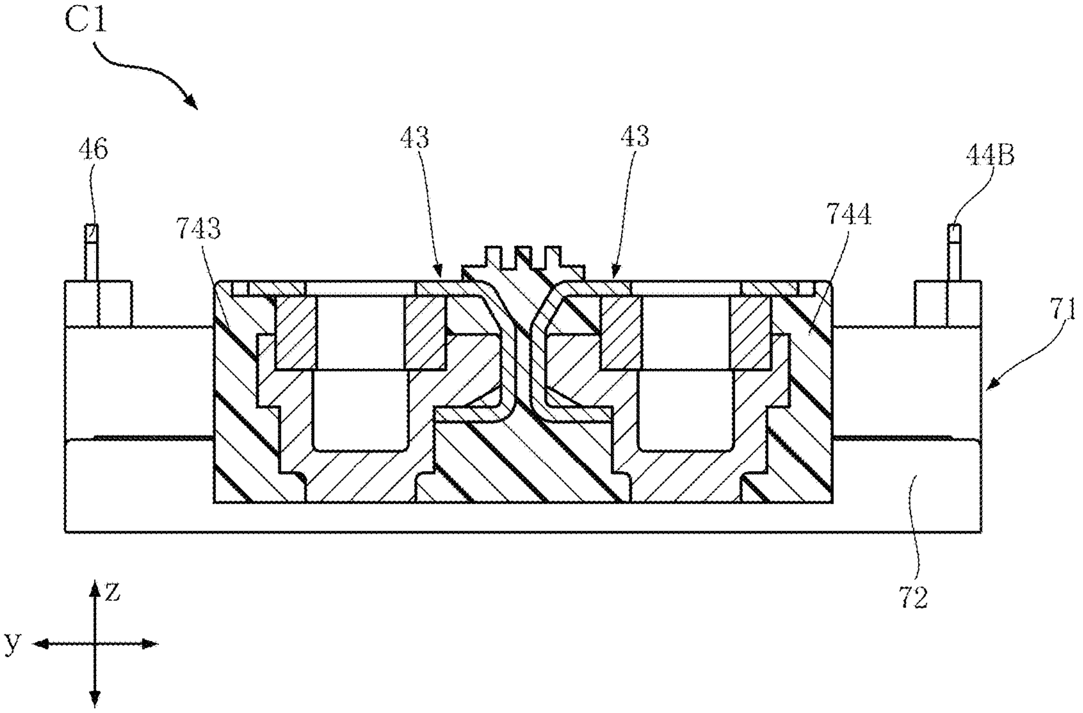
FIG. 32 a cross-sectional view of FIG. 28 taken along a line XXXII-XXXII.
Figure 33:
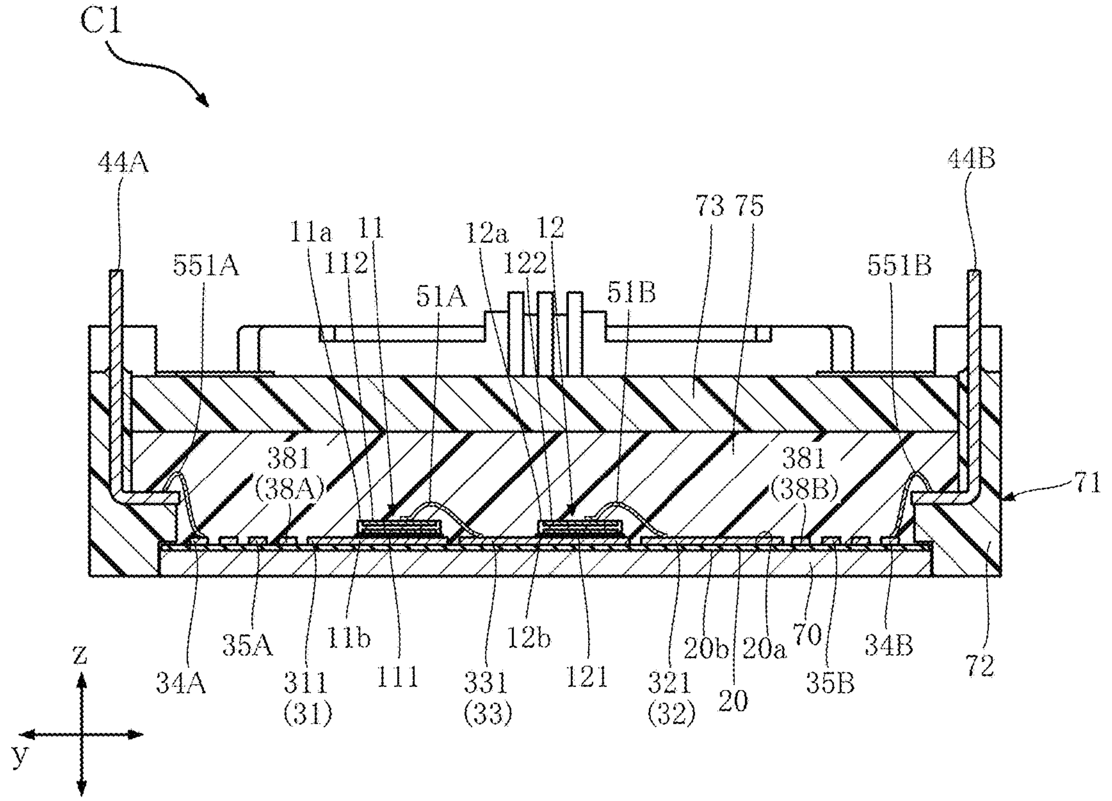
FIG. 33 a cross-sectional view of FIG. 28 taken along a line XXXIII-XXXIII.

The frame part 72 is secured on the surface of the heat dissipation plate 70 at the upside of the thickness direction z. The top plate 73 is secured to the frame part 72. As shown in FIGS. 27, 29, 30 and 33, the top plate 73 closes an opening of the frame part 72 at the upside of the thickness direction z. As shown in FIGS. 29, 30 and 33, the top plate 73 faces the heat dissipation plate 70, which closes the downside of the frame part 72 in the thickness direction z. The top plate 73, the heat dissipation plate 70, and the frame part 72 define a circuit housing space (a space that houses the first semiconductor elements 11, the second semiconductor elements 12 etc.) in the case 71. The circuit housing space may be referred to as the inside of the case 71.

Figure 27:
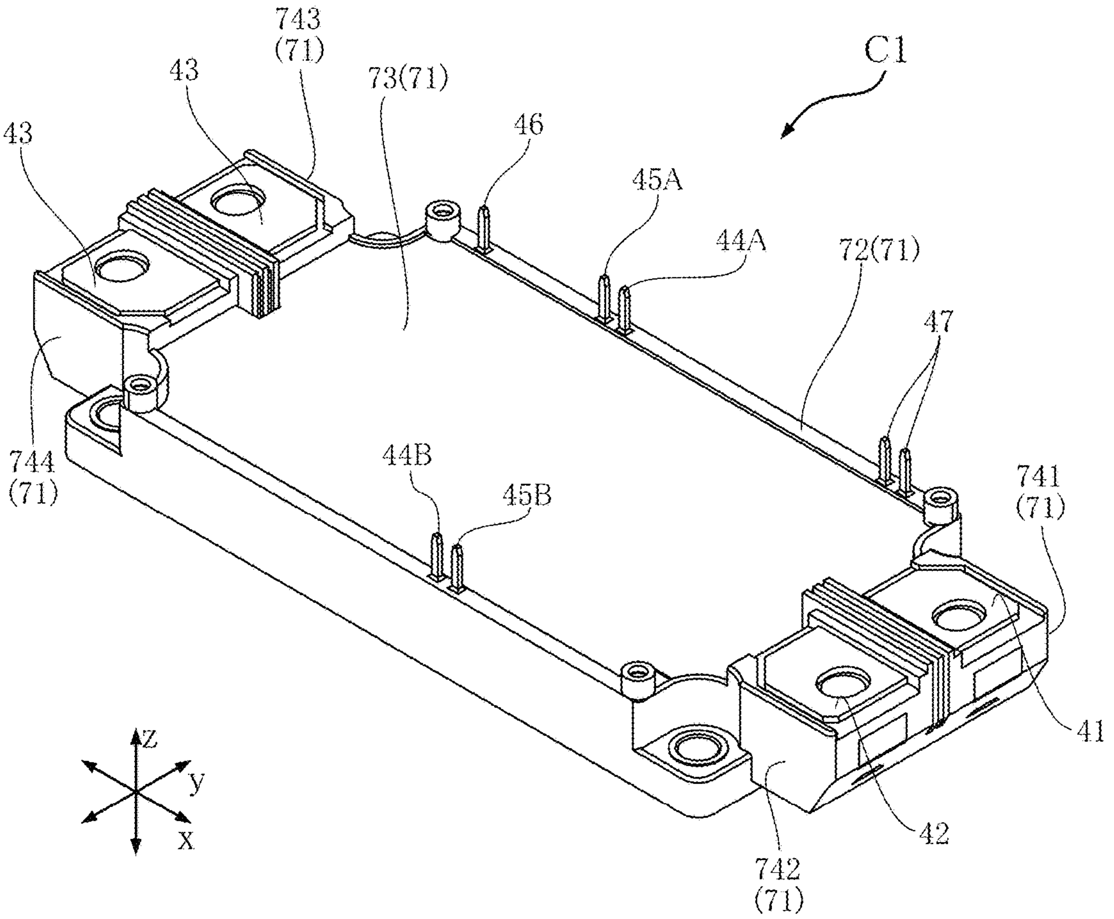
FIG. 27 is a perspective view of a semiconductor device according to a third embodiment.

Two terminal pedestals 741 and 742 are disposed on one side of the frame part 72 in the first direction x, and are formed integral with the frame part 72. Two terminal pedestals 743 and 744 are disposed on the other side of the frame part 72 in the first direction x, and are formed integral with the frame part 72. Two terminal pedestals 741 and 742 are disposed along the second direction y on the side face of the frame part 72 at one side of the first direction x. The terminal pedestal 741 covers a part of the power terminal 41, and, as shown in FIG. 27, a part of the power terminal 41 is disposed on the surface of terminal pedestal 741 at the upside of the thickness direction z. The terminal pedestal 742 covers a part of the power terminal 42, and, as shown in FIG. 27, a part of the power terminal 42 is disposed on the surface of terminal pedestal 742 at the upside of the thickness direction z. Two terminal pedestals 743 and 744 are disposed along the second direction y on the side face of the frame part 72 at the other side of the first direction x. The terminal pedestal 743 covers a part of one of two power terminals 43, and, as shown in FIG. 27, a part of this power terminal 43 is disposed on the surface of terminal pedestal 743 at the upside of the thickness direction z. The terminal pedestal 744 covers a part of the other power terminal 43, and, as shown in FIG. 27, a part of this power terminal 43 is disposed on the surface of terminal pedestal 744 at the upside of the thickness direction z.

As shown in FIGS. 29, 30 and 33, the resin member 75 is filled in the area surrounded by the top plate 73, the heat dissipation plate 70, and the frame part 72 (the above circuit housing space). The resin member 75 covers the first semiconductor elements 11, the second semiconductor elements 12 etc. The resin member 75 is made of black epoxy resin, for example. The constituent material of the resin member 75 is not limited to epoxy resin but may be other insulating materials such as silicone gel. The resin member 75 may not be provided for the semiconductor device C1. In the configuration with the resin member 75, the case 71 may not include the top plate 73.

The supporting substrate 2 of the semiconductor device C1 is bonded to the heat dissipation plate 70. The supporting substrate 2 of the semiconductor device C1 includes an insulative substrate 20 and an obverse metal layer 21. Unlike this configuration, the supporting substrate 2 may include a reverse metal layer 22.

The obverse metal layer 21 includes power wiring parts 31 to 33 and signal wiring parts 34A, 34B, 35A, 35B, 37, 38A, 38B. The obverse metal layer 21 of the semiconductor device C1 further includes the signal wiring parts 37, which differs from the obverse metal layer 21 of the semiconductor device A1.

Figure 28:
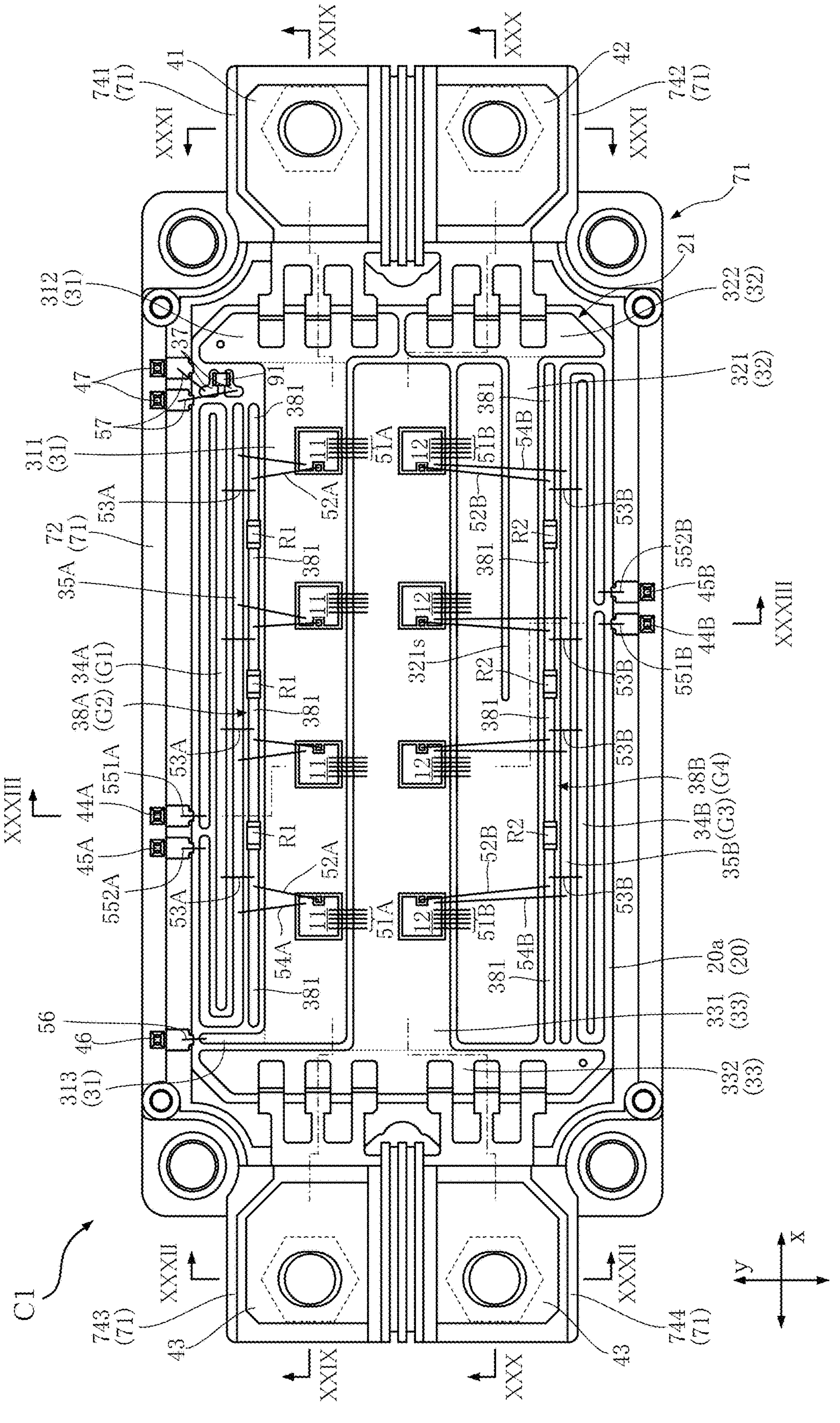
FIG. 28 is a plan view of a semiconductor device according to a third embodiment from which the resin member and a part of the case (the top plate) are omitted.

As shown in FIG. 28, the paired signal wiring parts 37 are spaced apart from each other in the second direction y. A thermistor 91 is bonded to each of the signal wiring parts 37. The thermistor 91 is disposed between the signal wiring parts 37. In an example different from the semiconductor device C1, the thermistor 91 may not be bonded to the signal wiring parts 37. As shown in FIG. 28, the signal wiring parts 37 are located near a corner of the insulative substrate 20. The paired signal wiring parts 37 are disposed between the pad part 311 and the two signal wiring parts 34A, 35A in the first direction x.

The power wiring part 31 of the semiconductor device C1 includes two pad parts 311, 312, as with the semiconductor device A1, and includes an extending part 313, which differs from the power wiring part 31 of the semiconductor device A1. As shown in FIG. 28, the extending part 313 extends in the second direction y from the end of the pad part 311 at the other side of the first direction x (the side opposite to the power terminal 41). In the example shown in FIG. 28, the extending part 313 is located between the pad part 332 (the power wiring part 33) and each signal wiring part 34A, 35A, 38A.

As shown in FIG. 28, the pad part 321 of the power wiring part 32 is formed with a slit 321*s*. In plan view, the slit 321*s* extends along the first direction, having a base end adjacent to the relevant end of the pad part 321 in the first direction x (where the pad part 322 is disposed). The slit 321*s* has a front end that is located at the center of the pad part 321 in the first direction x.

As shown in FIG. 28, the signal terminal 46 is bonded to the connection member 56. The signal terminal 47 is electrically connected to the power wiring part 31 via the connection member 56. Thus, the signal terminal 46 is electrically connected to the first electrode 111 (the drain electrode) of each first semiconductor element 11. The signal terminal 46 is an output terminal for a third detecting signal. The third detecting signal is a voltage signal depending on the current flowing through the power wiring part 31 (i.e., current (drain current) flowing through the first electrode 111 (the drain electrode) of each first semiconductor element 11). While the signal terminal 46 of the semiconductor device B1 is a press-fit terminal, the signal terminal 46 of the semiconductor device C1 is a pin-like metal terminal as with the other signal terminals 44A, 44B, 45A, 45B.

As shown in FIG. 28, the paired signal terminals 47 are bonded to the paired connection members 57, respectively.

The paired signal terminals 47 are electrically connected to the paired signal wiring parts 37 via the paired connection members 57, respectively. Hence, the paired signal terminals 47 are electrically connected to the thermistor 91. The paired signal terminals 47 are terminals to detect the temperature inside the case 71. When the thermistor 91 is not bonded to the paired signal wiring parts 37, the paired signal terminals 47 are non-connect terminals.

As shown in FIGS. 28 and 33, the connection member 551A is bonded to the signal wiring part 34A and the signal terminal 44A, thereby electrically connecting them. That is, in the semiconductor device C1, the signal wiring part 34A and the signal terminal 44A are not directly connected to each other like the semiconductor device A1 but connected via the connection member 551A.

As shown in FIGS. 28 and 33, the connection member 551B is bonded to the signal wiring part 34B and the signal terminal 44B, thereby electrically connecting them. That is, in the semiconductor device C1, the signal wiring part 34B and the signal terminal 44B are not directly connected to each other like the semiconductor device A1 but connected via the connection member 551B.

As shown in FIG. 28, the connection member 552A is bonded to the signal wiring part 35A and the signal terminal 45A, thereby electrically connecting them. That is, in the semiconductor device C1, the signal wiring part 35A and the signal terminal 45A are not directly connected to each other like the semiconductor device A1 but connected via the connection member 552A.

As shown in FIG. 28, the connection member 552B is bonded to the signal wiring part 35B and the signal terminal 45B, thereby electrically connecting them. That is, in the semiconductor device C1, the signal wiring part 35B and the signal terminal 45B are not directly connected to each other like the semiconductor device A1 but connected via the connection member 552B.

As shown in FIG. 28, the connection member 56 is bonded to the extending part 313 and the signal terminal 47, thereby electrically connecting the power wiring part 31 and the signal terminal 47. Hence, the signal terminal 47 is electrically connected to the first electrode 111 (the drain electrode) of each first semiconductor element 11 via the connection member 56 and the power wiring part 31.

As shown in FIG. 28, the paired connection members 57 are bonded to the paired signal wiring parts 37 and the paired signal terminals 47, respectively. Thus, the paired signal terminals 47 are electrically connected to the thermistor 91 via the paired connection members 57 and the paired signal wiring parts 37, respectively. When the thermistor 91 are not bonded to the paired signal wiring parts 37, the paired connection members 57 are not needed.

As shown in FIG. 28, the semiconductor device C1 includes the first conduction path J11 and the second conduction path J12, as with the semiconductor devices A1, B1. Therefore, the semiconductor device C1 is advantageous in suppressing the first oscillation phenomenon, as with the semiconductor devices A1, B1. Further, as shown in FIG. 28, the semiconductor device C1 includes the third conduction path J21 and the fourth conduction path J22, as with the semiconductor devices A1, B1. Therefore, the semiconductor device C1 is advantageous in suppressing the second oscillation phenomenon, as with the semiconductor devices A1, B1. The semiconductor device C1 is in part similar to the semiconductor devices A1, B1 in configuration and provides the same advantages by such a part.

Figure 34:
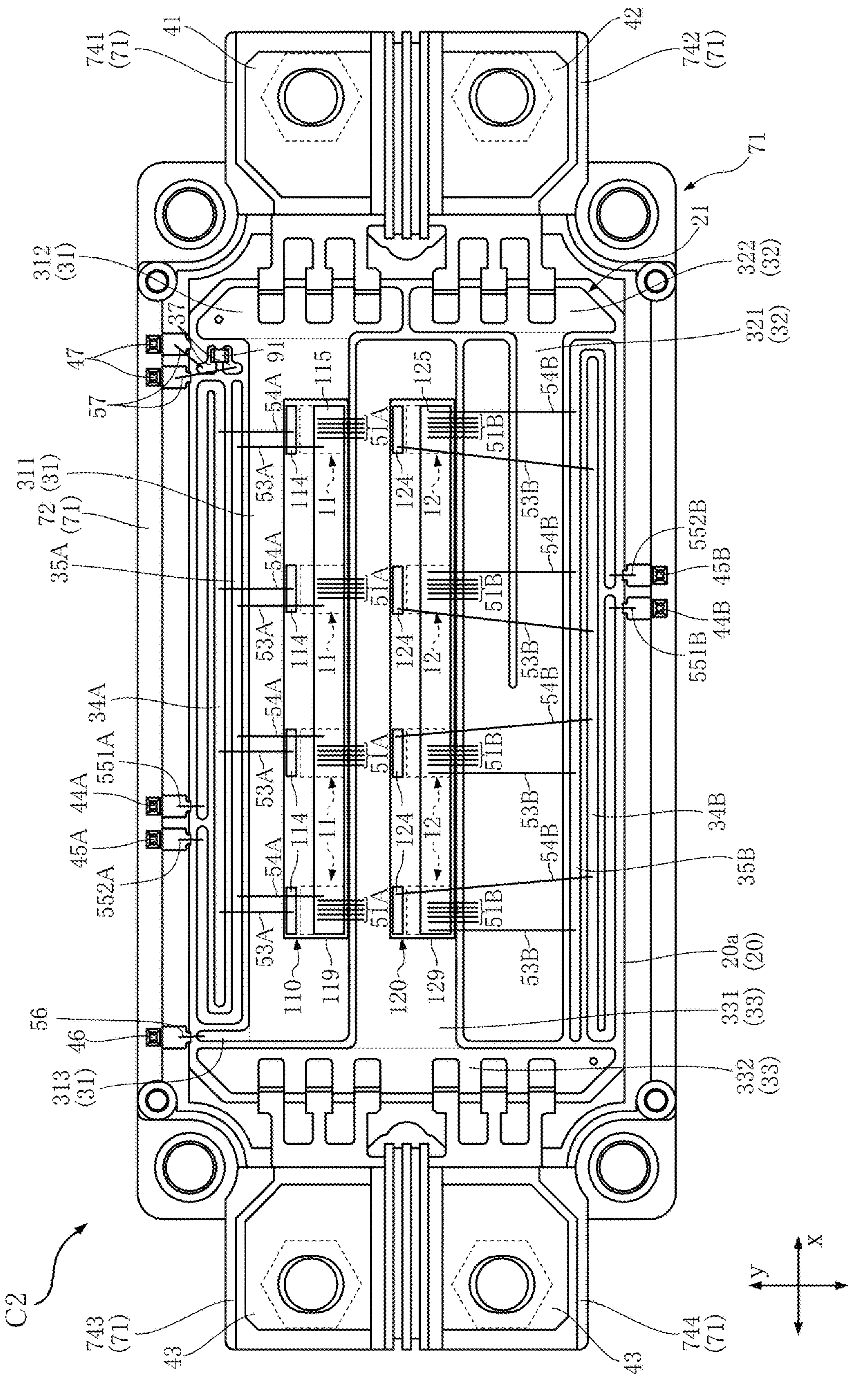
FIG. 34 is a plan view of a semiconductor device according to a variation of a third embodiment, which corresponds to the plan view of FIG. 28.

FIG. 34 shows a semiconductor device C2 according to a variation of the third embodiment. As shown in the figures, the semiconductor device C2 includes a first switching part 110 and a second switching part 120, as with the semiconductor devices A2, B2. The other configurations are same as those of the semiconductor device C1. Note that the obverse metal layer 21 does not include the signal wiring part 38A and the signal wiring part 38B.

As shown in FIG. 34, the semiconductor device C2 includes the first conduction path J11 and the second conduction path J12, as with the semiconductor devices A2, B2. Therefore, the semiconductor device C2 is advantageous in suppressing the first oscillation phenomenon, as with the semiconductor devices A2, B2. Further, as shown in FIG. 34, the semiconductor device C2 includes the third conduction path J21 and the fourth conduction path J22, as with the semiconductor devices A2, B2. Therefore, the semiconductor device C2 is advantageous in suppressing the second oscillation phenomenon, as with the semiconductor devices A2, B2. The semiconductor device C2 is in part similar to the semiconductor devices A2, B2, C1 in configuration and provides the same advantages by such a part.

FIGS. 35 to 38 show a semiconductor device D1 according to a fourth embodiment. The semiconductor device D1 differs from the semiconductor device C1 in the following points. In the semiconductor device D1, the third electrodes 113 of any two first semiconductor elements 11 adjacent in the first direction x are electrically connected to each other via a bonding wire 59A, and the sixth electrodes 123 of any two second semiconductor elements 12 adjacent in the first direction x are electrically connected to each other via a bonding wire 59B.

Figure 35:
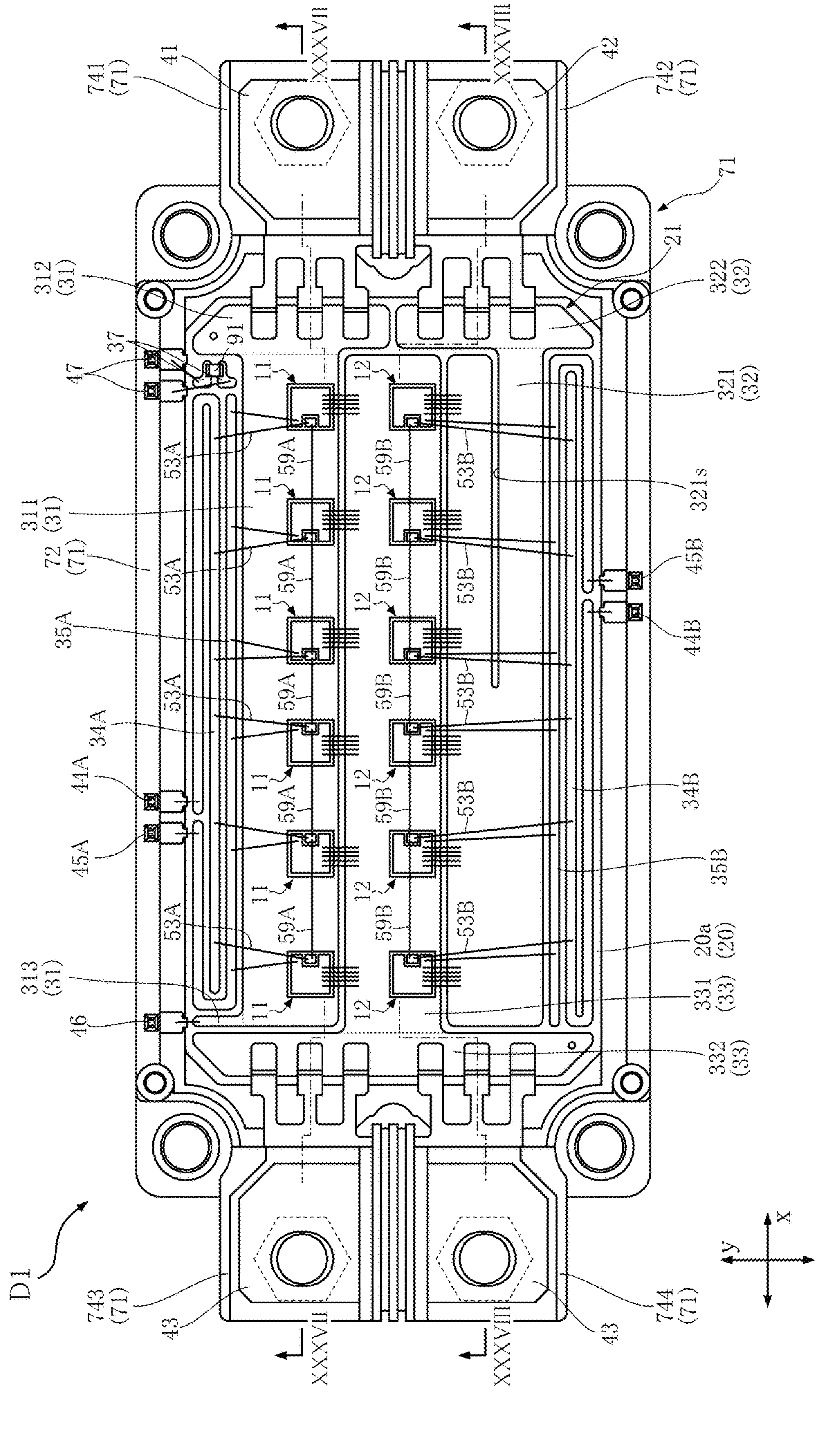
FIG. 35 is a view of a semiconductor device according to a fourth embodiment from which the resin member and a part of the case (the top plate) are omitted.
Figure 36:
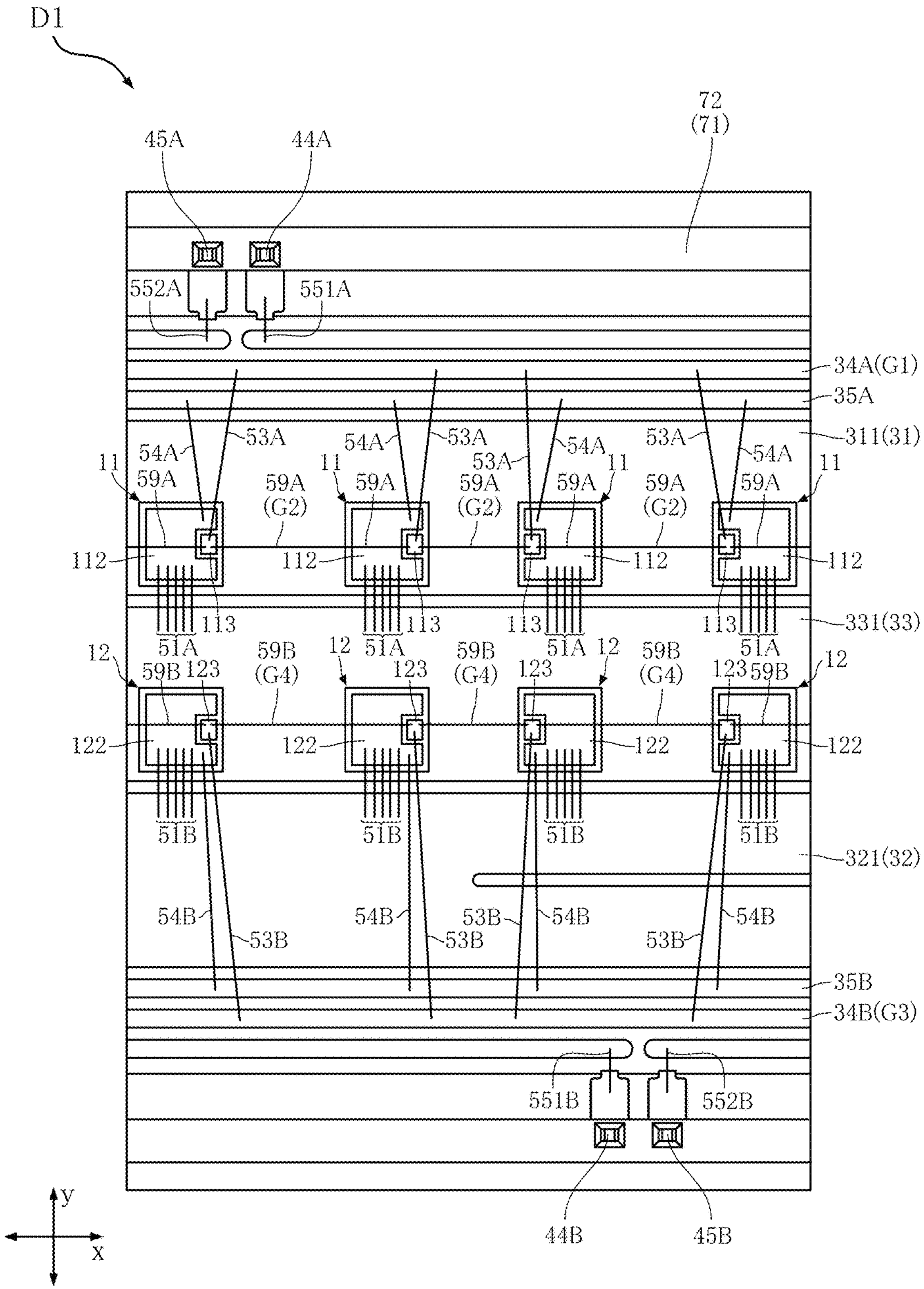
FIG. 36 is a plan view in which a part of FIG. 35 is enlarged.
Figure 37:
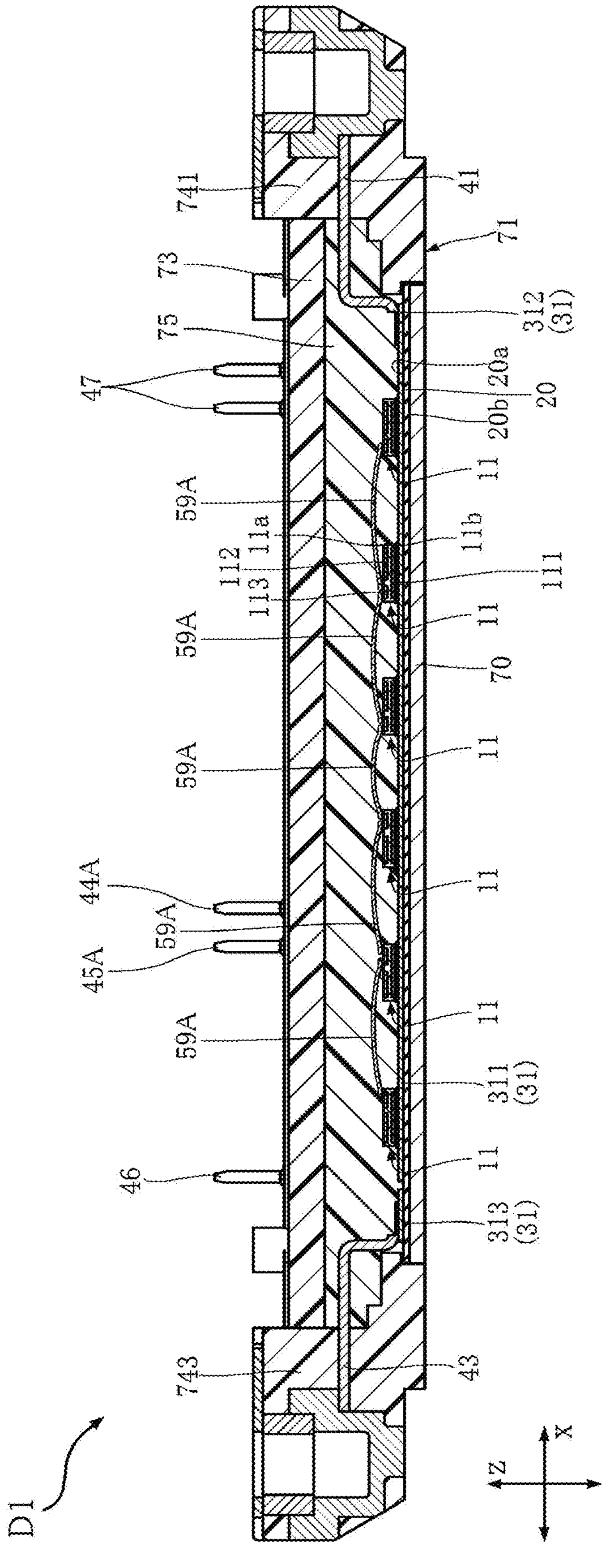
FIG. 37 is a cross-sectional view of FIG. 35 taken along a line XXXVII-XXXVII.

As shown in FIGS. 35 to 37, the bonding wires 59A are bonded to the third electrodes 113 of any two first semiconductor elements 11 adjacent in the first direction x, respectively. In the present embodiment, two bonding wires 59A and the connection member 53A are bonded to the third electrode 113 of each first semiconductor element 11 (except for the first semiconductor elements 11 disposed at both ends in the first direction x). One bonding wire 59A and the connection member 53A are bonded to the third electrode 113 of each of the first semiconductor elements 11 disposed at both ends in the first direction x.

Figure 38:
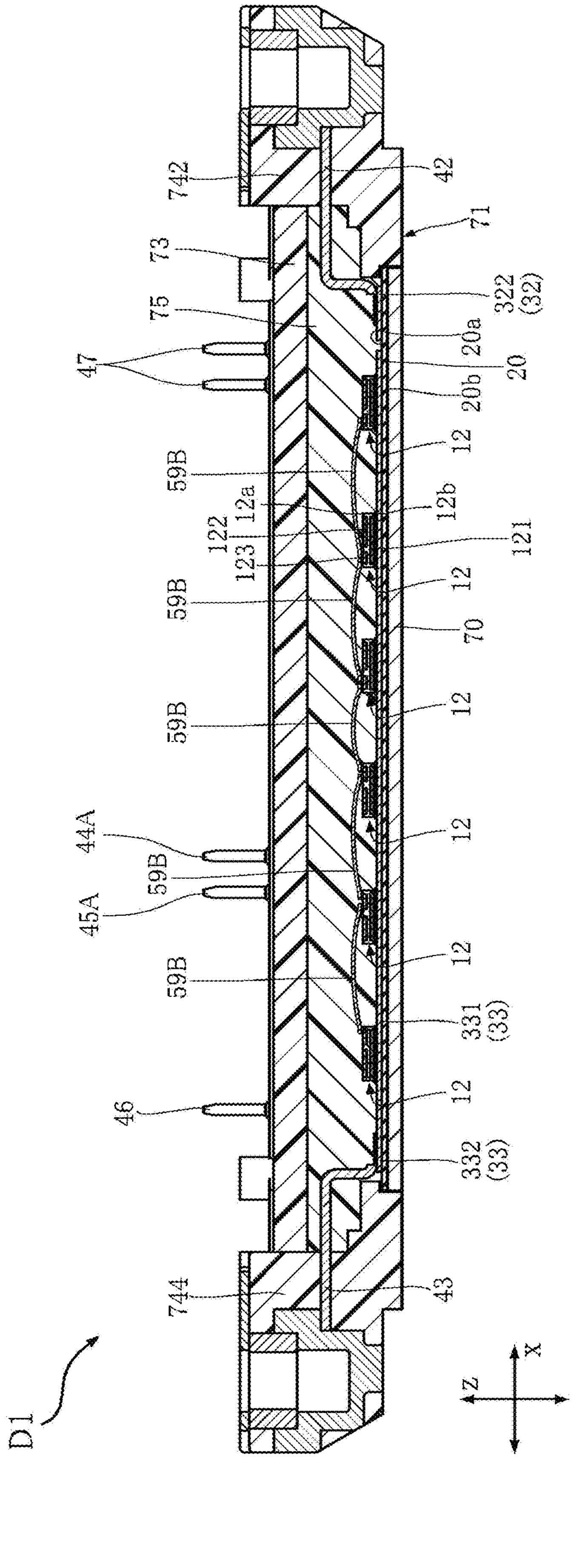
FIG. 38 is a cross-sectional view of FIG. 35 taken along a line XXXVIII-XXXVIII.

As shown in FIGS. 35, 36 and 38, the bonding wires 59B are bonded to the sixth electrodes 123 of any two second semiconductor elements 12 adjacent in the first direction x, respectively. In the present embodiment, two bonding wires 59B and the connection member 53B are bonded to the sixth electrode 123 of each second semiconductor element 12 (except for the second semiconductor elements 12 disposed at both ends in the first direction x). One bonding wire 59B and the connection member 53B are bonded to the sixth electrode 123 of each of the second semiconductor elements 12 disposed at both ends in the first direction x.

The constituent materials of each of the bonding wires 59A, 59B may be selected as follows. They are selected such that the resistance value per length of each of the bonding wires 59A, 59B is larger than the resistance value per length of each of the connecting members 53A, 53B. In the example where the constituent material of each connecting member 53A, 53B includes either gold, copper or aluminum, each constituent material of each bonding wire 59A, 59B includes, for example, Pt (platinum), Alumel, Chromel, pure iron, Ni—Cr (nickel chromium alloy) or constantan. Among these materials, since constantan has the lowest temperature coefficient and the resistance value stable with temperature change, it is preferable that each bonding wire 59A, 59B be made of constantan.

In the semiconductor device D1, the third electrodes 113 of any two first semiconductor elements 11 are electrically connected via the bonding wire 59A. Thus, as shown in FIG. 35, the obverse metal layer 21 does not include the signal wiring part 38A, and the semiconductor device D1 does not include the connection members 52A. In the semiconductor device D1, as shown in FIGS. 35 and 36, each connection member 53A is bonded to the third electrode 113 of the one of the first semiconductor elements 11 and the signal wiring part 34A. Similarly, in the semiconductor device D1, the sixth electrodes 123 of any two second semiconductor elements 12 are electrically connected via the bonding wire 59B. Thus, as shown in FIG. 35, the obverse metal layer 21 does not include the signal wiring part 38B and the semiconductor device D1 does not include the connection members 52B. In the semiconductor device D1, as shown in FIGS. 35 and 36, each connection member 53B is bonded to the sixth electrode 123 of the one of the second semiconductor elements 12 and the signal wiring part 34B.

The first conductor G1 of the semiconductor device D1 includes the signal wiring part 34A. That is, the first conduction path J11 of the semiconductor device D1 extends through the signal wiring part 34A in the electrical connection of the third electrodes 113. In the illustrated example, the first conduction path J11 extends from the third electrode 113 of one of the first semiconductor elements 11, through the connection member 53A bonded to the third electrode 113, the signal wiring part 34A bonded to the connection member 53A, the other connection member 53A bonded to the signal wiring part 34A, and finally to the third electrode 113 of another of the first semiconductor elements 11 bonded to the relevant connection member 53A.

The second conductor G2 of the semiconductor device D1 includes the bonding wire 59A. That is, the second conduction path J12 of the semiconductor device D1 extends through the bonding wire 59A in the electrical connection of the third electrodes 113. In the illustrated example, the second conduction path J12 extends from the third electrode 113 of one of the first semiconductor elements 11, through the bonding wire 59A bonded to the third electrode 113, and finally to the third electrode 113 of another of the first semiconductor elements 11 bonded to the bonding wire 59A.

In the semiconductor device D1, the impedance relationship between the first conduction path J11 and the second conduction path J12 at the oscillation frequency (e.g., 100 MHz or more and 400 MHz or less) caused by the parallel operation of the first semiconductor elements 11 is same as the semiconductor devices A1, B1, C1. Thus, each relationship of the inductance value and the resistance value between the first conduction path J11 and the second conduction path J12 is same as in the semiconductor devices A1, B1, C1. That is, the inductance value of the second conduction path J12 is smaller than the inductance value of the first conduction path J11, and the resistance value of the second conduction path J12 is larger than the resistance value of the first conduction path J11.

The third conductor G3 of the semiconductor device D1 includes the signal wiring part 34B. That is, the third conduction path J21 of the semiconductor device D1 extends through the signal wiring part 34B in the electrical connection of the sixth electrodes 123. In the illustrated example, the third conduction path J21 extends from the sixth electrode 123 of one of the second semiconductor elements 12, through the one of the connection members 53B bonded to the sixth electrode 123, the signal wiring part 34B bonded to the connection member 53B, another of the connection members 53B bonded to the signal wiring part 34B, and finally to the sixth electrode 123 of another of the second semiconductor elements 12 bonded to the connection member 53B.

The fourth conductor G4 of the semiconductor device D1 includes the bonding wire 59B. That is, the fourth conduction path J22 of the semiconductor device D1 extends through the bonding wire 59B in the electrical connection of the sixth electrodes 123. In the illustrated example, the fourth conduction path J22 extends from the sixth electrode 123 of one of the second semiconductor elements 12, through the bonding wire 59B bonded to the sixth electrode 123, and finally to the sixth electrode 123 of another of the second semiconductor elements 12 bonded to the bonding wire 59B.

In the semiconductor device D1, the impedance relationship between the third conduction path J21 and the fourth conduction path J22 at the oscillation frequency (e.g., 100 MHz or more and 400 MHz or less) caused by the parallel operation of the second semiconductor elements 12 is same as in the semiconductor devices A1, B1, C1. Thus, each relationship of the inductance value and the resistance value between the third conduction path J21 and the fourth conduction path J22 is same as in the semiconductor devices A1, B1, C1. That is, the inductance value of the fourth conduction path J22 is smaller than the inductance value of the third conduction path J21, and the resistance value of the fourth conduction path J22 is larger than the resistance value of the third conduction path J21.

As shown in FIGS. 35 and 36, the semiconductor device D1 includes the first conduction path J11 and the second conduction path J12, as with the semiconductor devices A1, B1, C1. The first conduction path J11 and the second conduction path J12 of the semiconductor device D1 are as described above. Therefore, the semiconductor device D1 is advantageous in suppressing the first oscillation phenomenon, as with the semiconductor devices A1, B1, C1. Further, as shown in FIGS. 35 and 36, the semiconductor device D1 includes the third conduction path J21 and the fourth conduction path J22, as with the semiconductor devices A1, B1, C1. The third conduction path J21 and the fourth conduction path J22 of the semiconductor device D1 are as described above. Therefore, the semiconductor device D1 is advantageous in suppressing the second oscillation phenomenon, as with the semiconductor devices A1, B1, C1. The semiconductor device D1 is in part similar to the semiconductor devices A1, B1, C1 in configuration and provides the same advantages by such a part.

Figure 39:
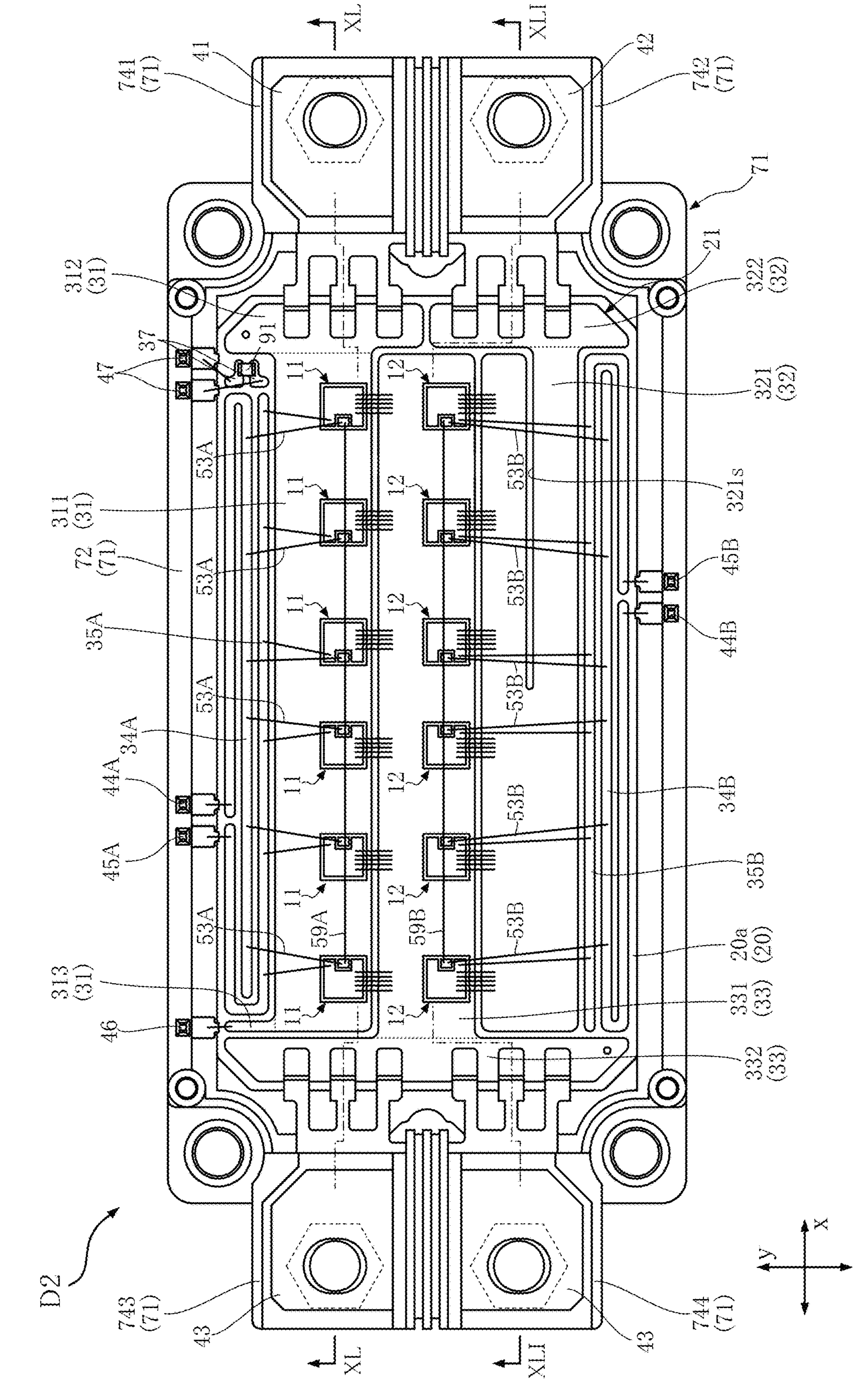
FIG. 39 is a plan view of a semiconductor device according to a first variation of a fourth embodiment from which the resin member and a part of the case (the top plate) are omitted.
Figure 40:
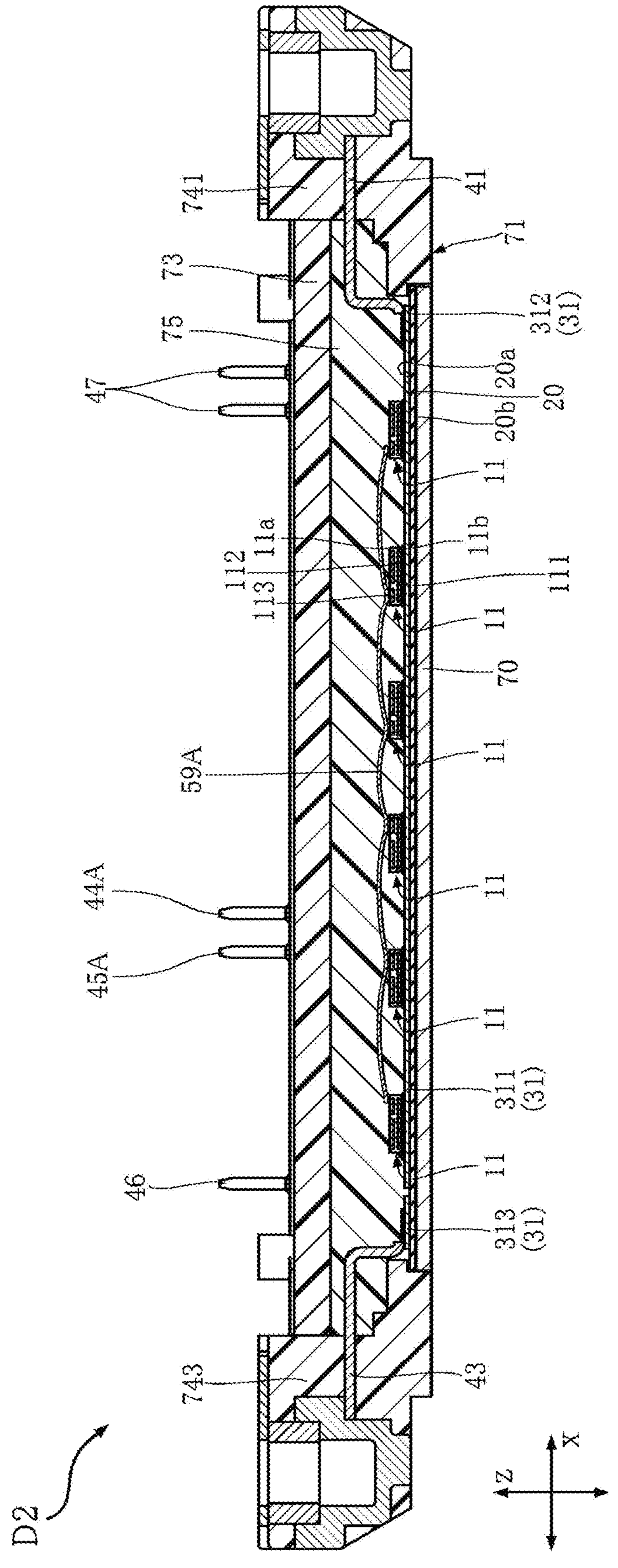
FIG. 40 is a cross-sectional view of FIG. 39 taken along a line XL-XL.
Figure 41:
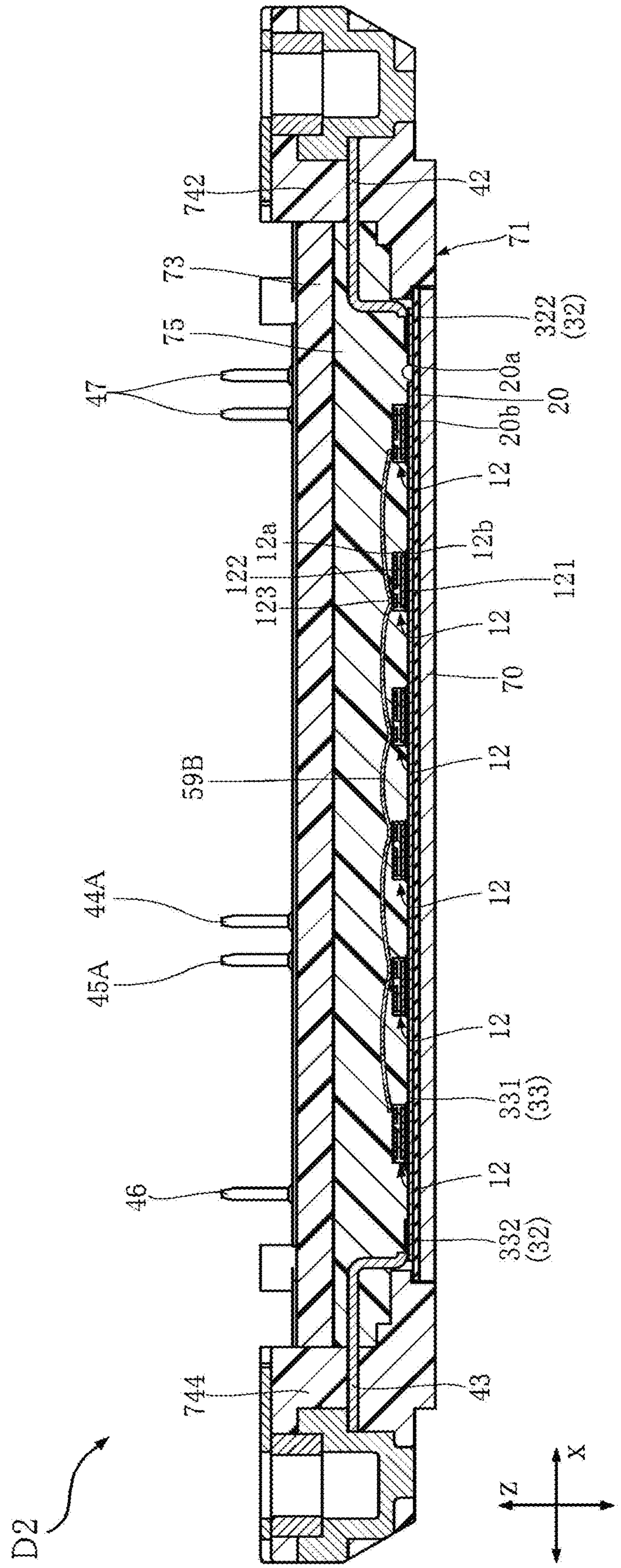
FIG. 41 is a cross-sectional view of FIG. 39 taken along a line XLI-XLI.
Figure 42:
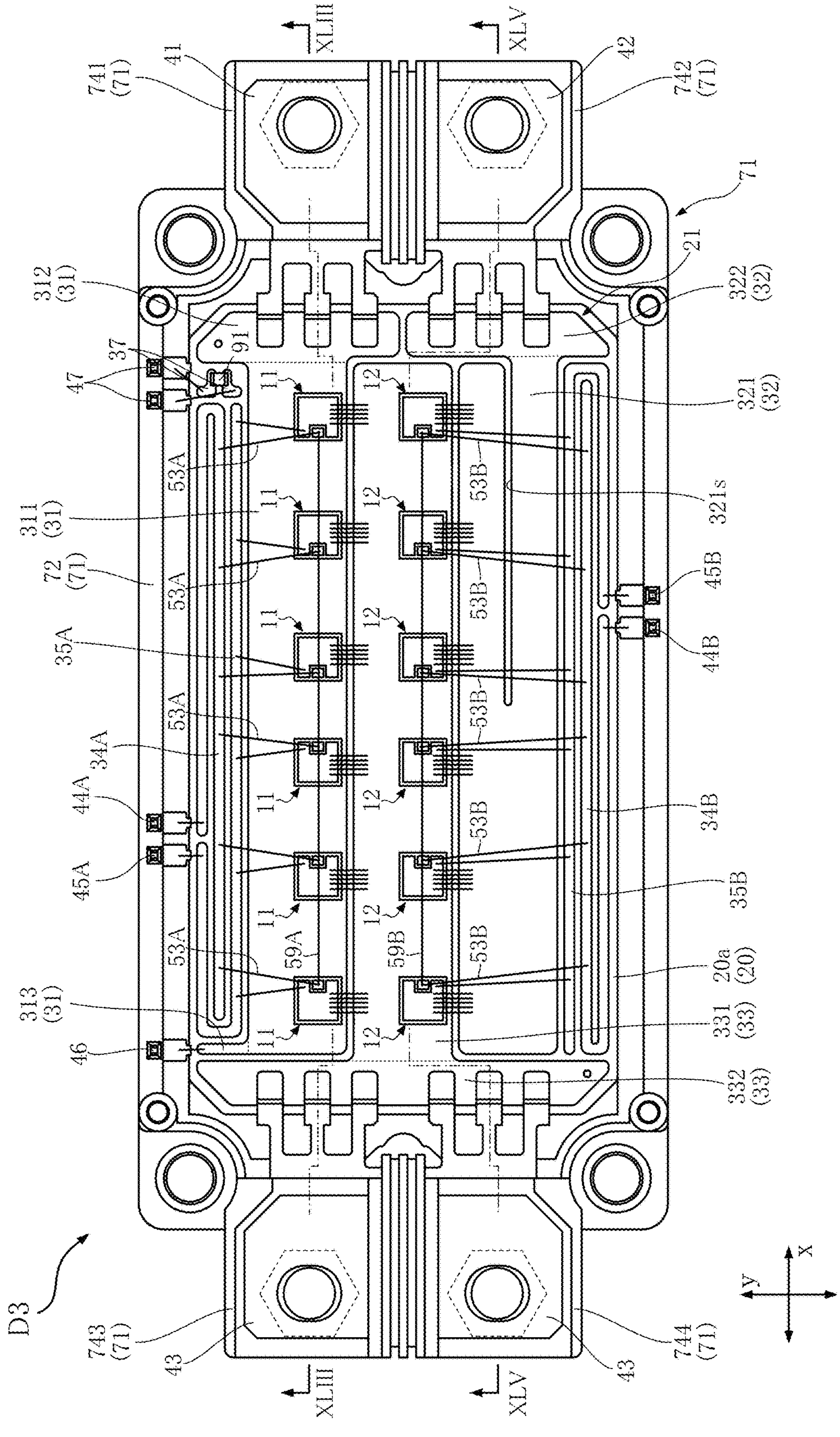
FIG. 42 is a plan view of a semiconductor device according to a second variation of a fourth embodiment from which the resin member and a part of the case (the top plate) are omitted.
Figure 43:
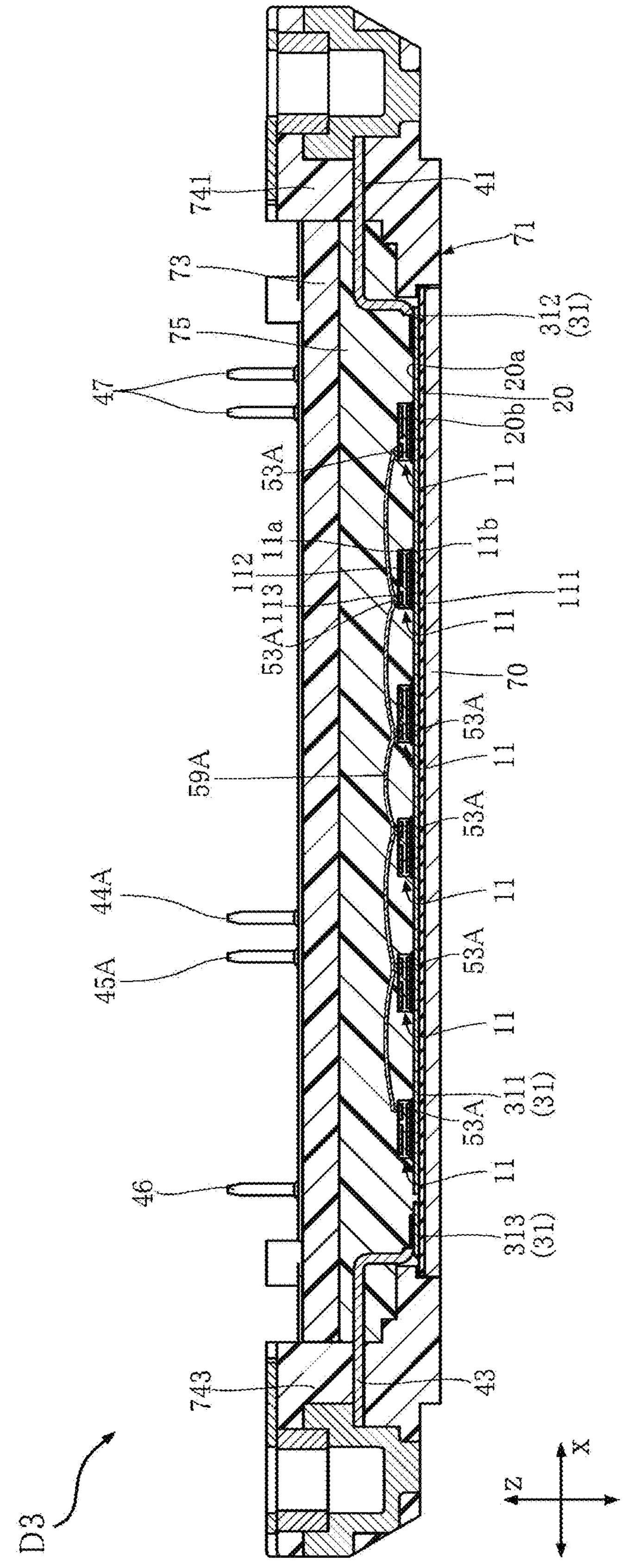
FIG. 43 is a cross-sectional view of FIG. 42 taken along a line XLIII-XLIII.
Figure 44:
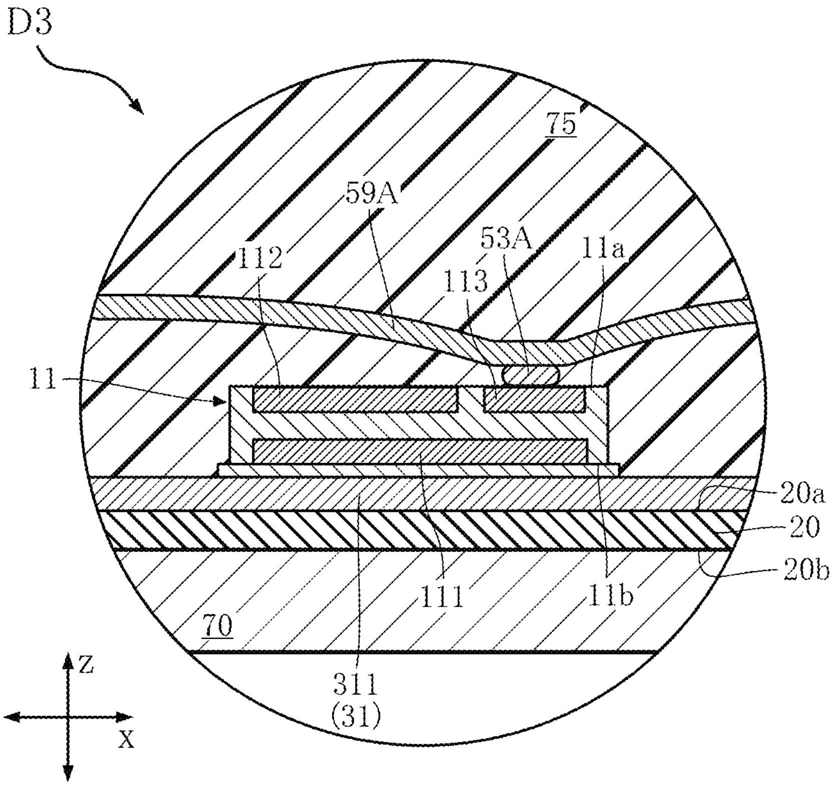
FIG. 44 is a view in which a part of FIG. 43 is enlarged.
Figure 45:
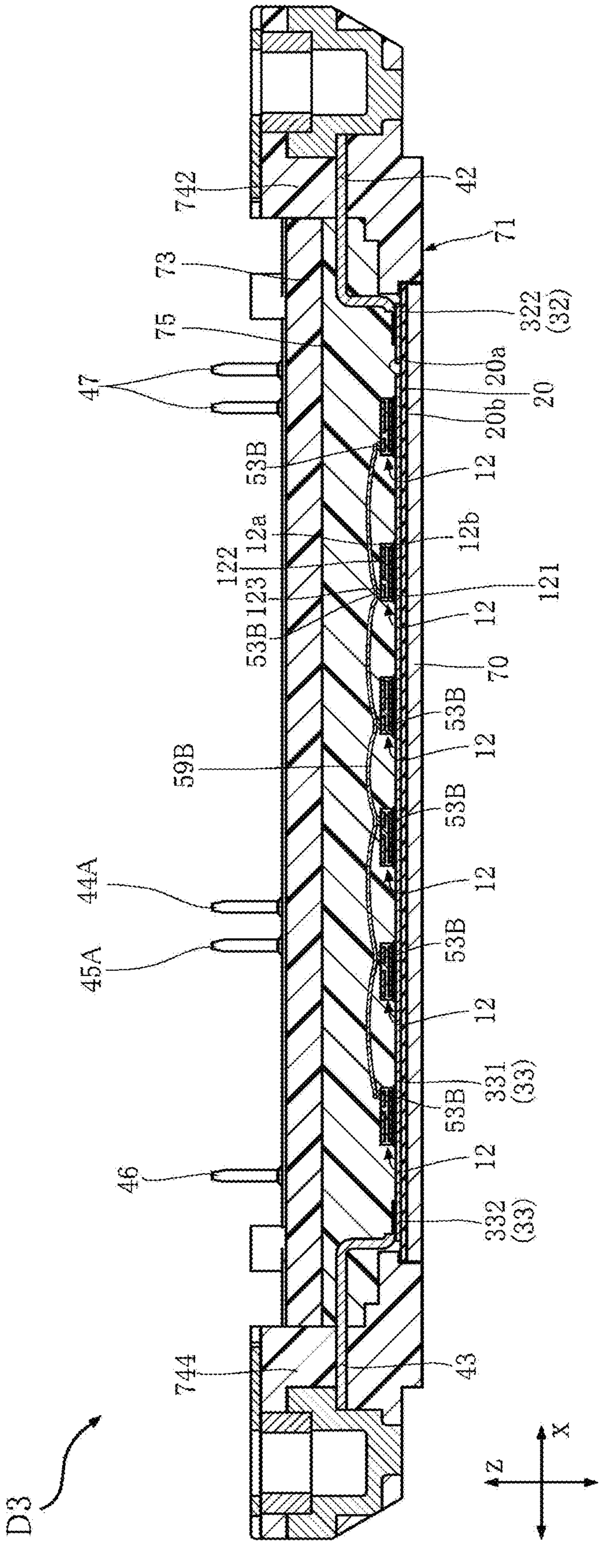
FIG. 45 is a cross-sectional view of FIG. 42 taken along a line XLV-XLV.
Figure 46:
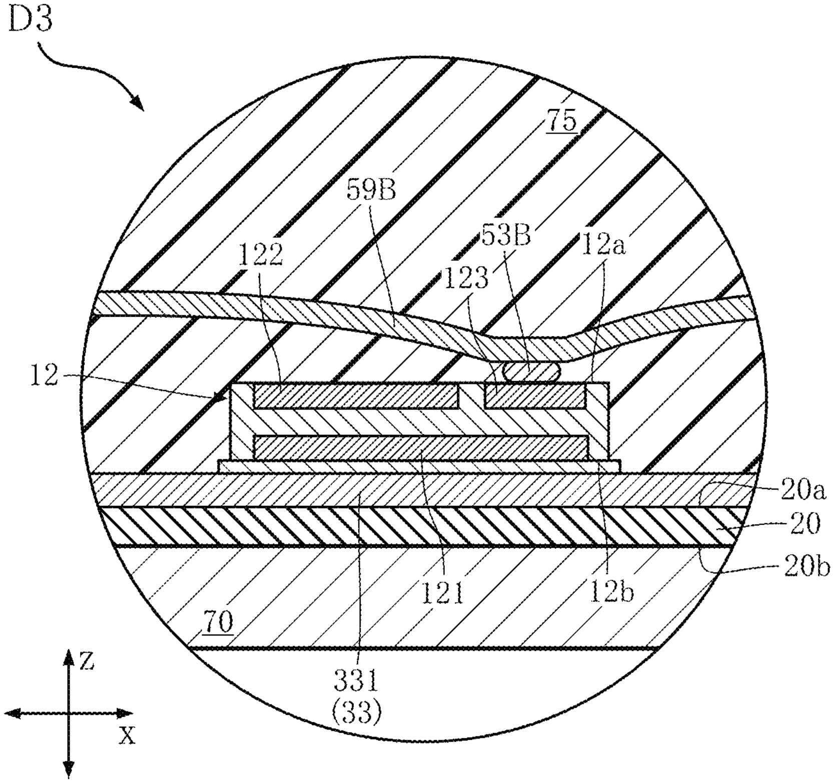
FIG. 46 is a view in which a part of FIG. 45 is enlarged.

FIGS. 39 to 41 show a semiconductor device D2 according to a variation of the fourth embodiment. The semiconductor device D2 differs from the semiconductor device D1 in the following points. In the semiconductor device D2, one bonding wire 59A is bonded to the third electrode 113 of each first semiconductor element 11. Similarly, one bonding wire 59B is bonded to the sixth electrode 123 of each second semiconductor element 12.

Each of the bonding wires 59A, 59B is bonded by a wedge bonding. In plan view, the bonding wire 59A extends along the direction of the array of the first semiconductor elements 11 (the first direction x in the illustrated example). In plan view, the bonding wire 59A crosses the first semiconductor elements 11 except for the first semiconductor elements 11 disposed at both ends in the first direction x. In plan view, the bonding wire 59B extends along the direction of the array of the second semiconductor elements 12 (the first direction x in the illustrated example). In plan view, the bonding wire 59B crosses the second semiconductor elements 12 except for the second semiconductor elements 12 disposed at both ends in the first direction x.

The semiconductor device D2 may have same advantages as the semiconductor device D1. In the semiconductor device D2, one bonding wire 59A is bonded to the first semiconductor elements 11. According to this configuration, the bonding wires 59A may not be bonded for each first semiconductor element 11, and one bonding wire 59A may sequentially be bonded to the first semiconductor elements 11. Therefore, the semiconductor device D2 allows the bonding wire 59A to be bonded more easily than the semiconductor device D1. The same may be applied to the bonding wire 59B, and the semiconductor device D2 allows the bonding wire 59B to be bonded more easily than the semiconductor device D1.

FIGS. 42 to 46 show a semiconductor device D3 according to a second variation of the fourth embodiment. The semiconductor device D3 differs from the semiconductor device D2 in the following points. That is, one bonding wire 59A is not bonded to the third electrode 113 of each first semiconductor element 11 but is bonded to the connection member 53A on each third electrode 113. Similarly, one bonding wire 59B is not bonded to the sixth electrode 123 of each second semiconductor element 12 but is bonded to the connection member 53B on each sixth electrode 123.

In the semiconductor device D3, the bonding wire 59A is bonded to the portion of each connection member 53A that is bonded to the third electrode 113. Accordingly, the bonding wire 59A is electrically connected to the third electrodes 113 of the first semiconductor elements 11 via the connection members 53A. In plan view, the bonding wire 59A overlaps with each connection member 53A. Similarly, in the semiconductor device D3, the bonding wire 59B is bonded to the portion of each connection member 53B that is bonded to the sixth electrode 123. Accordingly, the bonding wire 59B is electrically connected to the sixth electrodes 123 of the second semiconductor elements 12 via the connection members 53B. In plan view, the bonding wire 59B overlaps with each connection member 53B.

The semiconductor device D3 may have same advantages as the semiconductor devices D1, D2. The semiconductor device D3 allows the bonding wire 59A, 59B to be bonded more easily than the semiconductor device D1.

Further, in the semiconductor device D3, the bonding wire 59A is bonded to each connection member 53A. For example, in an example such that the bonding wire 59A is made of constantan, the hardness of bonding wire 59A may be higher than the hardness of each connecting member 53A. In such case where the hardness of bonding wire 59A is higher than the hardness of each connecting member 53A, when the bonding wire 59A is bonded to each connecting member 53A, each connecting member 53A functions as a buffer material. Therefore, the semiconductor device D3 may mitigate the impact applied to the third electrodes 113 when the bonding wire 59A is bonded, compared to the case where the bonding wire 59A is bonded directly to the third electrodes 113. The same is applied to the bonding wire 59B. More specifically, the semiconductor device D3 may mitigate the impact applied to the sixth electrodes 123 when the bonding wire 59B is bonded, compared to the case where the bonding wire 59B is bonded directly to the sixth electrodes 123.

Further, in the semiconductor device D3, the bonding wire 59A is bonded to each connection member 53A. The bonding strength of the bonding wire 59A to each connecting member 53A may be higher than the bonding strength of the bonding wire 59A to each third electrode 113. For example, the above relationship of bonding strength is obtained when the constituent material of the bonding wire 59A is constantan, the constituent material of each connection member 53A is copper, and the constituent material of (the surface of) each third electrode 113 is gold or aluminum. Therefore, when the bonding strength of the bonding wire 59A to each connecting member 53A is higher than the bonding strength of the bonding wire 59A to each third electrode 113, the bonding wire 59A may be securely bonded. The same is applied to the bonding wire 59B. More specifically, when the bonding strength of the bonding wire 59B to each connecting member 53B is higher than the bonding strength of the bonding wire 59B to each sixth electrode 123, the bonding wire 59B may be securely bonded.

In a configuration where the bonding wire 59A is bonded to the connecting member 53A as in the semiconductor device D3, the connection member 53A may be a clad wire instead of a bonding wire. Clad wire is a type of composite material wire that is uniformly coated with a coating material around a linear core. For example, the core of the clad wire contains copper, aluminum, iron, iron-nickel, or molybdenum, and the coating material of the clad wire contains copper, platinum, or gold. The constituent materials of the core and the coating material of the clad wire are not limited to them. In the example where the bonding wire 59A is constantan and the connecting member 53A is a clad wire, since constantan bonds well to copper, the coating material of the connecting member 53A (clad wire) is preferably copper. Similarly, in a configuration where the bonding wire 59B is bonded to the connecting member 53B like the semiconductor device D3, the connection member 53B may be a clad wire instead of a bonding wire.

In the alternative example of the semiconductor device D3, the order of bonding of the connecting member 53A and the bonding wire 59A may be opposite. In other words, the bonding wire 59A is bonded to each third electrode 113, and then the connection member 53A may be bonded to the bonding wire 59A. Similarly, in the alternative example of the semiconductor device D3, the order of bonding of the connecting member 53B and the bonding wire 59B may be opposite. In other words, the bonding wire 59B that is bonded to each sixth electrode 123, and then the connection member 53B may be bonded to the bonding wire 59B. Such configuration is preferable to mitigate the impact applied to the third electrode 113 or the sixth electrode 123 when the hardness of bonding wires 59A, 59B is smaller than the hardness of the connecting member 53A, 53B.

The semiconductor devices according to the present disclosure are not limited to the embodiments described above. The specific configuration of each part of a semiconductor device according to the present disclosure may suitably be designed and changed in various manners. The present disclosure includes the embodiments described in the following clauses.

Clause 1. A semiconductor device comprising:

two semiconductor elements each having a first electrode, a second electrode, and a third electrode, with a switching operation being controlled depending on a first driving signal input to the third electrode;

a first conductor electrically interposed between the third electrodes of the two semiconductor elements;

a second conductor electrically interposed between the third electrodes of the two semiconductor elements; and a signal terminal electrically connected to the first conductor and electrically connected to the third electrodes of the two semiconductor elements, wherein in the two semiconductor elements, the first electrodes are electrically connected to each other, and the second electrodes are electrically connected to each other, the electrical connection between the third electrodes of the two semiconductor elements includes a first conduction path through the first conductor and a second conduction path through the second conductor, an inductance value of the second conduction path is smaller than an inductance value of the first conduction path, and a resistance value of the second conduction path is larger than a resistance value of the first conduction path.

Clause 2. The semiconductor device according to clause 1, further comprising a resistor element, wherein the second conduction path extends through the resistor element.

Clause 3. The semiconductor device according to clause 2, wherein the second conductor includes two divided parts spaced apart from each other, and the resistor element is bonded to the two divided parts in a manner bridging the two divided parts.

Clause 4. The semiconductor device according to any of clauses 1 to 3, wherein a length of the second conduction path is shorter than a length of the first conduction path.

Clause 5. The semiconductor device according to any of clauses 1 to 4, wherein the resistance value of the first conduction path includes a wiring resistance of the first conduction path.

Clause 6. The semiconductor device according to any of clauses 1 to 5, further comprising an insulative substrate having a substrate obverse face, wherein the first conductor includes a first signal wiring part provided on the substrate obverse face.

Clause 7. The semiconductor device according to clause 6, further comprising two first connection members each electrically interposed between the third electrodes of the two semiconductor elements, and wherein the two first connection members are provided on the first conduction path.

Clause 8. The semiconductor device according to clause 7, wherein the second conductor includes a second signal wiring part provided on the substrate obverse face.

Clause 9. The semiconductor device according to clause 8, further comprising two second connection members each electrically interposed between the third electrodes of the two semiconductor elements, and wherein one of the two second connection members is connected to the third electrode of one of the two semiconductor elements, the other of the two second connection members is connected to the third electrode of the other of the two semiconductor elements, and the two second connection members are provided on the second conduction path.

Clause 10. The semiconductor device according to clause 9, wherein the two first connection members are connected to the first signal wiring part and the second signal wiring part, and the two second connection members are provided on the first conduction path.

Clause 11. The semiconductor device according to clause 7, wherein each of the two first connection members is connected to the relevant third electrode of one of the two semiconductor elements and the first signal wiring part, the second conductor includes a bonding wire connected to the third electrodes of the two semiconductor elements, and the bonding wire has a resistance value per length that is larger than a resistance value per length of each of the two connecting members.

Clause 12. The semiconductor device according to clause 6, further comprising:

a resin member covering the two semiconductor elements, a part of the first conductor and the second conductor; and a first rewiring electrode and a second rewiring electrode each exposed from the resin member, wherein the first conductor includes a coated wiring part covered by the resin member, the first rewiring electrode is electrically connected to the third electrode of each of the two semiconductor elements via the coated wiring part, and the second rewiring electrode is electrically connected to the second electrode of each of the two semiconductor elements.

Clause 13. The semiconductor device according to clause 12, wherein the first signal wiring part includes a signal wiring part that is exposed from the resin member and is spaced apart from the resin member.

Clause 14. The semiconductor device according to clause 13, wherein the first rewiring electrode includes two electrode parts, one of the two electrode parts is electrically connected to the third electrode of one of the two semiconductor elements, and the other of the two electrode parts is electrically connected to the third electrode of the other of the two semiconductor elements.

Clause 15. The semiconductor device according to clause 14, further comprising two third connection members, wherein one of the two electrode parts is electrically connected to the first signal wiring part via one of the two third connection members, and the other of the two electrode parts is electrically connected to the first signal wiring part via the other of the two third connection members.

Clause 16. The semiconductor device according to any of clauses 6 to 15, further comprising:

a first power wiring part and a second power wiring part spaced apart from each other;

a first power terminal electrically connected to the first power wiring part; and a second power terminal electrically connected to the second power wiring part, wherein the first power wiring part is electrically connected to the first electrode of each of the two semiconductor elements, and the second power wiring part is electrically connected to the second electrode of each of the two semiconductor elements.

Clause 17. The semiconductor device according to clause 16, wherein the two semiconductor elements are supported by the insulative substrate, and the first power wiring part and the second power wiring part are provided on the substrate obverse face.

Clause 18. The semiconductor device according to clause 16 or 17, wherein each of the two semiconductor elements includes an element obverse face facing the same side of the substrate obverse face, and an element reverse face facing the opposite side of the element obverse face, and in each of the two semiconductor elements, the first electrode is disposed on the first element reverse face, and the second electrode and the third electrode are disposed on the first element obverse face.

Clause 19. The semiconductor device according to clause 18, wherein the first power wiring part faces the first electrode of each of the two second semiconductor elements.

Clause 20. The semiconductor device according to any of clauses 1 to 19, wherein an impedance of the second conduction path is smaller than an impedance of the first conduction path at an oscillation frequency without the second conduction path.

REFERENCE NUMERALS

A1, A2, B1, B2, C1, C2, D1, D2, D3: Semiconductor device
11: First semiconductor element
11a: First element obverse face
11b: First element reverse face
110: First switching part
111: First electrode
112: Second electrode
113: Third electrode
114: First rewiring electrode
115: Second rewiring electrode
116: Third rewiring electrode
117: Inner wiring
117a: First wiring part
117b: Second wiring part
117c: Third wiring part
117d: Fourth wiring part
118: Rewiring electrode
119: Resin member
119a: Obverse face
119b: Reverse face
12: Second semiconductor element
12a: Second element obverse face
12b: Second element reverse face
120: Second switching part
121: Fourth electrode
122: Fifth electrode
123: Sixth electrode
124: Fourth rewiring electrode
125: Fifth rewiring electrode
126: Sixth rewiring electrode
127: Inner wiring
127a: Fifth wiring part
127b: Sixth wiring part
127c: Seventh wiring part
127d: Eighth wiring part
129: Resin member
129a: Obverse face
129b: Reverse face
2: Supporting substrate
20: Insulative substrate
20a: Substrate obverse face
20b: Substrate reverse face
21, 21A, 21B: Obverse metal layer
22: Reverse metal layer
23A, 23B: Conductive substrate
24A, 24B: Signal substrate
241: Insulative substrate
241a: Obverse face
241b: Reverse face
242: Obverse metal layer
243: Reverse metal layer
31, 32, 33: Power wiring part
311, 312: Pad part
313: Extending part
321, 322: Pad part
321s: Slit
331, 332: Pad part
34A, 34B: Signal wiring part
35A, 35B: Signal wiring part
36, 37, 39: Signal wiring part
38A, 38B: Signal wiring part -continued 381: Divided part
411, 421, 431: Bonded part
41, 42, 43: Power terminal
412, 422, 432: Terminal part
44A, 44B: Signal terminal
45A, 45B: Signal terminal
46, 47, 49: Signal terminal
51A, 51B: Connection member
52A, 52B: Connection member
53A, 53B: Connection member
54A, 54B: Connection member
551A, 551B: Connection member
552A, 552B: Connection member
56, 57: Connection member
58A, 58B: Connection member
581B: First wiring part
582B: Second wiring part
583B: Third wiring part
584B: Fourth wiring part
59A, 59B: Bonding wire
6: Sealing member
61: Resin obverse face
62: Resin reverse face
631-634: Resin side face
70: Heat dissipation plate
71: Case
72: Frame part
73: Top plate
741-744: Terminal pedestal
75: Sealing member
91: Thermistor
G1: First conductor
G2: Second conductor
G3: Third conductor
G4: Fourth conductor
J11: First conduction path
J12: Second conduction path
J21: Third conduction path
J22: Fourth conduction path
R1, R2: Resistor element

The invention claimed is:

1. A semiconductor device comprising:

two semiconductor elements each having a first electrode, a second electrode, and a third electrode, with a switching operation being controlled depending on a first driving signal input to the third electrode;

a first conductor electrically interposed between the third electrodes of the two semiconductor elements;

a second conductor electrically interposed between the third electrodes of the two semiconductor elements; and a signal terminal electrically connected to the first conductor and electrically connected to the third electrodes of the two semiconductor elements, wherein in the two semiconductor elements, the first electrodes are electrically connected to each other, and the second electrodes are electrically connected to each other, the electrical connection between the third electrodes of the two semiconductor elements includes a first conduction path through the first conductor and a second conduction path through the second conductor, an inductance value of the second conduction path is smaller than an inductance value of the first conduction path, and a resistance value of the second conduction path is larger than a resistance value of the first conduction path.

2. The semiconductor device according to claim 1, further comprising a resistor element, wherein the second conduction path extends through the resistor element.

3. The semiconductor device according to claim 2, wherein the second conductor includes two divided parts that is spaced apart from each other, and the resistor element is bonded to the two divided parts in a manner bridging the two divided parts.

4. The semiconductor device according to claim 1, wherein a length of the second conduction path is shorter than a length of the first conduction path.

5. The semiconductor device according to claim 1, wherein the resistance value of the first conduction path includes a wiring resistance of the first conduction path.

6. The semiconductor device according to claim 1, further comprising an insulative substrate having a substrate obverse face, wherein the first conductor includes a first signal wiring part provided on the substrate obverse face.

7. The semiconductor device according to claim 6, further comprising two first connection members each electrically interposed between the third electrodes of the two semiconductor elements, and wherein the two first connection members are provided on the first conduction path.

8. The semiconductor device according to claim 7, wherein the second conductor includes a second signal wiring part provided on the substrate obverse face.

9. The semiconductor device according to claim 8, further comprising two second connection members each electrically interposed between the third electrodes of the two semiconductor elements, and wherein one of the two second connection members is connected to the third electrode of one of the two semiconductor elements, the other of the two second connection members is connected to the third electrode of the other of the two semiconductor elements, and the two second connection members are provided on the second conduction path.

10. The semiconductor device according to claim 9, wherein the two first connection members are connected to the first signal wiring part and the second signal wiring part, and the two second connection members are provided on the first conduction path.

11. The semiconductor device according to claim 7, wherein each of the two first connection members is connected to the relevant third electrode of one of the two semiconductor elements and the first signal wiring part, the second conductor includes a bonding wire connected to the third electrodes of the two semiconductor elements, and the bonding wire has a resistance value per length that is larger than a resistance value per length of each of the two connecting members.

12. The semiconductor device according to claim 6, further comprising:

a resin member covering the two semiconductor elements, a part of the first conductor and the second conductor; and a first rewiring electrode and a second rewiring electrode each exposed from the resin member, wherein the first conductor includes a coated wiring part covered by the resin member, the first rewiring electrode is electrically connected to the third electrode of each of the two semiconductor elements via the coated wiring part, and the second rewiring electrode is electrically connected to the second electrode of each of the two semiconductor elements.

13. The semiconductor device according to claim 12, wherein the first signal wiring part includes a signal wiring part that is exposed from the resin member and is spaced apart from the resin member.

14. The semiconductor device according to claim 13, wherein the first rewiring electrode includes two electrode parts, one of the two electrode parts is electrically connected to the third electrode of one of the two semiconductor elements, and the other of the two electrode parts is electrically connected to the third electrode of the other of the two semiconductor elements.

15. The semiconductor device according to claim 14, further comprising two third connection members, wherein one of the two electrode parts is electrically connected to the first signal wiring part via one of the two third connection members, and the other of the two electrode parts is electrically connected to the first signal wiring part via the other of the two third connection members.

16. The semiconductor device according to claim 6 further comprising:

a first power wiring part and a second power wiring part spaced apart from each other;

a first power terminal electrically connected to the first power wiring part; and a second power terminal electrically connected to the second power wiring part, wherein the first power wiring part is electrically connected to the first electrode of each of the two semiconductor elements, and the second power wiring part is electrically connected to the second electrode of each of the two semiconductor elements.

17. The semiconductor device according to claim 16, wherein the two semiconductor elements are supported by the insulative substrate, and the first power wiring part and the second power wiring part are provided on the substrate obverse face.

18. The semiconductor device according to claim 16, wherein each of the two semiconductor elements includes an element obverse face facing the same side of the substrate obverse face, and an element reverse face facing the opposite side of the element obverse face, and in each of the two semiconductor elements, the first electrode is disposed on the first element reverse face, and the second electrode and the third electrode are disposed on the first element obverse face.

19. The semiconductor device according to claim 18, wherein the first power wiring part faces the first electrode of each of the two second semiconductor elements.

20. The semiconductor device according to claim 1, wherein an impedance of the second conduction path is smaller than an impedance of the first conduction path at an oscillation frequency without the second conduction path.

* * * * *